United States Patent
Tamura

(10) Patent No.: US 9,935,633 B2
(45) Date of Patent: Apr. 3, 2018

(54) LOGIC CIRCUIT, SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventor: Hikaru Tamura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/189,034

(22) Filed: Jun. 22, 2016

(65) Prior Publication Data
US 2017/0005659 A1 Jan. 5, 2017

(30) Foreign Application Priority Data
Jun. 30, 2015 (JP) ................................ 2015-131810

(51) Int. Cl.
*H03K 19/00* (2006.01)
*H03K 19/017* (2006.01)
*H01L 29/786* (2006.01)

(52) U.S. Cl.
CPC ..... *H03K 19/0013* (2013.01); *H01L 29/7869* (2013.01); *H03K 19/017* (2013.01)

(58) Field of Classification Search
CPC ............ H01L 29/7869; H03K 19/0013; H03K 19/017
See application file for complete search history.

(56) References Cited

U.S. PATENT DOCUMENTS 4,381,460 A * 4/1983 Menachem ............ H03K 5/023
326/106
4,473,760 A * 9/1984 Ambrosius, III ...... H03K 5/249
326/95
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
(Continued)

*Primary Examiner* — Alexander H Taningco
*Assistant Examiner* — Kurtis R Bahr
(74) *Attorney, Agent, or Firm* — Fish & Richardson P.C.

(57) ABSTRACT

The drive capability of a logic circuit is improved. The logic circuit includes a first output node, a dynamic logic circuit, a diode-connected first transistor, and a capacitor. The dynamic logic circuit includes a second output node and a plurality of second transistors forming and evaluation circuit. The first transistor and the plurality of second transistors all have one of an n-type conductivity and a p-type conductivity. One terminal of the capacitor is electrically connected to the first output node. The other terminal of the capacitor is electrically connected to the second output node. A first terminal of the first transistor is electrically connected to the first output node. A first voltage is input to a second terminal of the first transistor. The voltage of the first output node is changed by a voltage applied to a back gate of the first transistor.

22 Claims, 32 Drawing Sheets

(56) References Cited

U.S. PATENT DOCUMENTS

| | | | |
|---|---|---|---|
| 4,514,649 A * | 4/1985 | Nuzillat | H03K 19/0952 326/114 |
| 4,639,622 A | 1/1987 | Goodwin et al. | |
| 4,896,057 A * | 1/1990 | Yang | H03K 19/0952 326/116 |
| 5,473,277 A * | 12/1995 | Furumochi | G05F 3/242 327/537 |
| 5,731,856 A | 3/1998 | Kim et al. | |
| 5,744,864 A | 4/1998 | Cillessen et al. | |
| 5,910,735 A * | 6/1999 | Allen | H03K 19/0963 326/93 |
| 5,917,365 A * | 6/1999 | Houston | H03K 3/012 327/534 |
| 6,294,274 B1 | 9/2001 | Kawazoe et al. | |
| 6,563,174 B2 | 5/2003 | Kawasaki et al. | |
| 6,570,408 B2 * | 5/2003 | Nowka | H03K 19/0019 326/88 |
| 6,600,340 B2 * | 7/2003 | Krishnamurthy | H03K 19/0963 326/112 |
| 6,727,522 B1 | 4/2004 | Kawasaki et al. | |
| 6,933,744 B2 * | 8/2005 | Das | H03K 19/0016 326/17 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,095,252 B2 * | 8/2006 | Haase | H03K 19/0963 326/112 |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,382,162 B2 * | 6/2008 | Chiang | H03K 19/0948 326/112 |
| 7,385,224 B2 | 6/2008 | Ishii et al. | |
| 7,402,506 B2 | 7/2008 | Levy et al. | |
| 7,408,218 B2 * | 8/2008 | Akiyama | H01L 23/5223 257/296 |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,592,841 B2 * | 9/2009 | Kapoor | H01L 29/8086 326/121 |
| 7,674,650 B2 | 3/2010 | Akimoto et al. | |
| 7,732,819 B2 | 6/2010 | Akimoto et al. | |
| 8,237,418 B1 * | 8/2012 | Krishna | G05F 1/575 323/273 |
| 8,525,551 B2 | 9/2013 | Kato | |
| 8,542,034 B2 | 9/2013 | Kato | |
| 8,907,701 B2 | 12/2014 | Kong et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0016951 A1 * | 1/2004 | Mizushima | H01L 27/10829 257/304 |
| 2004/0038446 A1 | 2/2004 | Takeda et al. | |
| 2004/0127038 A1 | 7/2004 | Carcia et al. | |
| 2004/0216015 A1 | 10/2004 | Bernstein et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0040584 A1 * | 2/2007 | Ngo | H03K 19/0963 326/98 |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0264956 A1 | 10/2010 | Yin et al. | |
| 2011/0057705 A1 * | 3/2011 | Tahata | H01L 27/0928 327/328 |
| 2015/0091629 A1 * | 4/2015 | Ishizu | G11C 5/145 327/306 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |

(56) References Cited

FOREIGN PATENT DOCUMENTS

| | | |
|---|---|---|
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-009311 A | 1/2013 |
| JP | 2013-009313 A | 1/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid—Cholesteric Liquid Crystal Transition: The "Blue Phase"", Physical Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technicals Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastice Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid Sate Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector with Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs with a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display with Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW'02 : Proceedings of the 9th International Display Workshops, Dec. 4, 2002, pp. 295-298.

Ueno.K et al., "Field-Effect Transistor on $SrTiO_3$ with Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

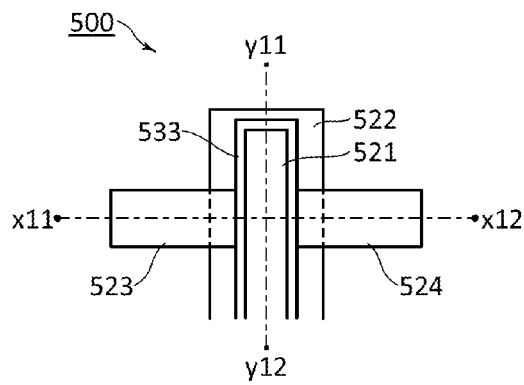
FIG. 29A
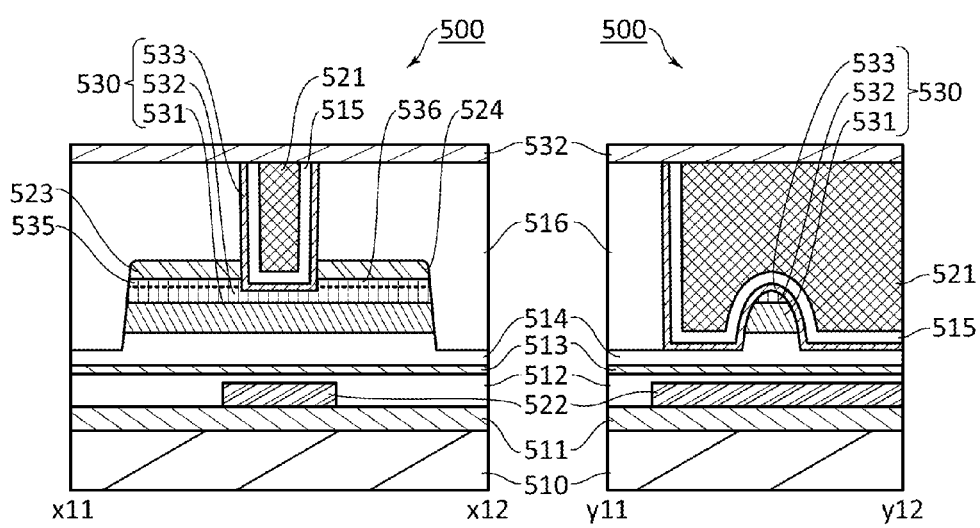
FIG. 29B
FIG. 29C

FIG. 32A
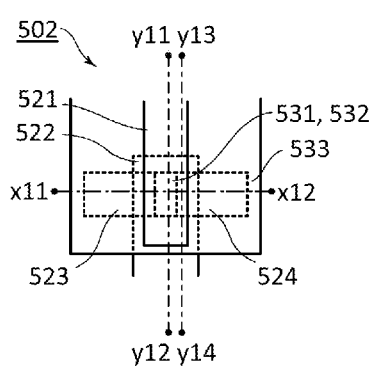
FIG. 32B
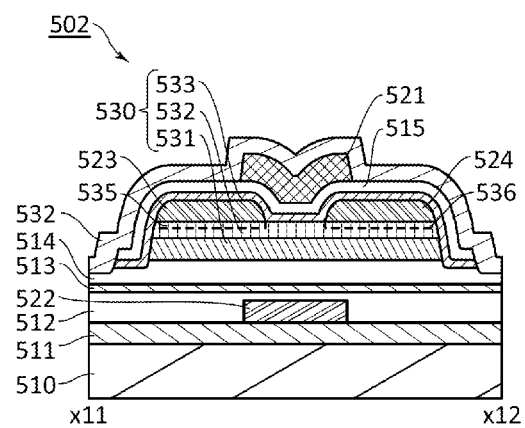
FIG. 32C
FIG. 32D
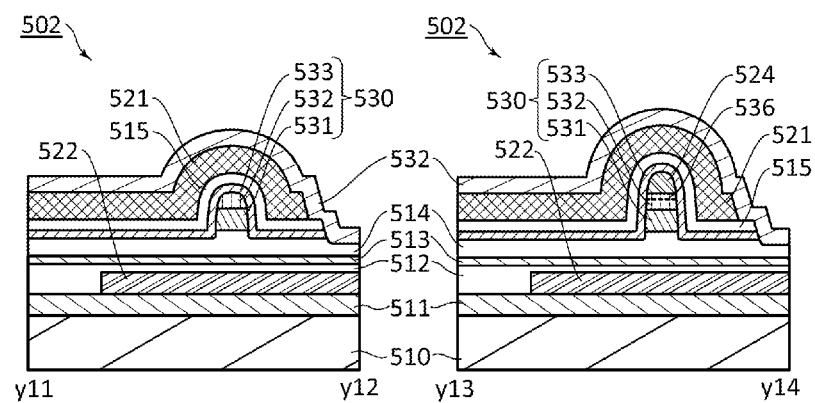

LOGIC CIRCUIT, SEMICONDUCTOR DEVICE, ELECTRONIC COMPONENT, AND ELECTRONIC DEVICE

BACKGROUND OF THE INVENTION

1. Field of the Invention

One embodiment of the present invention disclosed in the specification, the drawings, and the claims of this application (hereinafter referred to as "this specification and the like") relates to a logic circuit, a semiconductor device such as a processing device, a driving method thereof, a manufacturing method thereof, and the like. One embodiment of the present invention is not limited to the shown technical field. For example, one embodiment of the present invention relates to a memory device, a processing device, an imaging device, a display device, a light-emitting device, a power storage device, a driving method thereof, or a manufacturing method thereof.

2. Description of the Related Art

Logic circuits can be classified into static logic circuits, dynamic logic circuits, pseudo logic circuits, and the like. Operation of dynamic logic circuits implies to store data temporarily; thus, leakage current from transistors causes more severe problems in dynamic logic circuits than in static logic circuits. When leakage current from transistors is large, the data stored in the dynamic logic circuits is lost. Leakage current is attributed to off-state current flow when transistors are off. For example, Patent Documents 1 and 2 disclose that leakage current in dynamic logic circuits can be reduced when transistors in each of which a channel is formed using an oxide semiconductor are provided.

REFERENCE

Patent Documents

[Patent Document 1] Japanese Published Patent Application No. 2013-9311
[Patent Document 2] Japanese Published Patent Application No. 2013-9313

SUMMARY OF THE INVENTION

An object of one embodiment of the present invention is to provide a novel semiconductor device or a method for operating the novel semiconductor device. Another object of one embodiment of the present invention is to reduce power consumption, to reduce the number of elements, to increase operation speed, to change the voltage of an output signal, and the like.

The description of a plurality of objects does not mutually preclude their existence. One embodiment of the present invention does not necessarily achieve all the objects. Objects other than those listed above are apparent from the description of the specification and the like and also such objects could be an object of one embodiment of the present invention.

One embodiment of the present invention is a logic circuit including a dynamic logic circuit, a first capacitor, and a first output node. The dynamic logic circuit includes a second output node. A first terminal of the first capacitor is electrically connected to the first output node. A second terminal of the first capacitor is electrically connected to the second output node. The dynamic logic circuit includes a plurality of transistors forming an evaluation circuit. The plurality of transistors have all a same conductivity type, one of an n-type conductivity and a p-type conductivity. The plurality of transistors each include a back gate. The back gates are supplied with a signal that can be the same as that supplied to a gate of a corresponding transistor.

In the above embodiment, the back gates of the plurality of transistors may be supplied with different signals from those supplied to the gates of the transistors. In the above-described embodiment, channel formation regions of the plurality of the transistors may each include an oxide semiconductor.

One embodiment of the present invention is a logic circuit including a dynamic logic circuit, a first output node, a first transistor, and a first capacitor. The dynamic logic circuit includes a second output node. The dynamic logic circuit includes a plurality of second transistors. A first terminal of the first capacitor is electrically connected to the first output node. A second terminal of the first capacitor is electrically connected to the second output node. A first transistor and the plurality of second transistors have all a same conductivity type, one of an n-type conductivity and a p-type conductivity. The first transistor is diode-connected. A first terminal of the first transistor is electrically connected to the first output node. A first voltage is input to a second terminal of the first transistor. The first transistor includes a back gate. A first signal is input to the back gate of the first transistor.

In the above embodiment, each of the plurality of the second transistors may include a back gate, and the back gate of each of the plurality of the second transistors may be supplied with a signal that is the same as that supplied to a gate of a corresponding second transistor. In the above embodiment, the dynamic logic circuit may include a second capacitor electrically connected with the first output node.

In each of the above embodiments, the first transistor may include an oxide semiconductor in a channel formation region. In the above-described embodiment, a channel formation region of the second transistor may include an oxide semiconductor.

In each of the above embodiments, the first transistor and the plurality of the second transistors may be provided below or above the layer in which the first capacitor is provided.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are all semiconductor devices. Moreover, a memory device, a display device, a light-emitting device, a lighting device, an electronic device, and the like themselves might be semiconductor devices, or might each include a semiconductor device.

Note that a transistor includes three terminals: a gate, a source, and a drain. The gate functions as a control terminal for controlling conduction of the transistor. Depending on the channel type of the transistor or levels of potentials applied to the terminals, one of terminals functions as a source and the other functions as a drain. Therefore, the terms "source" and "drain" can be switched in this specification and the like. In this specification and the like, the two terminals other than the gate may be referred to as a first terminal and a second terminal.

A node can be referred to as a terminal, a wiring, an electrode, a conductor, an impurity region, or the like depending on a circuit configuration, a device structure, and the like. Furthermore, a terminal and the like can be referred to as a node.

In this specification and the like, ordinal numbers such as "first", "second", and "third" are used to avoid confusion among components, and the terms do not limit the components numerically or do not limit the order. Other matters regarding this specification and the like will be described in Embodiment 5.

One embodiment of the present invention can provide a novel semiconductor device or a method for operating the novel semiconductor device. For example, one embodiment of the present invention can reduce power consumption, reduce the number of elements, increase operation speed, or change the voltage of an output signal.

Note that the description of the plurality of effects does not disturb the existence of other effects. In one embodiment of the present invention, there is no need to obtain all the effects described above. In one embodiment of the present invention, an object other than the above objects, an effect other than the above effects, and a novel feature other than the above features will be apparent from the description of the specification and the like and the drawings.

BRIEF DESCRIPTION OF THE DRAWINGS

FIG. 29A is a top view illustrating a configuration example of a transistor. FIG. 29B is a cross-sectional view taken along line x11-x12 in FIG. 29A. FIG. 29C is a cross-sectional view taken along line y11-y12 in FIG. 29A.

FIG. 32A is a top view illustrating a configuration example of a transistor. FIG. 32B is a cross-sectional view taken along line x11-x12 in FIG. 32A. FIG. 32C is a cross-sectional view taken along line y11-y12 in FIG. 32A. FIG. 32D is a cross-sectional view taken along line y13-y14 in FIG. 32A.

DETAILED DESCRIPTION OF THE INVENTION

Figure 1:
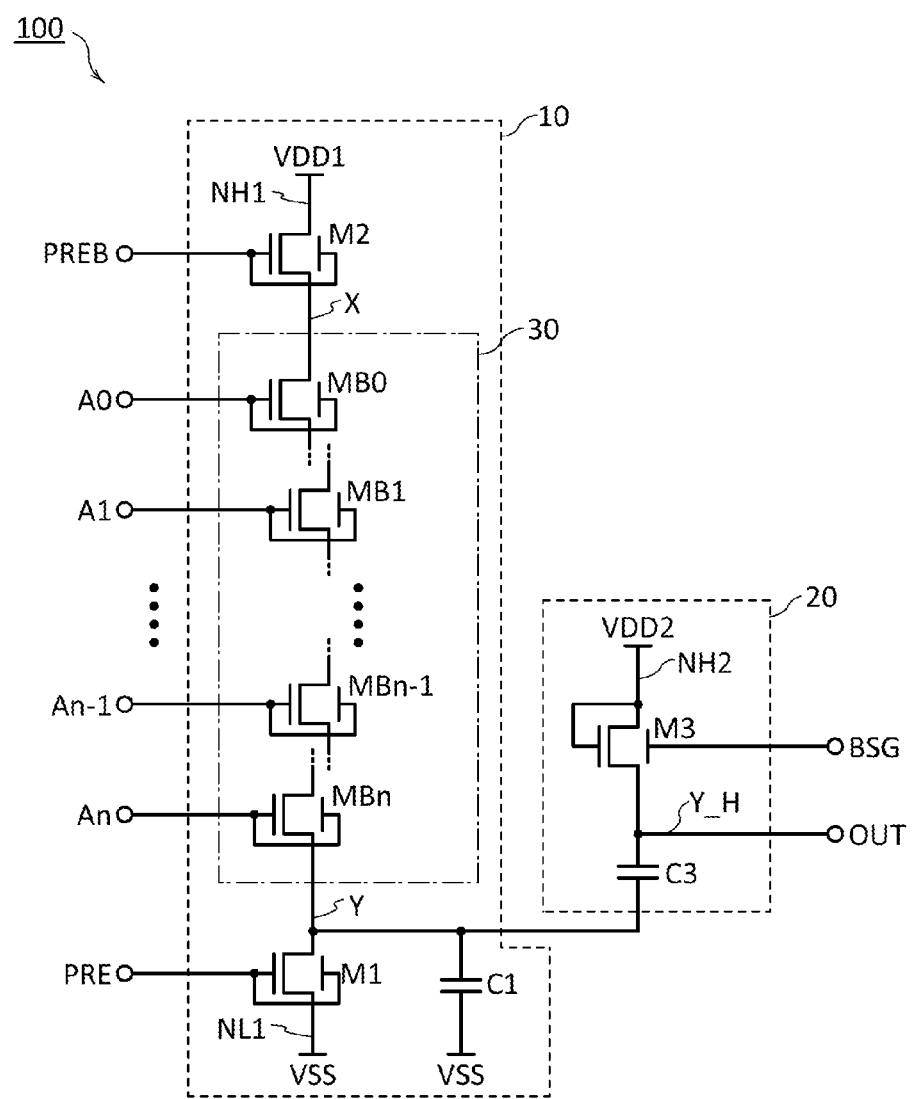
FIG. 1 is a circuit diagram showing a configuration example of a logic circuit.

Although a plurality of embodiments are described below, these embodiments can be combined as appropriate. Furthermore, although a plurality of structure examples (including a method example, an operation method example, a manufacturing method example, and the like) are shown in each of the embodiments, these structure examples can be combined with each other as appropriate. Furthermore, the present invention can be implemented in various different modes, and it will be readily apparent to those skilled in the art that various changes and modifications in modes and details thereof can be made without departing from the purpose and scope of the present invention. Thus, the present invention should not be interpreted as being limited to the following description of the embodiments.

In the drawings, the same components, components having similar functions, components formed of the same material, or components formed at the same time are denoted by the same reference numerals in some cases, and description thereof is not repeated in some cases. When the same reference numerals need to be distinguished from each other, "_1", "_2", "<n>", "[m, n]", or the like may be added to the reference numerals. For example, in the case where a plurality of wirings WL are individually distinguished from each other, the wiring WL in the second row may be described as a wiring WL_2 using a row number.

In this specification and the like, for example, a power supply voltage VDD is abbreviated to "voltage VDD", "VDD", or the like in some cases. The same applies to other components (e.g., a signal, a voltage, a potential, a circuit, an element, an electrode, and a wiring).

Embodiment 1

In this embodiment, a dynamic logic circuit is described as an example of a semiconductor device.

<<Configuration Example of Dynamic Logic Circuit>>

FIG. 1 is a circuit diagram showing an example of the dynamic logic circuit. A logic circuit 100 in FIG. 1 is a dynamic logic circuit that can output a signal OUT having a logic level determined by n+1 signals A0 to An (n is an integer of 1 or more). The logic circuit 100 includes a dynamic logic circuit 10 and a circuit 20. VSS, VDD1, and VDD2 are supplied to the logic circuit 100. VSS represents low power supply voltage. VDD1 and VDD2 represent high power supply voltages. Here, VDD2>VDD1>VSS is satisfied.

<Dynamic Logic Circuit 10>

The dynamic logic circuit 10 is a logic circuit having n+1 inputs. The dynamic logic circuit 10 includes a circuit 30, a transistor M1, a transistor M2, a capacitor C1, and nodes X, Y, NH1, and NL1. Here, the node Y functions as an output node of the dynamic logic circuit 10.

The node NL1 can function as a power supply node on the low level side to which VSS is supplied. The node NL1 is electrically connected to a wiring for supplying VSS (hereinafter, referred to as a VSS line). The node Y is precharged (initialized) during a precharge period. In the example in FIG. 1, the node Y is discharged by the precharge and the voltage of the node Y is set at a low level voltage "L". The transistor M1 is a pass transistor that controls a conduction state between the node Y and the node NL1. The transistor M1 is also referred to as a precharge control transistor. A first terminal and a second terminal of the capacitor C1 are electrically connected to the node Y and the VSS line, respectively. The capacitor C1 has a function of holding the voltage of the node Y. In the case where the voltage of the node Y can be held because of parasitic capacitance of the node Y, the capacitor C1 is not necessarily provided.

A node NH1 can function as a power supply node on the high level side to which VDD1 is supplied. The node NH1 is electrically connected to a wiring for supplying VDD1 (hereinafter, referred to as a VDD1 line). The transistor M2 is a pass transistor that controls a conduction state between the node X and the node NH1. The transistor M2 is also referred to as an evaluation control transistor.

Signals PRE and PREB are control signals for controlling precharge. The signal PRE is input to a gate of the transistor M1, and the signal PREB is input to a gate of the transistor M2. The signal PREB is an inverted signal of the signal PRE. In the example of FIG. 1, the transistors M1 and M2 have the same conductivity type. The signal PREB is input to the gate of the transistor M2 to perform complementary switching of the transistors M1 and M2. Accordingly, the transistor M2 is off when the transistor M1 is on, while the transistor M2 is on when the transistor M1 is off.

The circuit 30 is connected between the node X and the node Y. The circuit 30 includes n+1 transistors MB0 to MBn (n is an integer of 0 or more).

The transistors MB0 to MBn are n-channel transistors. The signals A0 to An are input to gates of the transistors MB0 to MBn, respectively. The transistors MB0 to MBn are electrically connected to each other in series and/or in parallel, so that at least one current path exists between the node X and the node Y. Although FIG. 1 shows an example in which a drain of the transistor MB0 is directly and electrically connected to the node X and a source of the transistor MBn is directly and electrically connected to the node Y, the connection structure of the circuit 30 is not limited thereto.

The circuit 30 can be referred to as an evaluation circuit. The circuit 30 performs logic evaluation of the signals A0 to An in accordance with the connection structure of the transistors M0 to Mn. When a logical condition of the signals A0 to An is established, current flows through one or a plurality of current paths (also referred to as charge paths) between the node X and the node Y and then the voltage of the node Y becomes a high level voltage "H". As described above, the circuit 30 has a function of pulling up the node Y to "H" and can be referred to as a pull-up circuit. In the evaluation operation, when the result of the logic evaluation by the circuit 30 is true, the node Y is charged and the voltage of the node Y becomes "H". When the result of the logic evaluation is false, the voltage of the node Y is not changed from the voltage set during the precharge period; thus, the node Y remains "L".

In the example of FIG. 1, n-channel transistors (the transistors M1, M2, and MB0 to MBn) provided in the dynamic logic circuit 10 have back gates. A bias voltage can be applied to a channel formation region of the transistor by applying a voltage to the back gate; thus, the characteristics of the transistor can be controlled.

The degree of the change in characteristics of the transistor caused by a back gate voltage (hereinafter, referred to as a BG bias) depends on the thickness, materials, or the like of layers included in a transistor. In an n-channel transistor, the threshold voltage is shifted to the positive voltage side when the BG bias is a negative voltage, while the threshold voltage is shifted to the negative voltage side when the BG bias is a positive voltage. Therefore, when turning on an n-channel transistor, its on-state current can be increased by inputting a positive voltage to the back gate. Such a characteristic of an n-channel transistor can increase the operation speed of the dynamic logic circuit 10.

The transistor M1 includes the back gate that is electrically connected to the gate. That is, the same signal is input to the back gate and the gate of the transistor M1. Thus, a high-level voltage is applied to the back gate when the transistor M1 is on, so that the on-state current of the transistor M1 increases. The same applies to the transistors M2 and MB0 to MBn. Since the on-state current of each of the transistors can be increased in operation of the dynamic logic circuit 10, the dynamic logic circuit 10 can operate at high speed.

Furthermore, since the threshold voltages of the transistors MB0 to MBn can be decreased, a decrease in the voltage of the node Y due to the threshold voltages of the transistors MB0 to MBn can be suppressed even in the case where the node Y becomes "H" by the evaluation operation. In addition, the high-level voltages of the signals A0 to An can be decreased.

<Circuit 20>

The circuit 20 is electrically connected to the node Y. The circuit 20 includes nodes Y_H and NH2, a transistor M3, and a capacitor C3.

The node NH2 is a power supply node on the high level side to which VDD2 is supplied. The node NH2 is electrically connected to a wiring for supplying VDD2 (hereinafter, referred to as a VDD2 line). The node Y_H is an output node of the circuit 20, and also an output node of the logic circuit 100. The signal OUT is output from the node Y_H. The transistor M3 is diode-connected, and has a function of rectifying current between the node NH2 and the node Y_H. The node Y_H and the node Y are capacitively coupled. Here, a first terminal of the capacitor C3 is electrically connected to the node Y, and a second terminal of the capacitor C3 is electrically connected to the node Y_H.

The circuit 20 has a function of generating a voltage higher than the voltage of the node Y and can be referred to as a bootstrap circuit. The capacitor C3 is also referred to as a bootstrap capacitor. The transistor M3 that is diode-connected is also referred to as a bootstrap diode. The circuit configuration of the circuit 20 is not limited to the example in FIG. 1. The circuit 20 may be a circuit that can perform a bootstrap operation in which the voltage of the node Y_H becomes higher than that of the node Y by capacitive coupling between the node Y_H and the node Y. To change the voltage of the node Y_H in conjunction with the voltage of the node Y, the voltage of the node Y_H is changed by capacitive coupling.

The transistor M3 includes a back gate, and a signal BSG is input to the back gate. The signal BSG is a control signal for controlling a BG bias to the transistor M3. The threshold voltage of the transistor M3 is changed by the signal BSG, so that the voltage of the node Y_H can be changed.

Note that the node X can be an output node of the dynamic logic circuit 10. In this case, the circuit 20 and the capacitor C3 are electrically connected to the node X.

<<Operation Example of Logic Circuit 100>>

Figure 2A:
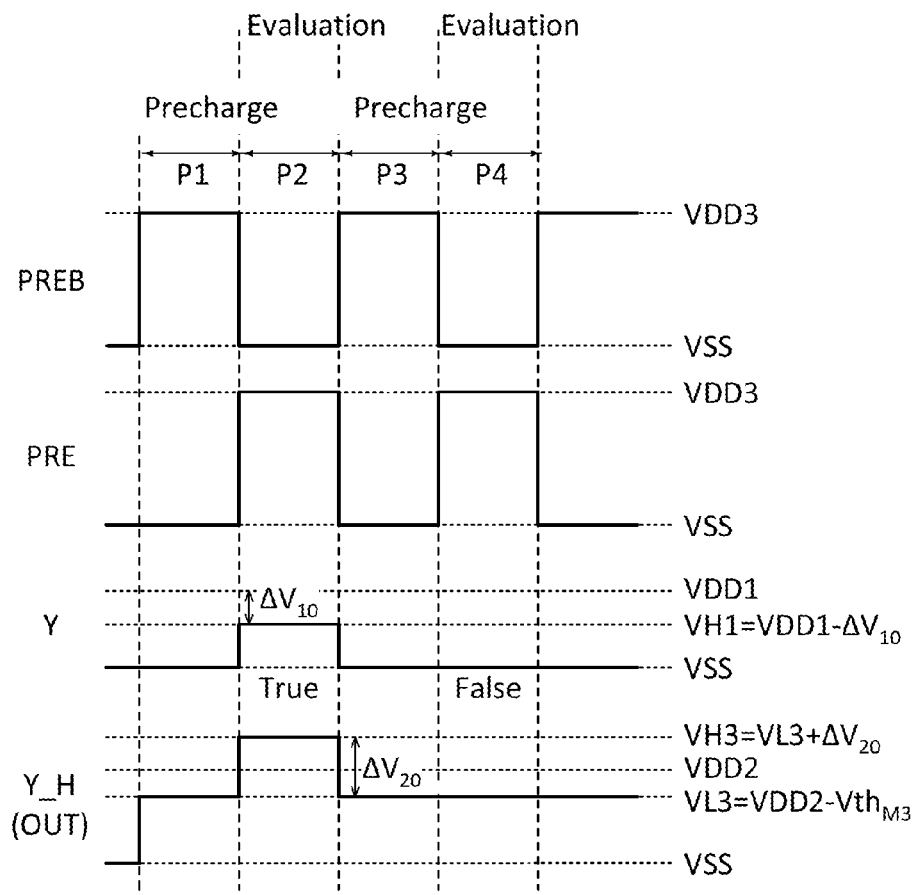
FIGS. 2A and 2B are timing charts showing an operation example of a logic circuit.

An operation example of the logic circuit 100 is described with reference to a timing chart illustrated in FIG. 2A. In FIG. 2A, P1, P2, and the like each denote a period. In FIG. 2A, the maximum voltages of the signal PRE and the signal PREB are VDD3 and the minimum voltages thereof are VSS. VDD3>VDD2>VDD1 is satisfied.

<Precharge>

During periods (P1 and P3) during which the signal PRE is at an H level, a precharge operation is performed in the logic circuit 100. The transistor M1 is on and the transistor M2 is off. The voltage of the node Y becomes VSS and the voltage of the node Y_H becomes VL3. VL3 is a voltage lower than VDD2 by the threshold voltage ($Vth_{M3}$) of the transistor M3.

<Evaluation>

During periods (P2 and P4) during which the signal PRE is at an L level, an evaluation operation is performed in the logic circuit 100. The transistor M1 is off and the transistor M2 is on. The logical condition of the signals A0 to An is true in the period P2, and is false in the period P4. Therefore, the voltage of the node Y is "H" during the period P2, and is "L" during the period P4.

(Period P2)

In the period P2, the voltage of the node Y is increased from VSS to VH1 by the circuit 30. VH1=VDD1−$\Delta V_{10}$ is satisfied. The value of $\Delta V_{10}$ is determined in accordance with the number of stages of transistors that form a current path between the node Y and the node NH1 in the circuit 30. As the number of stages of transistors is large, $\Delta V_{10}$ is increased due to the threshold voltages of the transistors and VH1 is decreased. Because of the function of the circuit 20, the voltage of the node Y_H is increased together with the voltage of the node Y. The voltage of the node Y_H becomes a voltage VH3 higher than VL3 by $\Delta V_{20}$. As shown in a formula (a1), $\Delta V_{20}$ is determined by VH1, capacitance C3 of the capacitor C3, and parasitic capacitance $C_{YH}$ of the node Y_H.

[Formula 1]

$$\Delta V_{20} = VH1 \times \frac{C_3}{C_3 + C_{YH}} \quad (a1)$$

With the circuit 20, the signal OUT at a voltage higher than the voltage of the node Y can be output. The circuit 20 can compensate for a voltage drop due to the threshold voltages of the transistor M2 and the transistors MB0 to MBn in the circuit 30. Accordingly, the drive capability of a circuit in the subsequent stage of the logic circuit 100 can be improved. Alternatively, in the subsequent stage of the logic circuit 100, a circuit including transistors with high threshold voltage can be provided.

Figure 2B:
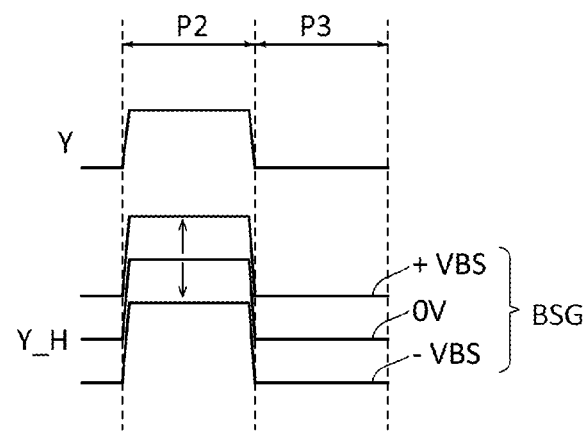

The circuit 20 can change the voltage of the node Y_H by the signal BSG. The function of the circuit 20 is described with reference to FIG. 2B. FIG. 2B shows wave forms of the nodes Y and Y_H when the voltage of the signal BSG is 0 V, +$V_{BS}$ (positive voltage), and −$V_{BS}$ (negative voltage).

The changes in voltages of $Vth_{M3}$ and the node Y_H are examined based on the reference state with the signal BSG of 0 V. $Vth_{M3}$ is shifted to the positive voltage side when the signal BSG is −$V_{BS}$, so that the voltage of the node Y_H is decreased. In contrast, in the case where the signal BSG is +$V_{BS}$, $Vth_{M3}$ is shifted to the negative voltage side, so that the voltage of the node Y_H is increased. In this manner, the circuit 20 can control the voltage of the node Y_H.

(Period P4)

During the period P4, the voltage of the node Y is maintained at the voltage (VSS) set by the precharge operation during the period P3. Thus, the voltage of the node Y_H is not changed and is maintained at VL3. The circuit in the subsequent stage is driven in accordance with the voltage of the node Y_H in the logic circuit 100; thus, VL3 (the voltage of the node Y_H in the logical condition of "L") is preferably lower than the threshold voltage of the transistor in the circuit in the subsequent stage.

In the case where a circuit including transistors with high threshold voltages is provided in the subsequent stage to the logic circuit 100, the voltage of the signal OUT can be increased by setting the signal BSG to a positive voltage. In contrast, in the case where a circuit including transistors with low threshold voltages is provided in the subsequent stage of the logic circuit 100, the voltage of the signal OUT can be decreased by setting the voltage of the signal BSG to a negative voltage or 0 V. That is, the logic circuit 100 can be used as a level shifter. The voltage of the signal OUT is changed by the circuit 20 in this manner; thus, the logic circuit 100 has a wide range of application.

Although VDD2 (a high-level power supply voltage of the circuit 20) is set to a higher voltage than VDD1 here, VDD2 is not limited thereto. VDD2 may be the same voltage as VDD1 or may be a voltage lower than VDD1 depending on a circuit connected to the subsequent stage of the logic circuit 100.

Although a back gate is provided in each of the transistors of the logic circuit 100, back gates are not necessarily provided in some of the transistors. For example, the back gate is not necessarily provided in the transistor M3 when there is no need to control the voltage of the signal OUT. Furthermore, the area of the dynamic logic circuit 10 is increased in some cases when each of the transistors of the dynamic logic circuit 10 has the back gate connected to the gate. To reduce the area of the dynamic logic circuit 10, some or all of the transistors of the dynamic logic circuit 10 may be transistors that do not include back gates.

Figure 3:
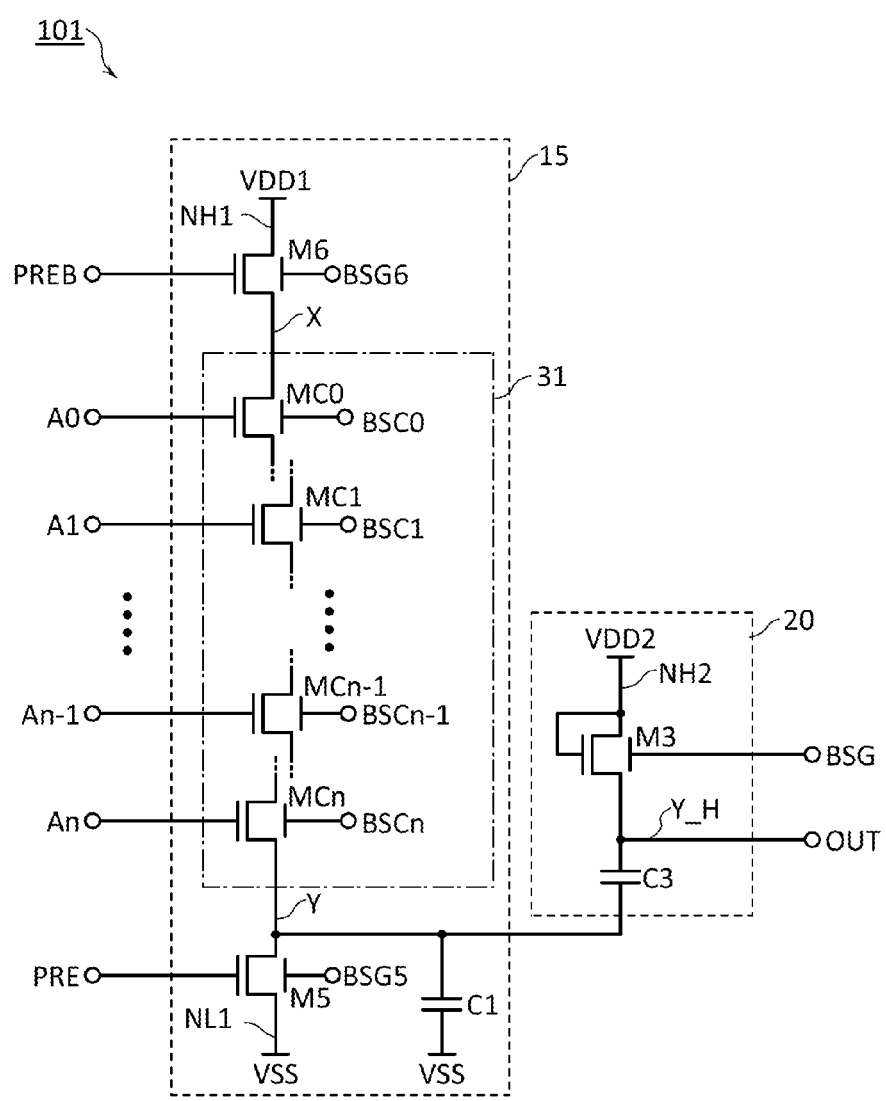
FIG. 3 is a circuit diagram showing a configuration example of a logic circuit.

Although the same signal is input to the back gate and the gate of each of the transistors in the dynamic logic circuit 10, the way to apply a BG bias is not limited thereto. For example, a signal different from a signal input to the gate of each transistor may be input to the back gate. FIG. 3 shows a configuration example of such a circuit. A logic circuit 101 illustrated in FIG. 3 is a modification example of the logic circuit 100. In the logic circuit 101, a dynamic logic circuit 15 is provided instead of the dynamic logic circuit 10.

The dynamic logic circuit 15 includes transistors M5, M6, the capacitor C1, and a circuit 31. The circuit 31 includes transistors MC0 to MCn. Signals BSG5, BSG6, and BSC0 to BSCn are input to the dynamic logic circuit 15. The signal BSG 5 is input to a back gate of the transistor M5. The signal BSG5 and the signal PRE may be the same signal. The signal BSG6 is input to a back gate of the transistor M6. The signal BSG6 and the signal PREB may be the same signal. The signals BSC0 to BSCn are input to back gates of the transistors MC0 to MCn. The signals BSC0 to BSCn may be respectively the same as the signals A0 to An. Alternatively, some of the signals BSC0 to BSCn may be the same signal. Some of the transistors MC0 to MCn may be the transistors without back gates, or with the back gates electrically connected to the gates.

The logic circuits 100 and 101 can be formed using transistors of the same conductivity type. In the case where the logic circuit 100 is formed using transistors of the same conductivity type, the number of transistors can be reduced as compared with the case where the logic circuit 100 is formed using CMOS transistors. In addition, the number of manufacturing steps of the logic circuits 100 and 101 can be reduced; thus, the cost can be reduced and the yield can be improved.

Although types of transistors included in the logic circuit of this embodiment are not specifically limited, OS transistors are preferable. Since an OS transistor has small temperature dependence of its characteristics, a range of output voltage of the logic circuit in this embodiment is widened as well as the temperature range at which the logic circuit can operate. Thus, the logic circuit including the OS transistors are suitable for a semiconductor device that uses various voltages at high temperatures (e.g., an in-car semiconductor device).

The OS transistor has a threshold voltage higher than that of a Si transistor formed using a silicon wafer. In the case where a dynamic logic circuit includes OS transistors, due to the threshold voltages of the OS transistors, a voltage of a signal may be lowered, and a malfunction may occur in a circuit connected to a subsequent stage of the dynamic logic circuit. The dynamic logic circuit in this embodiment can solve the threshold voltage drop problem by controlling a BG bias of the OS transistor.

A channel formation region of an OS transistor is preferably formed using an oxide semiconductor containing at least one of indium (In) and zinc (Zn). Typical examples of such an oxide semiconductor include an In-M-Zn oxide (M is Al, Ga, Y, or Sn, for example). By reducing impurities serving as electron donors, such as moisture or hydrogen, and also reducing oxygen vacancies, an i-type (intrinsic) or a substantially i-type oxide semiconductor can be obtained. Here, such an oxide semiconductor can be referred to as a highly-purified oxide semiconductor. By using a highly purified oxide semiconductor, the off-state current of the OS transistor that is normalized by channel width can be as low as several yoctoamperes (yA) per micrometer to several zeptoamperes (zA) per micrometer. For example, in the OS transistor, a normalized off-state current per micrometer of a channel width at a source-drain voltage of 10 V can be less than or equal to $10 \times 10^{-21}$ A (10 zA (zeptoampere)). An OS transistor and an oxide semiconductor will be described in Embodiments 4 and 5.

An OS transistor including a highly purified oxide semiconductor is an n-channel transistor. For this reason, the logic circuit including transistors of a single conductivity type in this embodiment is very suitable for a semiconductor device in which OS transistors are used.

Specific configuration examples of the logic circuits 100 and 101 are described below with reference to FIGS. 4A and 4B, FIG. 5, FIG. 6, and FIG. 7.

<<AND Circuit>>

Figure 4A:
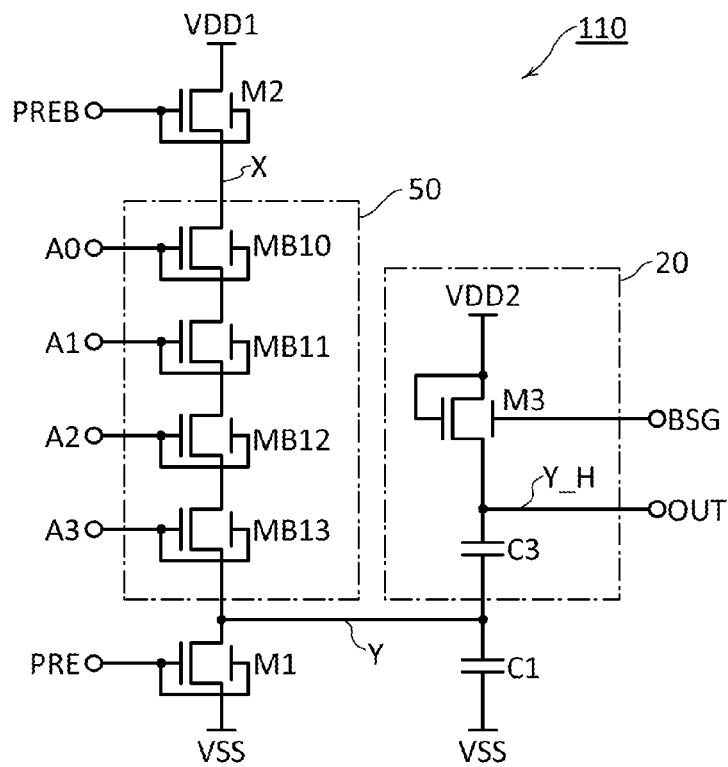
FIGS. 4A and 4B are circuit diagrams showing configuration examples of a logic circuit (AND circuit).
Figure 4B:
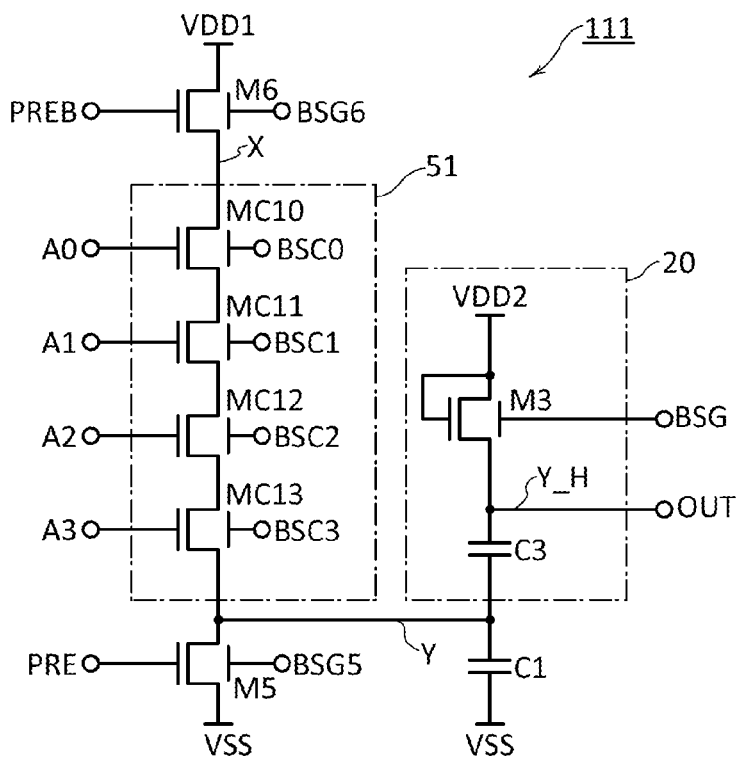

FIGS. 4A and 4B each show an example of a four-input AND circuit. The logic circuit 110 (FIG. 4A) corresponds to the logic circuit 100, and the logic circuit 111 (FIG. 4B) corresponds to the logic circuit 101.

The logic circuit 110 includes the transistors M1 and M2, the capacitor C1, the circuit 20, a circuit 50, and the nodes X, Y, and Y_H. The circuit 50 corresponds to the circuit 30 illustrated in FIG. 1. The circuit 50 includes transistors MB10 to MB13 which are electrically connected to each other in series. The transistor MB10 includes a back gate that is electrically connected to the gate. The same applies to the transistors MB11 to MB13. Signals A0, A1, A2, and A3 are input to the gates of the transistors MB10, MB11, MB12, and MB13, respectively. The signals A0, A1, A2, and A3 are also input to the back gates of the transistors MB10, MB11, MB12, and MB13, respectively. Some or all of the transistors M1 to M3 and the transistor MB10 to MB13 may be transistors without back gates.

The logic circuit 111 includes the transistors M5 and M6, the capacitor C1, the circuit 20, a circuit 51, and the nodes X, Y, and Y_H. The circuit 51 corresponds to the circuit 31 illustrated in FIG. 3. The circuit 51 includes transistors MC10 to MC13 which are electrically connected to each other in series. The transistors MC10 to MC13 include back gates. The signals A0 to A3 are input to the gates of the transistors MC10 to MC13. The signals BSC0 to BSC3 are input to the back gates of the transistors MC10 to MC13. Some or all of the transistors M3, M5, M6 and the transistor MC10 to MC13 may be transistors without back gates. Alternatively, the back gates of part of transistors are electrically connected with the gates.

When the transistors in the logic circuit 110 are p-channel transistors, the logic circuit 110 can function as a NAND circuit. The same applies to the logic circuit 111.

Figure 5:
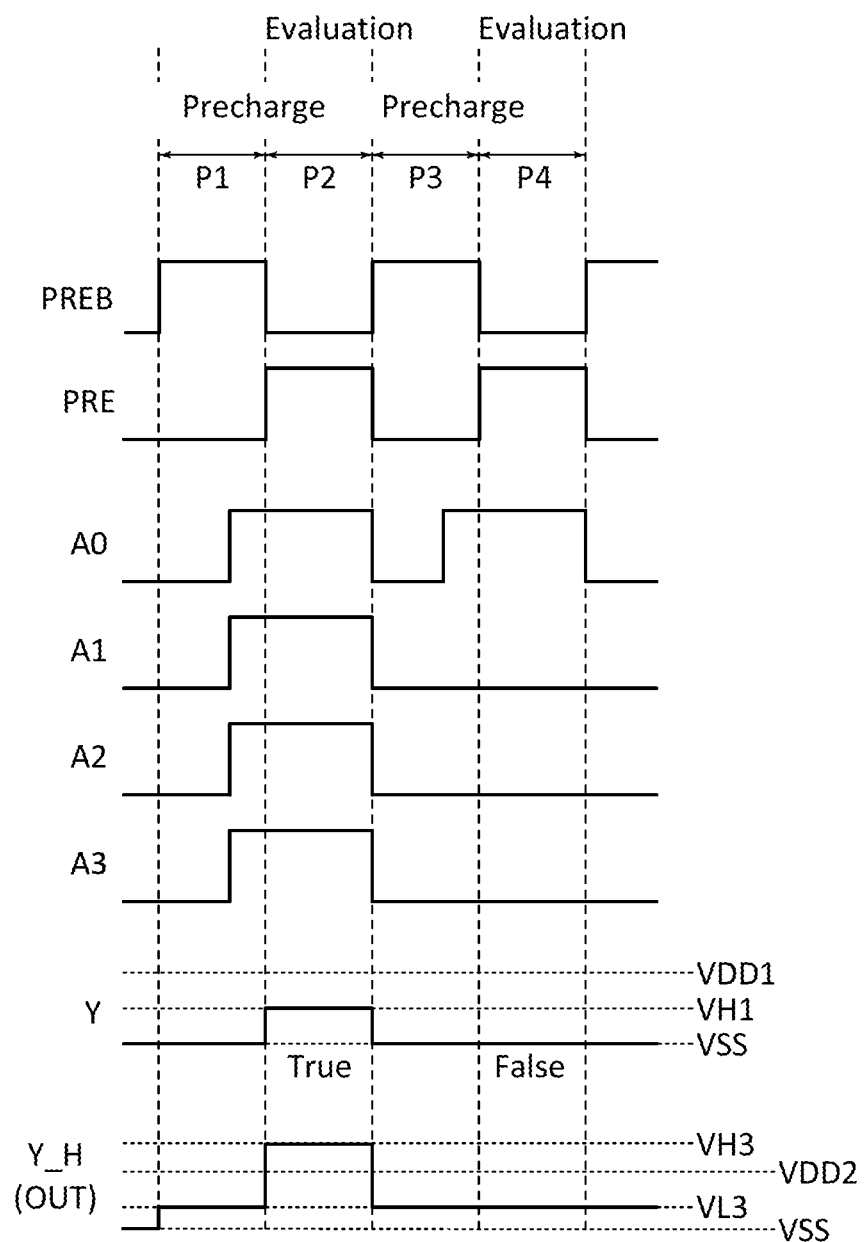
FIG. 5 is a timing chart showing an operation example of a logic circuit (AND circuit).

FIG. 5 is a timing chart showing the operation example of the logic circuit 110. In FIG. 5, as in FIG. 2A, the logical condition of the signals A0 to A3 is true in a period P2, and is false in a period P4. During the period P2, the signals A0 to A3 are "H"; thus, the node NH1 and the node Y are brought into electrical conduction, and the node Y becomes "H" and the node Y_H also becomes "H". A signal OUT at a voltage VH3 is output from the logic circuit 110. During the period P4, only the signal A0 is "H"; thus, the node Y is maintained in an electrically floating state. Therefore, the voltages of the node Y and the node Y_H are maintained at voltages set by the precharge operation in the period P3, which are VSS and VL3, respectively. In the period P4, a signal OUT at the voltage VL3 is output. The voltage of the node Y_H is set to a desired voltage by a signal BSG.

Since the logic circuit 111 can operate in a manner similar to that of the logic circuit 110, the description of the operation example of the logic circuit 110 (FIG. 5) can be referred to for the operation of the logic circuit 111.

<<OR Circuit>>

Figure 6:
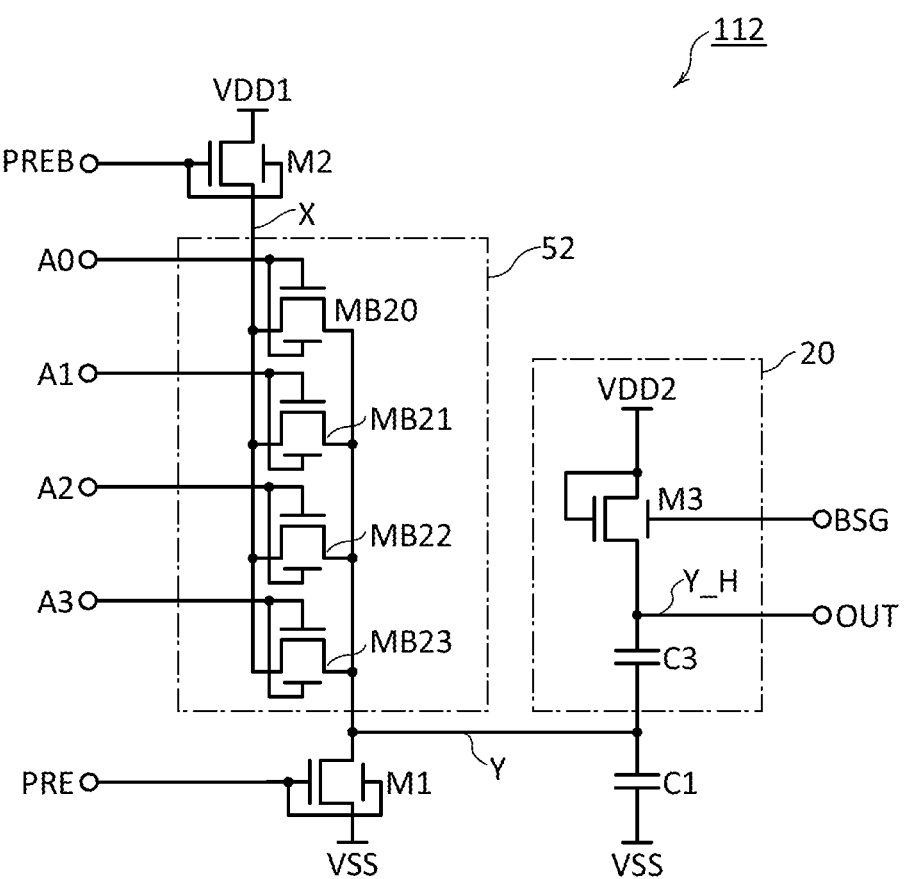
FIG. 6 is a circuit diagram showing a configuration example of a logic circuit (OR circuit).

FIG. 6 illustrates an example of a four-input OR circuit. A logic circuit 112 illustrated in FIG. 6 includes the transistors M1 and M2, the capacitor C1, the circuit 20 and a circuit 52, and the nodes X, Y, and Y_H. The circuit 52 corresponds to the circuit 30. The circuit 52 includes transistors MB20 to MB23. The transistors MB20 to MB23 are electrically connected to each other in parallel between the node X and the node Y. The transistor MB20 includes a back gate that is electrically connected to a gate. The same applies to the transistors MB21 to MB23. Signals A0, A1, A2, and A3 are input to the gates of the transistors MB20, MB21, MB22, and MB23, respectively. The signals A0, A1, A2, and A3 are also input to the back gates of the transistors MB20, MB21, MB22, and MB23, respectively.

During the evaluation period of the logic circuit 112, when any one of the signals A0 to A3 is "H", the node Y becomes "H", so that a signal OUT at a voltage VH3 is output. Alternatively, during the evaluation period, when all of the signals A0 to A3 are "L", the voltage of the node Y_H remains "L", so that a signal OUT at a voltage VL3 is output.

When the transistors in the logic circuit 112 are p-channel transistors, the logic circuit 112 can function as a NOR circuit.

In the logic circuit 112, the transistors M5 and M6 may be provided instead of the transistors M1 and M2. A transistor without a back gate may be provided instead of the transistor M3. A signal which is different from an input signal to the gate of the transistor MB20 may be input to the back gate, and a transistor without a back gate may be provided instead of the transistor MB20. The same applies to the transistors MB21 to MB23.

<<AND-OR Circuit>>

Figure 7:
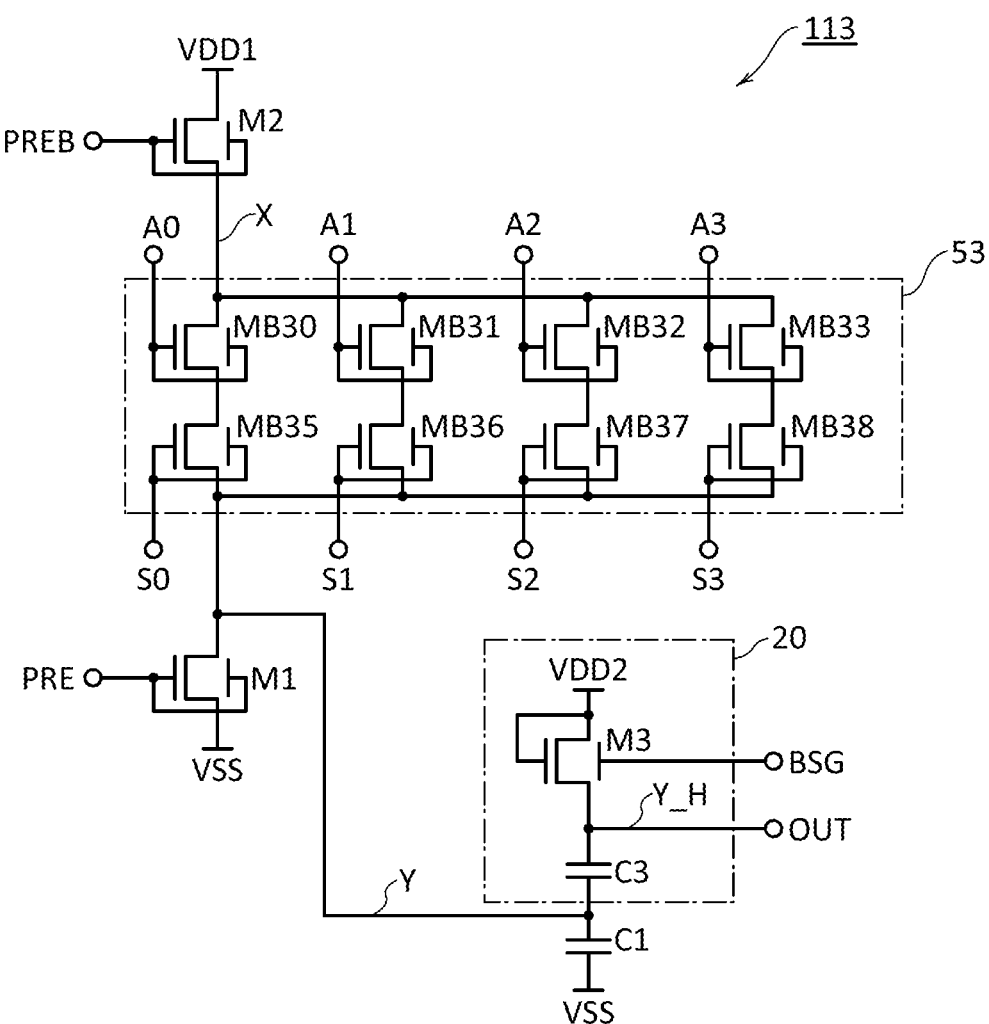
FIG. 7 is a circuit diagram showing a configuration example of a logic circuit (AND-OR circuit).

FIG. 7 illustrates an example of an AND-OR circuit. A logic circuit 113 illustrated in FIG. 7 includes the transistors M1 and M2, the capacitor C1, the circuit 20, a circuit 53, and the nodes X, Y, and Y_H. The circuit 53, a circuit corresponding to the circuit 30, includes transistors MB30 to MB33 and transistors MB35 to MB38. The transistor MB30 includes a back gate that is electrically connected to a gate. The same applies to the transistors MB31 to MB33 and the transistors MB35 to MB38. Signals A0 to A3 and signals S0 to S3 are input to the circuit 53. Signals A0, A1, A2, and A3 are input to the gates of the transistors MB30, MB31, MB32, and MB33, respectively. The signals S0, S1, S2, and S3 are input to the gates of the transistors MB35, MB36, MB37, and MB38, respectively.

The logic circuit 113 can function as a four-input multiplexer (selection circuit). For example, the signals A0 to A3 can be data signals, and the signals S0 to S3 can be signals which select a data signal to be output. In this case, any one of the signals S0 to S3 is set at "H" during the evaluation period. For example, when only the signal S1 is "H", a signal OUT at the same voltage level as the signal A1 is output. When the signal A1 is "H", a signal OUT at a voltage VH3 ("H") is output, and when the signal A1 is "L", a signal OUT at a voltage VL3 ("L") is output.

The output node from which the signal OUT is taken out can be the node X in the logic circuit in this embodiment. In the case where an "H" voltage of the node X has a value at which the circuit in the subsequent stage can be driven normally, the circuit 20 is not necessarily provided. If the node X serves as an output node, the logic circuits 110 and 111 can function as NAND circuits, and the logic circuit 112 can function as a NOR circuit.

Therefore, in the case where a functional circuit is configured by a combination of a plurality of logic circuits, a circuit configuration in which the circuit 20 is not provided in a logic circuit where a signal is output from a node X (a node whose voltage becomes "L" when the evaluation condition is true) and the circuit 20 is provided in a logic circuit where a signal is output from a node Y (a node whose voltage becomes "H" when the evaluation condition is true) may be employed, whereby the area overhead due to the addition of the circuit 20 can be reduced.

According to this embodiment, even if transistors having a high threshold voltage are included, a dynamic logic circuit with high drive capability can be provided. In addition, the logic circuit of this embodiment can drive a circuit including transistors having high threshold voltages.

As a logic circuit including n-channel transistors, a pseudo logic circuit is known. A dynamic logic circuit can be driven with lower power than the pseudo logic circuit. Thus, according to this embodiment, a logic circuit including transistors of the same conductivity type can achieve low power consumption and high-speed operation. For example, according to this embodiment, with an OS transistor, various logic circuits with high drive capability and low power consumption can be provided.

The OS transistor can operate even in a high-temperature environment (e.g., 100° C. or higher) in which it is difficult for a Si transistor to operate; thus, according to this embodiment, various functional circuits that can function in the high-temperature environment and electronic devices including any of the functional circuits can be provided. For example, the dynamic logic circuit in this embodiment is suitable for an in-car semiconductor device.

Embodiment 2

In this embodiment, a semiconductor device including the logic circuit of Embodiment 1 is described.

There are known semiconductor devices that include a circuit array including a plurality of circuits arranged in array, wirings corresponding to the arrangement of the circuits, and peripheral circuits for driving the circuit array. As a peripheral circuit for driving the circuits in the circuit array, the dynamic logic circuit of Embodiment 1 can be used.

Typical examples of the semiconductor devices include a memory device in which a plurality of memory cells are arranged in array (e.g., a dynamic random access memory (DRAM), a static random access memory (SRAM), or a flash memory), an imaging device having a plurality of pixels (an imaging element), and an active matrix display device having a plurality of pixels (e.g., a liquid crystal display device, an electroluminescence (EL) display device, or a MEMS display device). Examples of such semiconductor devices are described below.

<<Memory Device>>

Figure 8:
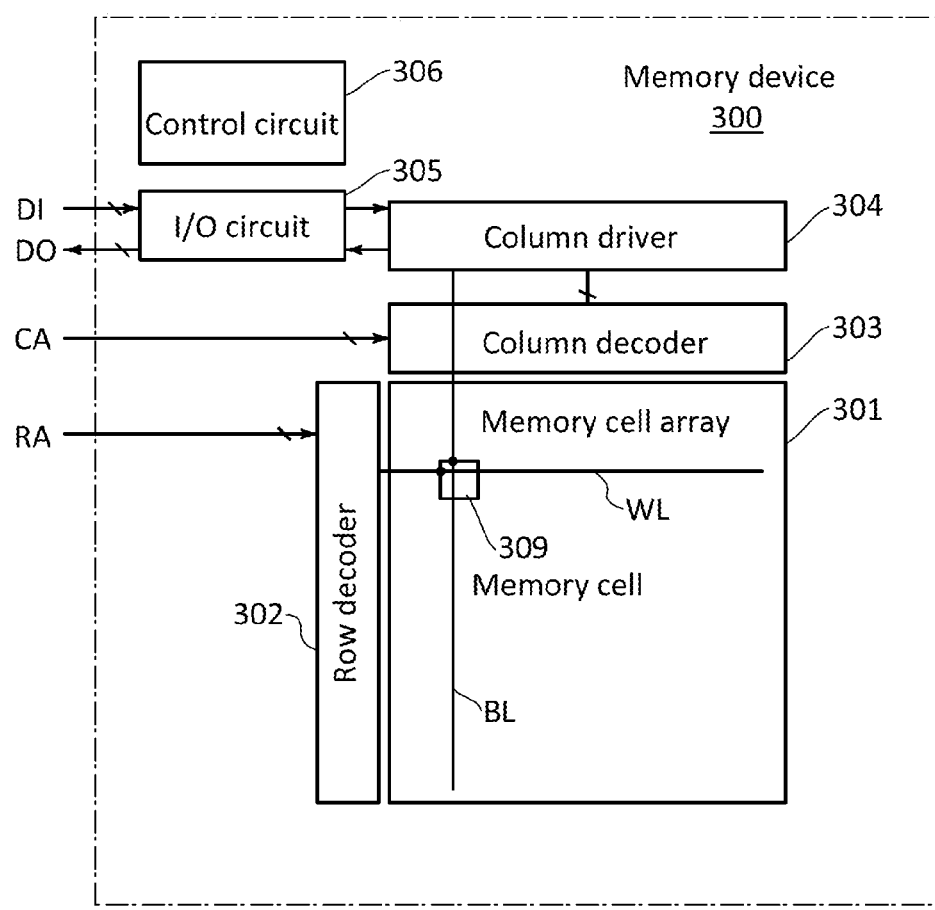
FIG. 8 is a block diagram showing a configuration example of a memory device.

FIG. 8 is a block diagram showing a configuration example of a memory device. A memory device 300 in FIG. 8 can be used as a DRAM. The memory device 300 includes a memory cell array 301, a row decoder 302, a column decoder 303, a column driver 304, an input/output circuit 305, and a control circuit 306.

The control circuit 306 is a circuit for controlling the whole memory device 300. The control circuit 306 has a function of decoding command signals input from the outside. The control circuit 306 controls circuits included in the memory device 300 on the basis of decoded command data, command data stored in the control circuit 306, or the like.

The memory cell array 301 includes a plurality of memory cells 309, a plurality of wirings BL, and a plurality of wirings WL. The plurality of memory cells 309 are arranged in array. In accordance with the arrangement of the memory cells 309, the wirings WL are provided in the respective rows and the wirings WL are provided in the respective columns. The row decoder 302 has a function of decoding a row address (RA) signal. The wiring WL in a row specified by the signal RA is selected by the row decoder 302. The column decoder has a function of decoding a column address (CA) signal. The column driver 304 has a function of driving a wiring BL in a column specified by a signal CA.

The input/output circuit 305 has a function of controlling an input of a data signal DI, a function of controlling an output of a data signal DO, and the like. The data signal DI is a data signal to be written, and the data signal DO is a data signal read from the memory cell array 301. Writing of the data signal DI and reading out of the signal DO are performed by a column driver 304. The column driver 304 has a function of reading out data from the wiring BL in a row specified by the row decoder 303 and a function of writing data to the wiring BL. For example, the column driver 304 includes a switch, a sense amplifier (also referred to as a sense latch), a precharge circuit, and the like. The switch has a function of controlling a conduction state between the column driver 304 and the input/output circuit 305. The sense amplifier operates when data is read out. The sense amplifier has a function of sensing and amplifying a voltage between the pair of wirings BL. A signal amplified by the sense amplifier is output to the input/output circuit 305 through the switch. The precharge circuit operates when data is written, and has a function of precharging the wiring BL.

<Memory Cell>

FIGS. 9A to 9F show circuit configuration examples of a memory cell. Memory cells illustrated in FIGS. 9A to 9F can be used as the memory cells 309.

Figure 9A:
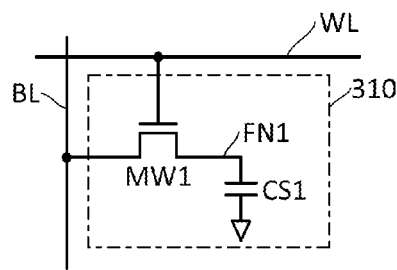
FIGS. 9A to 9F are circuit diagrams showing configuration examples of a memory cell.

The memory cell 310 illustrated in FIG. 9A has a circuit configuration of one transistor and one capacitor (1T1C), and includes a transistor MW1, a capacitor CS1, and a node FN1. The node FN1 serves as a data holding node. The capacitor C1 is a storage capacitor for holding the potential of the node FN1. The transistor MW1 is a write transistor. The conduction state of the transistor MW1 is controlled by a selection signal input to the wiring WL.

To lengthen the retention period of the memory cell 310, the transistor MW1 preferably has a small off-state current. Thus, an OS transistor is preferably used as the transistor MW1, for example. When the transistor MW1 is an OS transistor, the memory cell 310 can be used as a nonvolatile memory element. Although a voltage that turns off the transistor MW1 completely is continuously applied to its gate in order to store data in the memory cell 310 in some cases, little power is consumed in the memory cell 310 because almost no current flows through the transistor MW1. Because of little power consumption, the memory cell 310 can be regarded as being substantially nonvolatile even if a predetermined voltage is supplied to the memory cell 310 in the retention period.

Figure 9B:
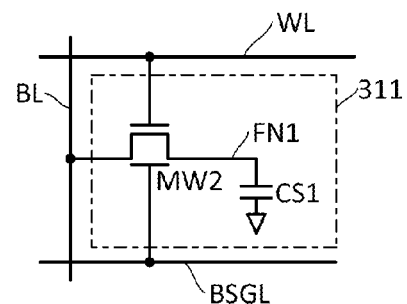

A memory cell 311 illustrated in FIG. 9B is a modification example of the memory cell 310. The memory cell 311 includes a transistor MW2 instead of the transistor MW1. The transistor MW2 is preferably an OS transistor.

The transistor MW2 includes a back gate. The back gate of the transistor MW2 is electrically connected to a wiring BSGL. The threshold voltage of the transistor MW2 can be changed by a voltage input to the wiring BSGL. Because of low power consumption in the memory cell 311, the memory cell 311 can be regarded as a nonvolatile memory cell like the memory cell 310 even though a voltage that makes the transistor MW2 in a normally-off state keeps being supplied to the wiring BSGL in a retention period.

Figure 9C:
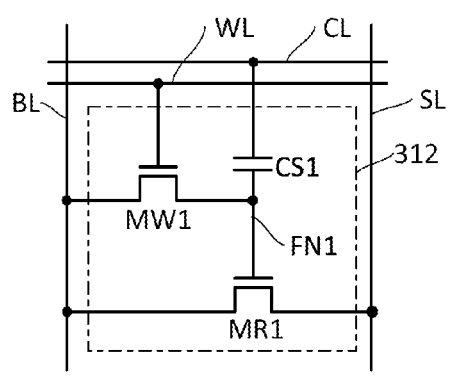

A memory cell 312 illustrated in FIG. 9C is electrically connected to wirings WL, BL, CL, and SL. The memory cell 312 is a 2T1C-type gain cell and includes the transistor MW1, a transistor MR1, the capacitor CS1, and the node FN1. The transistor MR1 can be an Si transistor, in which case it may be a p-channel transistor. Furthermore, a reading bit line (a wiring RBL) may be provided to be electrically connected to the transistor MR1.

Figure 9D:
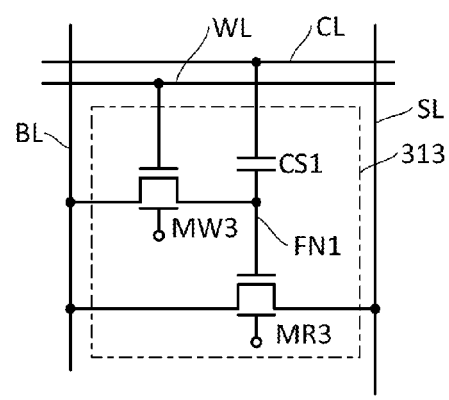

The transistor MW2 may be provided instead of the transistor MW1. Both of the transistors MR1 and MW1 can be OS transistors. In this case, the memory cell 312 can be formed by OS transistors including back gates. FIG. 9D illustrates an example of such a case. A memory cell 313 illustrated in FIG. 9D includes transistors MR3 and MW3, the capacitor C1, and the node FN1. To the back gates of the transistors MR3 and MW3, the same signal or different signals may be input.

Figure 9E:
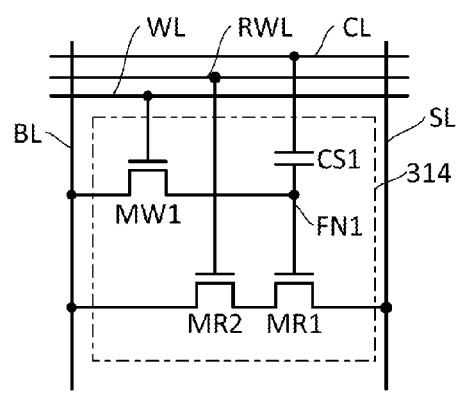

A memory cell 314 illustrated in FIG. 9E is electrically connected to wirings WL, RWL, BL, CL, and SL. The memory cell 314 is a 3T1C-type gain cell, and includes the node FN1, the transistor MW1, the transistor MR1, a transistor MR2 and the capacitor CS1. The transistors MR1 and MR2 can be Si transistors, in which case they may be p-channel transistors. Furthermore, a wiring RBL may be provided to be electrically connected to the transistor MR2.

Figure 9F:
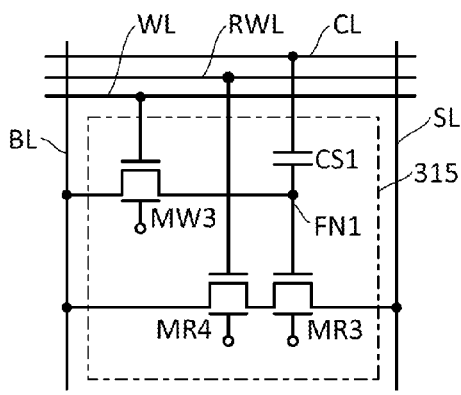

The transistors MR1, MR2, and MW1 can be OS transistors. In this case, one or more of the transistors MR1, MR2, and MW1 may be provided with back gates. A memory cell including three OS transistors including back gates is illustrated in FIG. 9F as an example. A memory cell 315 illustrated in FIG. 9F includes transistors MR3, MR4, and MW3, the capacitor CS1 and the node FN1. To the back gates of the transistors MR3, MR4, and MW3, the same signal may be input or different signals may be input.

<Decoder>

Figure 10:
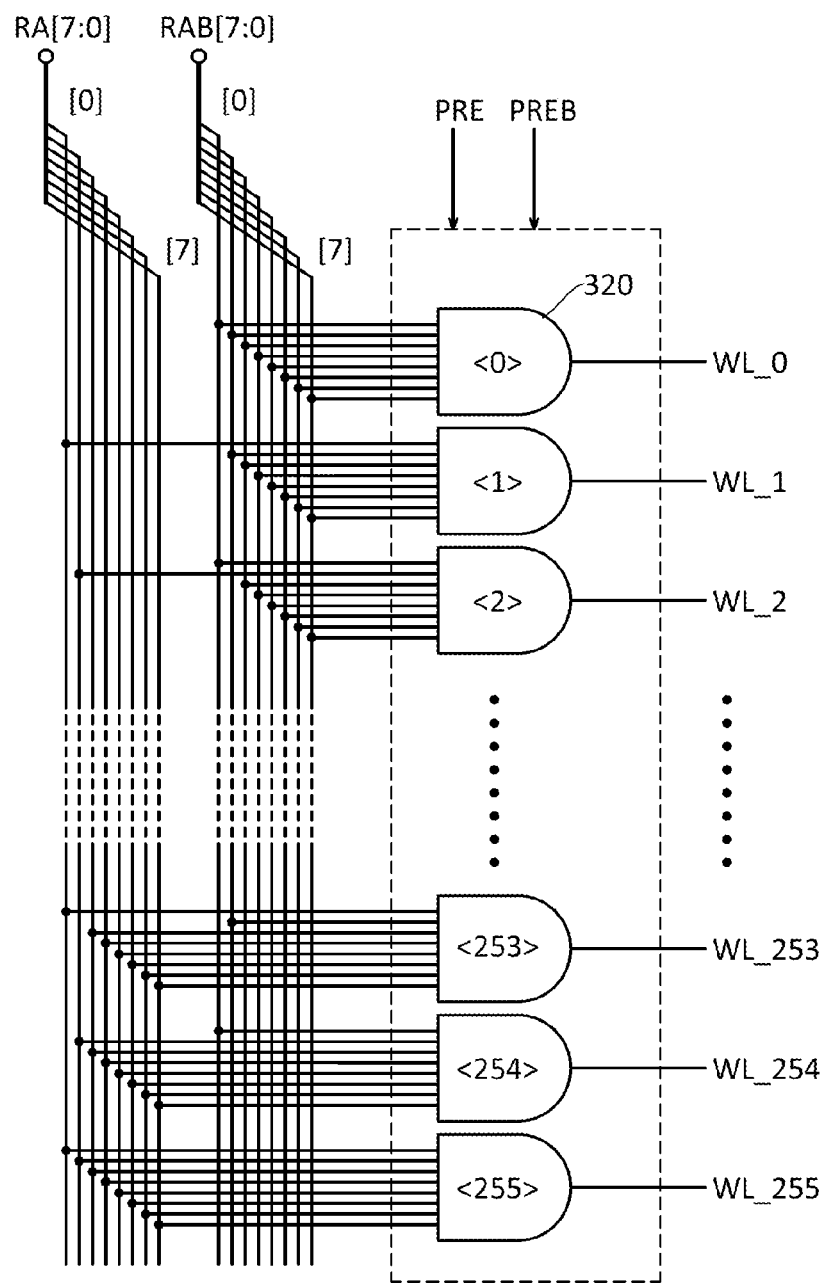
FIG. 10 is a circuit diagram showing a configuration example of a row decoder.

FIG. 10 shows a configuration example of the row decoder 302. Here, the signals RA are 8-bit signals. To the row decoder 302, the signals RA [7:0], RAB [7:0], PRE, and PREB are input. The signal RAB is an inversion signal of the signal RA. An example in which the signal RAB is input from the outside of the memory device 300 is shown; however, the signal RAB may be generated from the signal RA in the memory device 300, for example, in the control circuit 306 or the row decoder 302.

Figure 11:
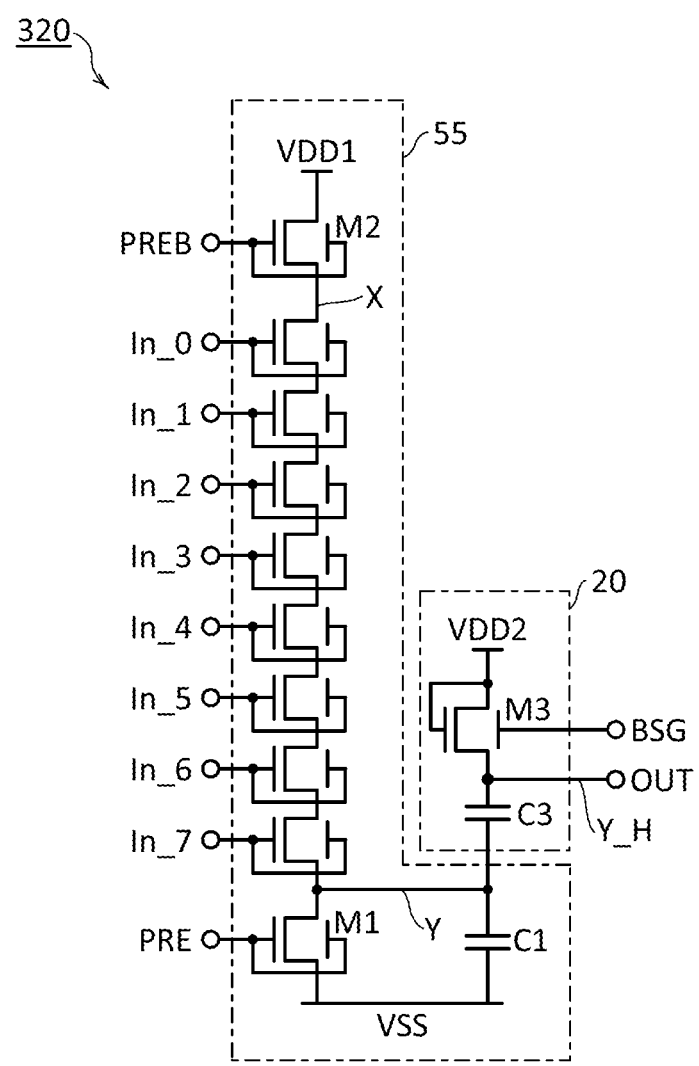
FIG. 11 is a circuit diagram showing a configuration example of an AND circuit.

The row decoder 302 includes 256 AND circuits 320 (hereinafter referred to as "AND 320"), and can select any of 256 wirings WL_0 to WL_255. The AND 320 is an eight-input logic circuit. FIG. 11 shows a configuration example of the AND 320.

The AND 320, a dynamic logic circuit including transistors of the same conductivity type, includes the circuit 20 and a dynamic logic circuit 55. Input signals In_j (j is an integer from 0 to 7) are the signal RA [j] or the signal RAB [j]. The signal OUT is output to the wiring WL in the corresponding row. For example, a wiring WL_1 is electrically connected to an output node of an AND 320 <1>. A signal RA[0] and signals RAB [7:1] are input to the AND 320 <1>. When the signals RA [7:0] are "00000001", the logical condition of the AND 320 <1> only becomes true, so that a selection signal at "H" is output to the wiring WL_1.

Each of the transistors in the dynamic logic circuit 55 includes a back gate that is electrically connected with a gate. For this reason, the dynamic logic circuit 55 can operate at high speed with low power consumption. In addition, the AND 320 has high drive capability because it is provided with the circuit 20. Even if the transistor MW1 of the memory cell 310 is a transistor having a high threshold voltage, such as an OS transistor, a voltage higher than the threshold voltage can be input to the gate of the transistor MW1 by using the AND 320. Furthermore, since the circuit 20 can control the voltage of the signal OUT, the range of the acceptable characteristics of the write transistor of the memory cell 309 is widened.

The row decoder 302 is formed using dynamic logic circuits including transistors of the same conductivity type; thus, a large number of wirings WL can be driven with a small number of transistors. As a result, the capacity of the memory cell array 301 can be easily increased.

Furthermore, since the memory cell array 301 and the row decoder 302 can include transistors of the same conductivity type, the memory cell array 301 and the row decoder 302 can include only OS transistors. In this case, the memory cell array 301 and the row decoder 302 are formed on the same substrate through the same process, whereby a chip where they are integrated can be formed. In addition, the column decoder 303 can have a circuit configuration similar to that of the row decoder 302. Therefore, circuits including the OS transistors offer a chip where the memory cell array 301, the row decoder 302, and the column decoder 303 are integrated.

Device structure examples of the memory device 300 are described below with reference to FIG. 12, FIG. 13, FIG. 14, and FIG. 15.

Device Structure Example 1

Figure 12:
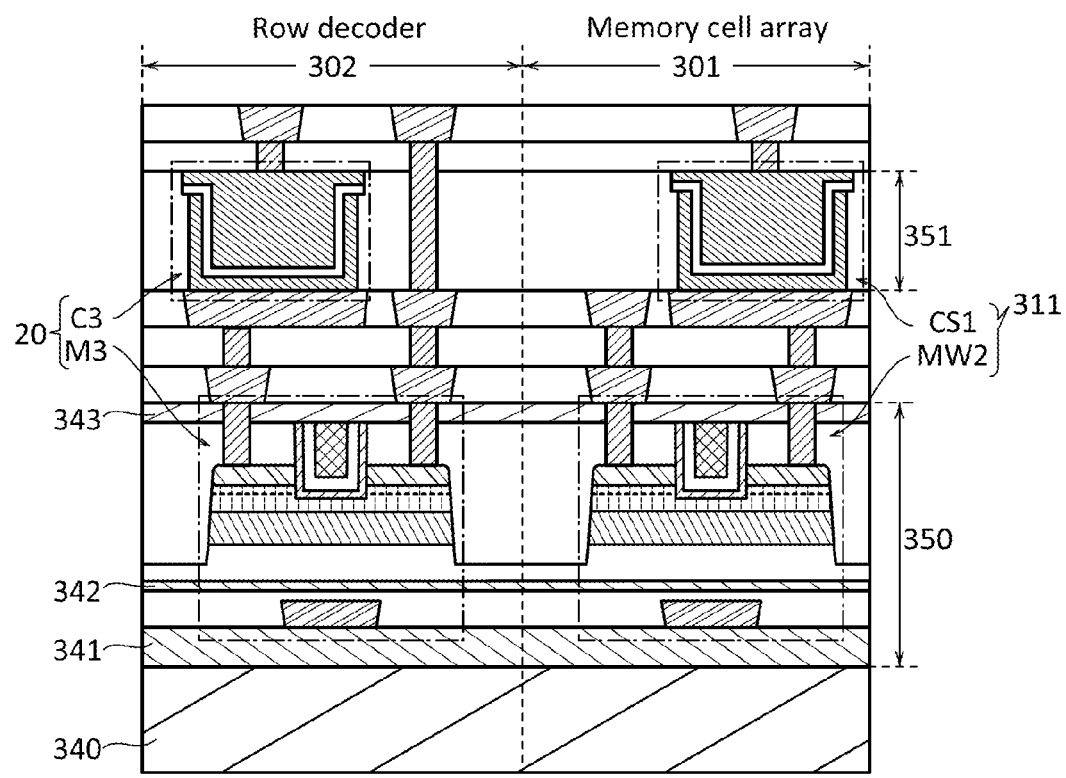
FIG. 12 is a cross-sectional view illustrating a configuration example of a memory device.

FIG. 12 shows an example of a device structure of the row decoder 302 and the memory cell array 301. Here, the memory cell array 301 includes the memory cells 311. As the row decoder 302, the circuit 20 (the transistor M3 and the capacitor C3) of the AND 320 is illustrated as a typical example. FIG. 12 corresponds to a cross-sectional view of a chip including a circuit formed using OS transistors in electronic components of the memory device 300.

In FIG. 12, regions where reference numerals and hatching patterns are not given show regions formed of an insulator. In these regions, an insulator containing one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, an organic resin such as a polyimide resin, a polyamide resin, an acrylic resin, a siloxane resin, an epoxy resin, or a phenol resin can be used. Layers expressed as 341 to 343 are insulator layers. The insulator layers 341 to 343 can be formed of the above insulators.

In FIG. 12, regions where hatching patterns are given but reference numerals are not given are each formed of a conductor in FIG. 12. A region formed of a conductor has a single-layer structure or a layered structure including two or more layers. Examples of a conductive material include low-resistance metals such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co); an alloy mainly containing one or more of these metals; and a compound mainly containing one or more of these metals. It is particularly preferable to use a high-melting-point material that has both heat resistance and conductivity, such as tungsten or molybdenum. In addition, a heat-resistant conductive material containing aluminum, copper, or the like is preferably used. For example, a Cu—Mn alloy is preferably used because manganese oxide formed at the interface with an insulator containing oxygen has a function of suppressing Cu diffusion.

A sputtering method and a plasma CVD method are typical examples of a method of forming an insulating film, a conductive film, a semiconductor film, and the like included in a circuit. The insulating film, the conductive film, the semiconductor film, and the like can be formed by another method, for example, a thermal CVD method. A metal organic chemical vapor deposition (MOCVD) method or an atomic layer deposition (ALD) method can be employed as a thermal CVD method, for example.

The memory cell array 301 and the row decoder 302 are formed over a substrate 340. Here, the substrate 340 is a single crystal silicon wafer. The substrate 340 is not limited thereto, and a substrate similar to a substrate 510 in Embodiment 4 can be used.

A layer (a layer 350) which includes an OS transistor is over the insulator 341, and a layer (a layer 351) in which a capacitor is formed is over the layer 350. Thus, a transistor of the decoder (only the transistor M3 is illustrated) and the transistor MW2 of the memory cell 311 are formed in the layer 350. Here, an OS transistor formed in the layer 350 has a device structure which is similar to that of the transistor 500 (Embodiment 4, FIG. 30), and the structure is suitable for miniaturization.

Miniaturization of the transistor M3 can increase the frequency characteristics of the transistor M3. The same applies to other transistors of the row decoder 302 and the transistor MW2 of the memory cell 311. Therefore, power consumption of the row decoder 302 can be reduced and the operation speed thereof can be improved. The reading and writing speed of the memory cell 311 can be improved and the integration degree of the memory cell array 301 can be increased.

Device Structure Example 2

Figure 13:
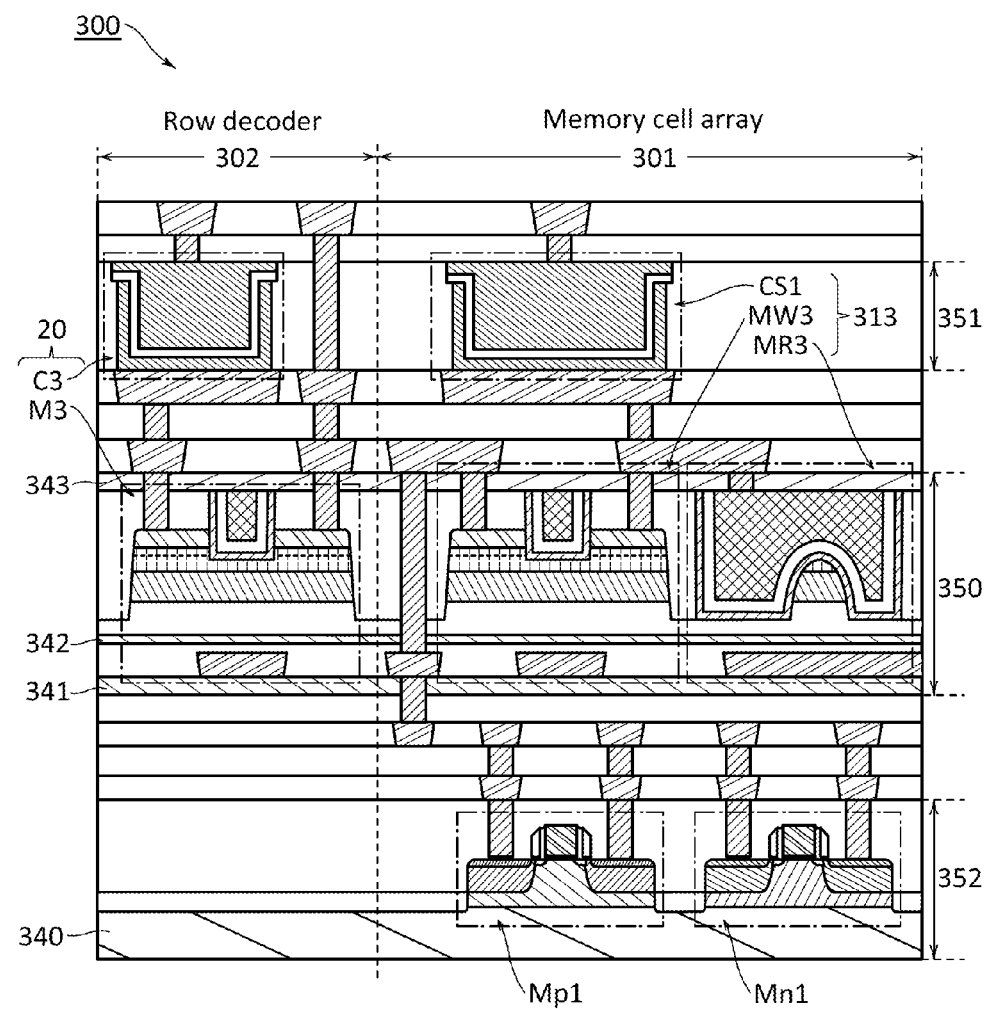
FIG. 13 is a cross-sectional view illustrating a configuration example of a memory device.

FIG. 13 is a cross-sectional view showing a device structure example of the memory device 300. In this example, a layer (a layer 352) in which a Si transistor is formed is provided under the layer 350. A Si transistor of the memory device 300 is provided in the layer 352. Here, the Si transistor is a FIN-type transistor. A transistor Mn1 is an n-channel Si transistor, and a transistor Mp1 is a p-channel Si transistor. Here, the transistors Mn1 and Mp1 are FIN-type transistors.

When the memory device 300 has such a device structure, a circuit formed using a Si transistor can be provided under the memory cell array 301, for example. As a circuit provided under the memory cell array 301, a sense amplifier is preferable, for example. In the case where a sense amplifier is provided in a lower layer of the memory cell array 301, a wiring BL (a local bit line) can be shortened. In this case, the transistors Mn1 and Mp1 are included in the sense amplifier.

The memory cell array 301 is formed with the memory cells 313 (FIG. 9D). FIG. 13 illustrates a cross-sectional structure of the transistor MW3 in the channel-length direction and a cross-sectional structure of the transistor MR3 in the channel width direction.

Device Structure Example 3

Figure 14:
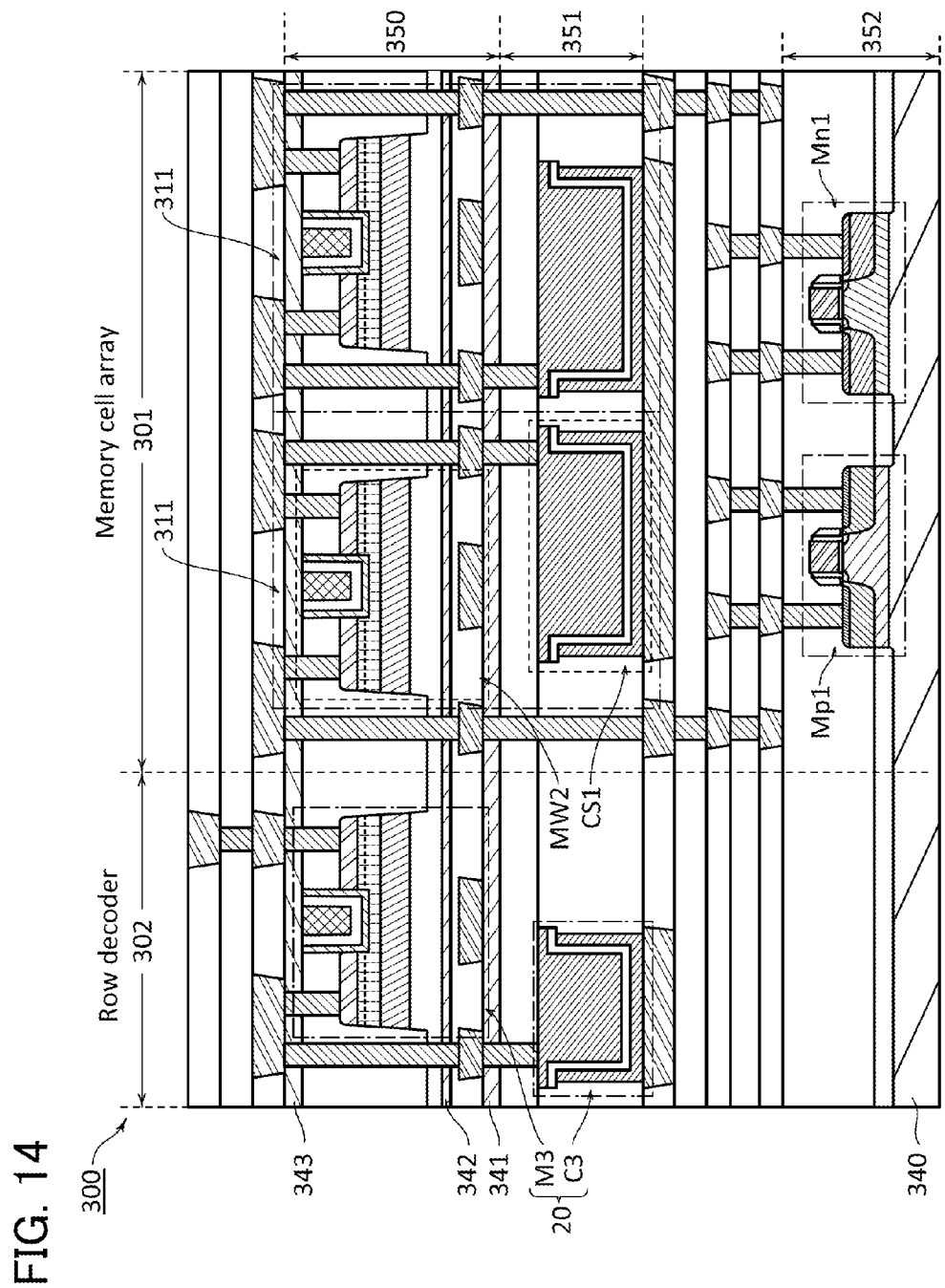
FIG. 14 is a cross-sectional view illustrating a configuration example of a memory device.

FIG. 14 is a cross-sectional view illustrating a structure example of the memory device 300. In this example, the layer 351 is stacked over the layer 352, and the layer 350 is stacked over the layer 351. The memory cell array 301 is formed using the memory cells 311.

Device Structure Example 4

Although the OS transistor of the memory device 300 has a similar device structure to that of the transistor 500 and the Si transistor is a FIN-type transistor in the above examples, the device structures of the OS transistor and the Si transistor included in the memory device 300 are not limited to the above examples. For example, the OS transistor can be a transistor having a device structure similar to that of a transistor 502 (FIGS. 32A to 32D). Furthermore, the Si transistor can be a planar-type transistor. Such an example is shown in FIG. 15.

Figure 15:
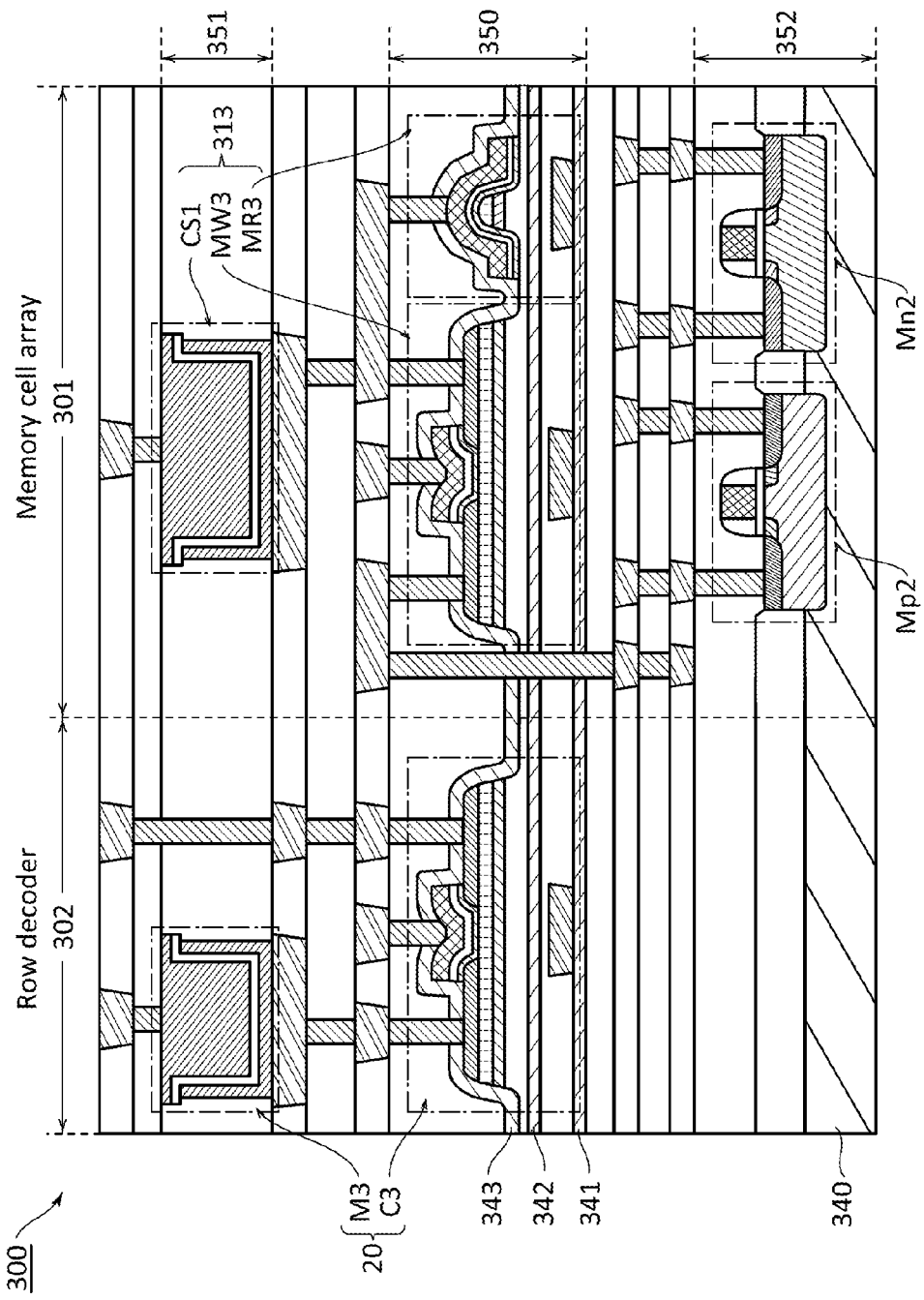
FIG. 15 is a cross-sectional view illustrating a configuration example of a memory device.

In the example in FIG. 15, the layer 350 is stacked over the layer 352, and the layer 351 is stacked over the layer 350. The memory cell array 301 is formed using the memory cells 313. Here, a transistor Mn2 and a transistor Mp2 are an n-channel Si transistor and a p-channel Si transistor, respectively. FIG. 15 illustrates a cross-sectional structure of the transistor MW3 in the channel length direction and a cross-sectional structure of the transistor MR3 in the channel width direction.

<<Imaging Device>>

Figure 16A:
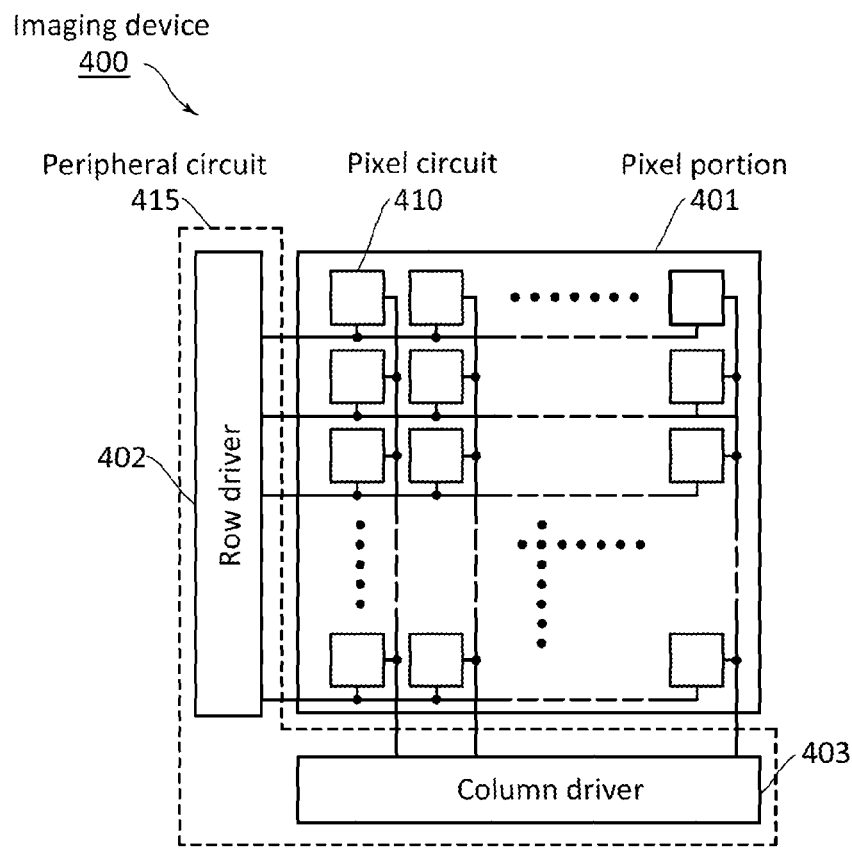
FIG. 16A is a block diagram showing a configuration example of an imaging device.
Figure 16B:
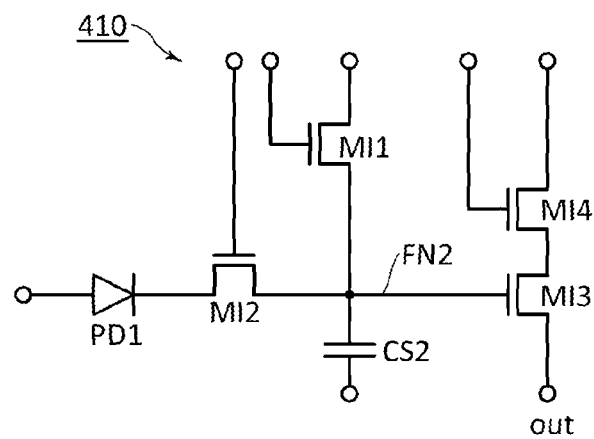
FIG. 16B is a circuit diagram showing a configuration example of a pixel.

FIG. 16A illustrates a configuration example of an imaging device. An imaging device 400 in FIG. 16A includes a pixel portion 401 and a peripheral circuit 415. The peripheral circuit 415 includes a row driver 402 and a column driver 403. The pixel portion 401 includes a plurality of pixel circuits 410 arranged in array. The pixel circuit 410 is an image sensor, and has a function of converting light into electric charge, a function of accumulating electric charge, and the like. FIG. 16B shows an example of the pixel circuit 410.

The pixel circuit 410 in FIG. 16B includes a photodiode PD1, transistors MI1 to MI4, a capacitor C2, and a node FN2. The node FN2 serves as a data holding node. The capacitor C2 is a storage capacitor for holding the voltage of the node FN2. The transistor MI1 is referred to as a reset transistor. The transistor MI1 has a function of resetting the voltage of the node FN2. The transistor MI2 is referred to as an exposure transistor that controls an exposure operation. The transistor MI2 is a pass transistor that controls a conduction state between the node FN2 and the photodiode PD1. With the transistor MI2, the exposure operation timing can be controlled; thus, an image can be taken by a global shutter method. The transistor MI3 is referred to as an amplifier transistor. The transistor MI3 has a function of generating on-state current corresponding to the voltage of the node FN2. The transistor MI4 is referred to as a selection transistor. The transistor MI4 is a pass transistor that controls a conduction state between the transistor MI3 and an output terminal of the pixel circuit 410.

A diode element formed using a silicon substrate with a pn junction or a pin junction can be used as the photodiode PD1. Alternatively, a pin diode element formed using an amorphous silicon film, a microcrystalline silicon film, or the like may be used. Another photoelectric conversion element may be used instead of the photodiode in the pixel circuit 410. For example, a diode-connected transistor may be used. Alternatively, a variable resistor or the like utilizing a photoelectric effect may be formed using silicon, germanium, selenium, or the like. Alternatively, a photoelectric conversion element that includes selenium utilizing a phenomenon called avalanche multiplication may be used. In the photoelectric conversion element, a highly sensitive sensor in which the amount of amplification of electrons with respect to the amount of incident light is large can be obtained. Amorphous selenium or crystalline selenium can be used as a selenium-based material. Crystalline selenium may be obtained by, for example, depositing amorphous selenium and then performing heat treatment. When the crystal grain size of crystalline selenium is smaller than a pixel pitch, variation in characteristics between pixels can be reduced.

The row driver 402 has a function of selecting the pixel circuit 410 from which a signal is read out. In the case of the pixel circuit 410 in FIG. 16B, the row driver 402 may generate a signal to be input to a gate of the transistor MI4. The column driver 403 has a function of reading out a signal from the pixel circuit 410 and generating an imaging data signal. The row driver 402 and the column driver 403 can include various logic circuits such as a decoder and a shift register. The decoder has a circuit configuration similar to that of the row decoder 302 (FIG. 10). Furthermore, as a basic logic element of each of the row driver 402 and the column driver 403, the dynamic logic circuit in Embodiments 1 and 2 can be used. The column driver 403 may be provided with a functional circuit that processes a signal read out from the pixel circuit 410. Examples of the functional circuit include an analog-digital converter circuit and a circuit that performs difference processing.

Figure 17:
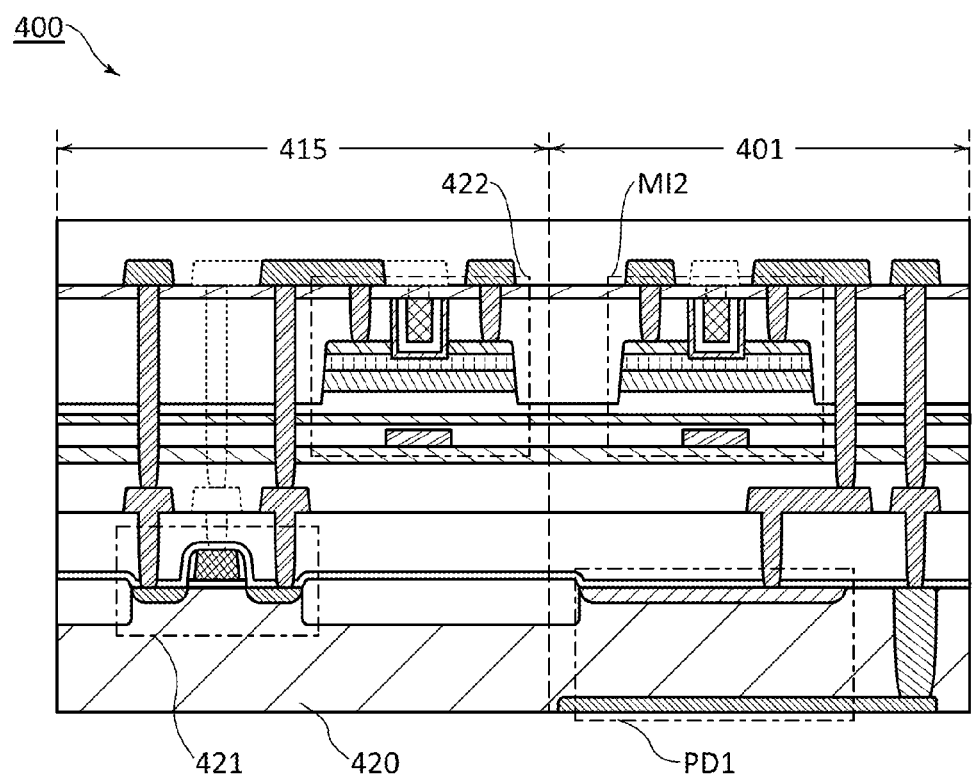
FIG. 17 is a cross-sectional view illustrating a configuration example of an imaging device.

OS transistors can be used as the transistors MI1 to MI4 of the pixel circuit 410. In this case, OS transistors may be used in the dynamic logic circuit provided in the row driver 402 and/or the column driver 403 as well as in the pixel portion 401. FIG. 17 shows an example of a structure of the imaging device 400. FIG. 17 shows an example in which an OS transistor and a Si transistor are combined. In the peripheral circuit 415, typically, a Si transistor 421 and an OS transistor 422 are shown. In the pixel portion 401, the photodiode PD1 and the transistor MI2 are particularly shown. The Si transistor 421 and the photodiode PD1 are formed using a semiconductor substrate 420. Since the transistors MI1 to MI4 can be stacked over the photodiode PD1, the integration degree of the pixel portion 401 can be increased.

<<Display Device>>

Figure 18:
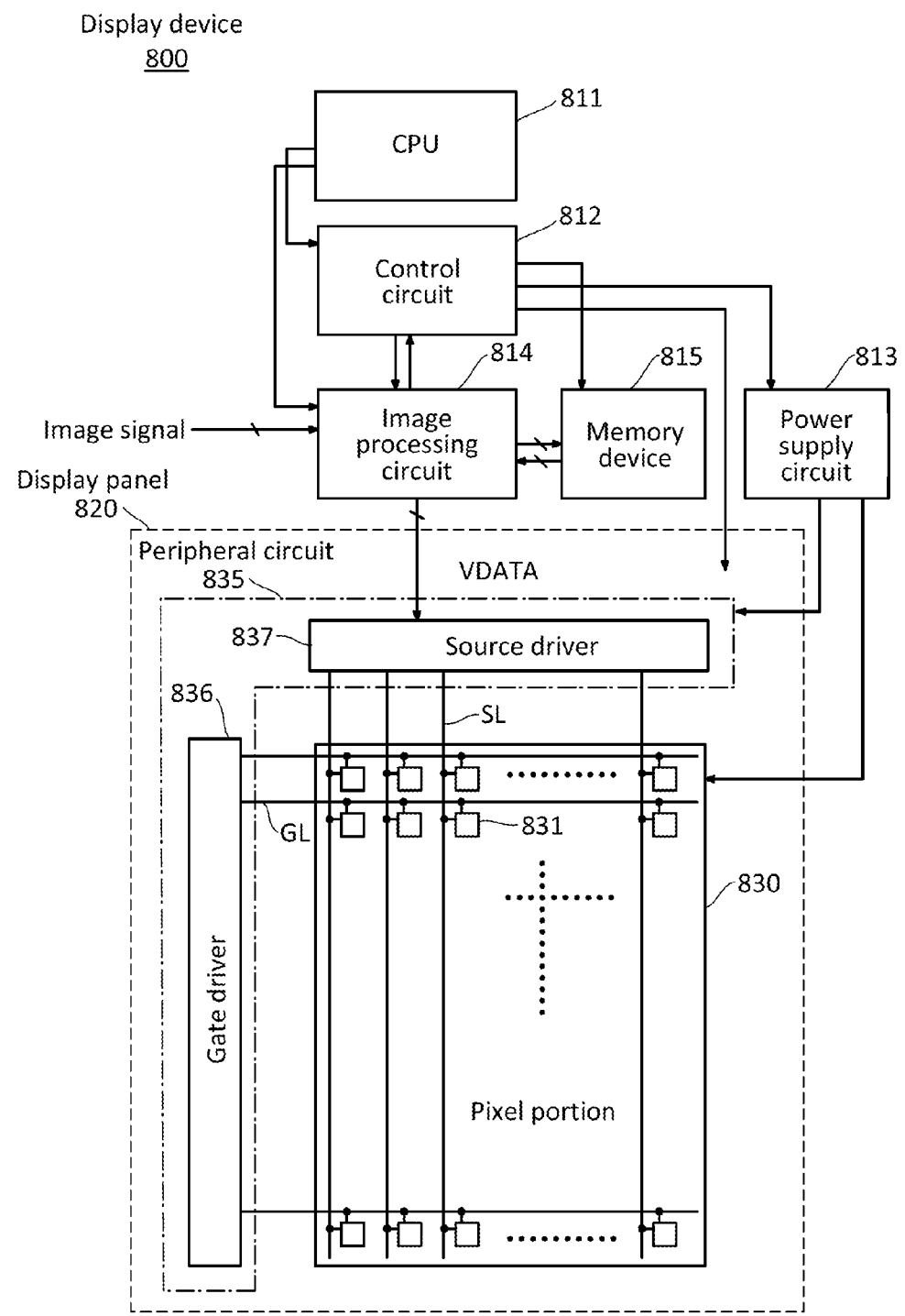
FIG. 18 is a block diagram showing a configuration example of a display device.

FIG. 18 shows a configuration example of the display device. The display device 800 in FIG. 18 includes a CPU 811, a control circuit 812, a power supply circuit 813, an image processing circuit 814, a memory device 815, and a display panel 820. The display panel 820 includes a pixel portion 830 and a peripheral circuit 835. The peripheral circuit 835 includes a gate driver 836 and a source driver 837. The gate driver 836 is a circuit for driving a wiring GL and has a function of generating a signal supplied to the wiring GL. The source driver 837 is a circuit for driving a wiring SL and has a function of generating a signal supplied to the wiring SL.

The CPU 811 is a circuit for executing an instruction and controlling the display device 800 collectively. The CPU 811 executes an instruction input from the outside and an instruction stored in an internal memory. The CPU 811 generates signals for controlling the control circuit 812 and the image processing circuit 814. On the basis of a control signal from the CPU 811, the control circuit 812 controls the operation of the display device 800. The control circuit 812 controls the peripheral circuit 835, the power supply circuit 813, the image processing circuit 814, and the memory device 815 so that the process determined by the CPU 811 is executed. To the control circuit 812, for example, a variety of synchronization signals which determine timing of updating the screen are input. Examples of the synchronization signals include a horizontal synchronization signal, a vertical synchronization signal, and a reference clock signal. The control circuit 812 generates control signals of the peripheral circuit 835 from these signals. The power supply circuit 813 has a function of supplying power supply voltage to the pixel portion 830 and the peripheral circuit 835.

The image processing circuit 814 has a function of processing an image signal input from the outside and generating a data signal VDATA. The source driver 837 has a function of processing the data signal VDATA and generating a data signal supplied to each wiring SL. The memory device 815 is provided to store data needed for performing processing in the image processing circuit 814. The data signal VDATA or a video signal input from the outside is stored in the memory device 815, for example.

Figure 19A:
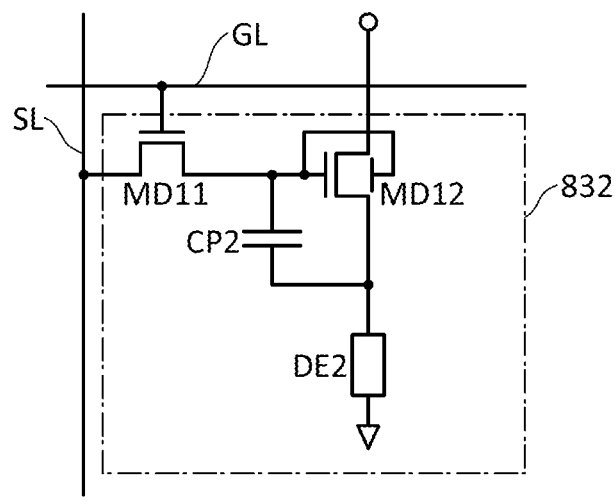
FIGS. 19A and 19B are circuit diagrams each showing a configuration example of a pixel.
Figure 19B:
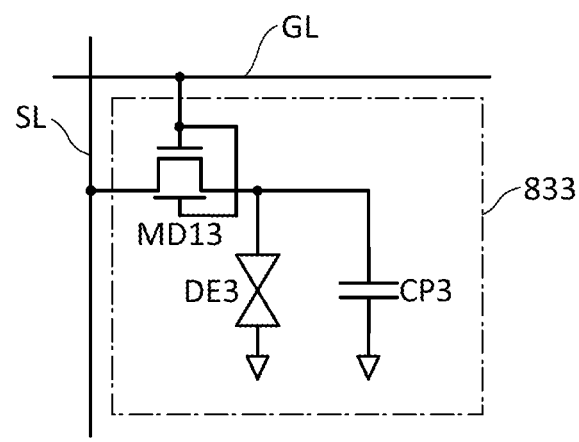

The pixel portion 830 includes a plurality of pixels 831, a plurality of wirings GL, and a plurality of wirings SL. The plurality of pixels 831 are arranged in array. The plurality of wirings GL and SL are provided in accordance with the arrangement of the plurality of pixels 831. The wirings GL are arranged in a vertical direction, and the wirings SL are arranged in a horizontal direction. The wiring GL is also referred to as a gate line, a scan line, a selection signal line, or the like. The wiring SL is also referred to as a source line, a data line, or the like. FIGS. 19A and 19B show circuit configuration examples of the pixel 831. FIG. 19A shows a configuration example of the pixel 832 in the case where the display device 800 is an EL display device. FIG. 19B shows a configuration example of the pixel 833 in the case where the display device 800 is a liquid crystal display device.

(Pixel of EL Display Device)

A pixel 832 in FIG. 19A includes transistors MD11 and MD12, an EL element DE2, and a capacitor CP2. Here, the transistors MD11 and MD12 are n-channel transistors. The transistor MD11 is a pass transistor that controls a conduction state between a gate of the transistor MD12 and the wiring SL, and is referred to as a selection transistor. The transistor MD12 is referred to as a driving transistor, and serves as a source that supplies current or voltage to the EL element DE2. Here, in order to improve the current drive capability, the transistor MD12 is provided with a back gate. The transistor MD11 may also be provided with a back gate electrically connected to a gate electrode. The capacitor CP2 is a storage capacitor for holding the gate potential of the transistor MD12.

The EL element DE2 is a light-emitting element including an anode, a cathode, and a light-emitting layer provided therebetween. The light-emitting layer includes an organic compound. One of the anode and the cathode serves as a pixel electrode, and the pixel electrode is electrically connected to the transistor M2. The light-emitting layer of the EL element DE2 contains at least a light-emitting substance. Examples of the light-emitting substance include organic EL materials, inorganic EL materials, and the like. Light emission from the light-emitting layer includes light emission (fluorescence) which is generated in returning from a singlet excited state to a ground state and light emission (phosphorescence) which is generated in returning from a triplet excited state to a ground state.

(Pixel in Liquid Crystal Display Device)

The pixel 833 in FIG. 19B includes a transistor MD13, a liquid crystal element DE3, and a capacitor CP3. The liquid crystal element DE3 includes a pixel electrode, a counter electrode, and a liquid crystal layer provided therebetween. The pixel electrode is connected to the transistor MD13. Here, the transistor MD13 is an n-channel transistor. In addition, the transistor MD13 includes a back gate that is electrically connected to a gate. This can increase the current drive capability of the transistor MD13. The transistor MD13 does not necessarily have a back gate.

For the liquid crystal layer, a liquid crystal material classified into a thermotropic liquid crystal or a lyotropic liquid crystal can be used, for example. As another example of a liquid crystal material used for the liquid crystal layer, the following can be given: a nematic liquid crystal, a smectic liquid crystal, a cholesteric liquid crystal, or a discotic liquid crystal. Further alternatively, a liquid crystal material categorized by a ferroelectric liquid crystal or an anti-ferroelectric liquid crystal can be used. Further alternatively, a liquid crystal material categorized by a high-molecular liquid crystal such as a main-chain high-molecular liquid crystal, a side-chain high-molecular liquid crystal, or a composite-type high-molecular liquid crystal, or a low-molecular liquid crystal can be used. Further alternatively, a liquid crystal material categorized by a polymer dispersed liquid crystal (PDLC) can be used.

There is no limitation on a driving mode of the liquid crystal device. A device structure of the pixel portion 830 is determined in accordance with a driving mode. A pixel can be driven in any of the following driving modes: a twisted nematic (TN) mode; a fringe field switching (FFS) mode; a super twisted nematic (STN) mode; a vertical alignment (VA) mode; a multi-domain vertical alignment (MVA) mode; an in-plane-switching (IPS) mode; an optically compensated birefringence (OCB) mode; a blue phase mode; a transverse bend alignment (TBA) mode; a VA-IPS mode; an electrically controlled birefringence (ECB) mode; a ferroelectric liquid crystal (FLC) mode; an anti-ferroelectric liquid crystal (AFLC) mode; a polymer dispersed liquid crystal (PDLC) mode; a polymer network liquid crystal (PNLC) mode; a guest-host mode; an advanced super view (ASV) mode; and the like.

Note that the circuit configuration of a pixel is not limited to those in FIGS. 19A and 19B. For example, a switch, a resistor, a capacitor, a sensor, a transistor, a logic circuit, or the like may be added to the pixel 832. The same applies to the pixel 833.

Here, a display element used for the pixel 831 is not limited to an EL element or a liquid crystal element. Examples of the display element include a light-emitting transistor (a transistor which emits light in accordance with current), an electron emission element, electronic ink, an electrophoretic element, a grating light valve (GLV), a display element including micro electro mechanical systems (MEMS), a digital micromirror device (DMD), a digital micro shutter (DMS), an interferometric modulator display (IMOD) element, a MEMS shutter display element, an optical interference type MEMS display element, an electrowetting element, a piezoelectric ceramic element (e.g., a piezoelectric actuator), and a field emission element (e.g., a carbon nanotube).

For example, in the pixel 833 in FIG. 19B, when the liquid crystal element DE3 is replaced with a display element that controls a gray level by an electronic ink method, an electronic liquid powder (registered trademark) method, or the like, the display device 800 can be used as electronic paper.

<Display Panel>

Figure 20:
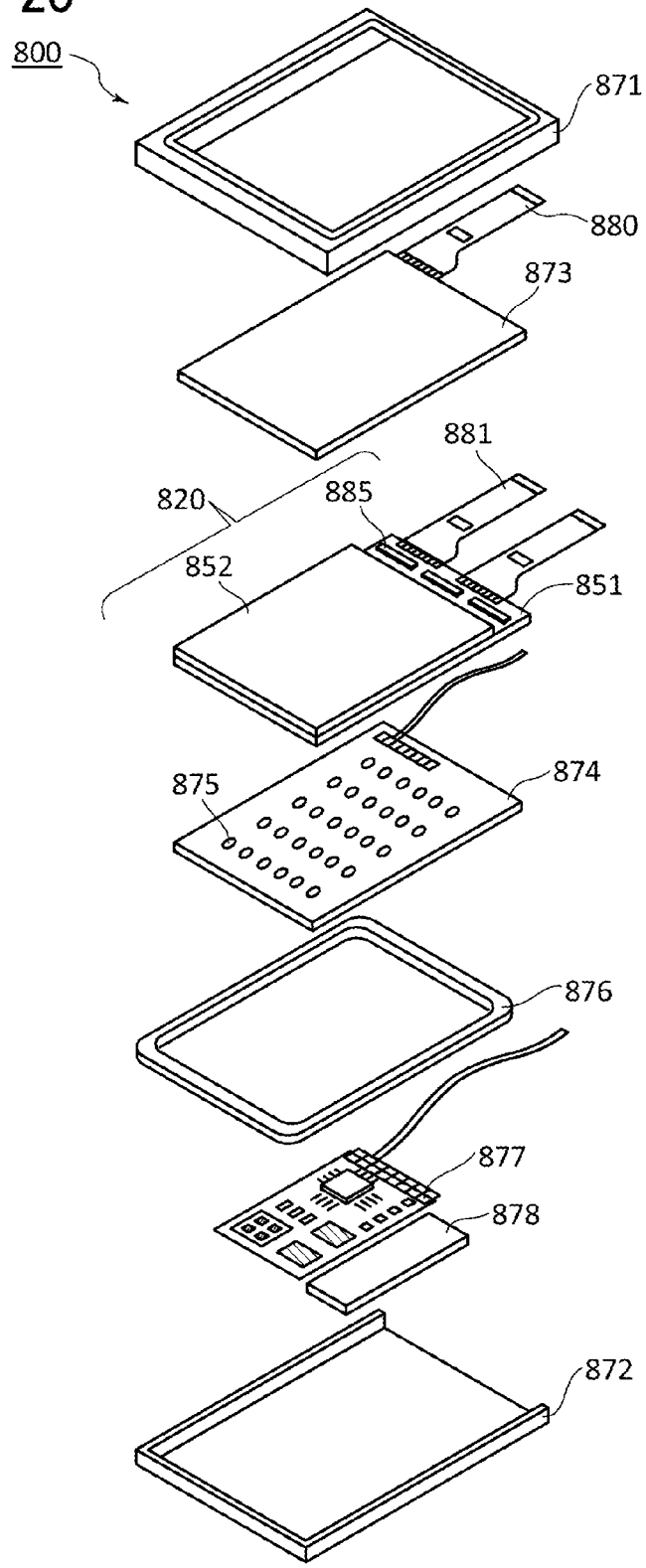
FIG. 20 is an exploded perspective view illustrating a configuration example of a display device.

FIG. 20 is an exploded perspective view of the display device 800. The display device 800 includes, between an upper cover 871 and a lower cover 872, a touch panel unit 873, a display panel 820, a backlight unit 874, a frame 876, a printed board 877, and a battery 878. The shapes and sizes of the upper cover 871 and the lower cover 872 can be changed as appropriate in accordance with the sizes of the touch panel unit 873 and the display panel 820. The frame 876 protects the display panel 820 and the touch panel unit 873 and also functions as an electromagnetic shield for blocking electromagnetic waves generated by the operation of the printed board 877. The frame 876 may function as a radiator plate.

An FPC 880 and an FPC 881 are electrically connected to the touch panel unit 873 and the display panel 820, respectively. The backlight unit 874 includes a light source 875. In FIG. 20, a plurality of light sources 875 are two-dimensionally arranged; however, the arrangement of the light sources 875 is not limited thereto. For example, a structure in which a light source 875 is provided at an end portion of the backlight unit 874 and a light diffusion plate is further provided may be employed. Note that the touch panel unit 873, the backlight unit 874, the battery 878, and the like are not provided in some cases.

The printed board 877 includes the CPU 811, the power supply circuit 813, the image processing circuit 814, and the memory device 815. As a power source for supplying electric power to the power supply circuit 813, an external commercial power source or a power source using the battery 878 separately provided may be used. The battery 878 can be omitted in the case of using a commercial power source. The display device 800 may be additionally provided with a member such as a polarizing plate, a retardation plate, or a prism sheet. As the memory device 815 or a memory device in the CPU 811, the memory device 300 in FIG. 8 can be used.

The touch panel unit 873 can be a resistive touch panel or a capacitive touch panel and can be formed to overlap with the display panel 820. A counter substrate (sealing substrate) of the display panel 820 can have a touch panel function. A photosensor may be provided in each pixel of the display panel 820 to form an optical touch panel. An electrode for a touch sensor may be provided in each pixel of the display panel 820 so that a capacitive touch panel is obtained.

The display panel 820 in FIG. 20 includes a substrate 851 and a substrate 852. The substrate 851 is provided with the pixel portion 830 and the peripheral circuit 835. The substrate 851 provided with a circuit such as the pixel portion 830 is referred to as an element substrate (backplane) in some cases. The substrate 852 or the substrate 852 provided with components may be referred to as a counter substrate. Part or all of the peripheral circuit 835 may be provided for the substrate 851 in the same manufacturing process as the pixel portion 830. In the example shown in FIG. 20, part of the peripheral circuit 835 is provided in an IC 855. The IC 855 is mounted on the substrate 851 by a chip on glass (COG) method.

<Display Panel>

Figure 21A:
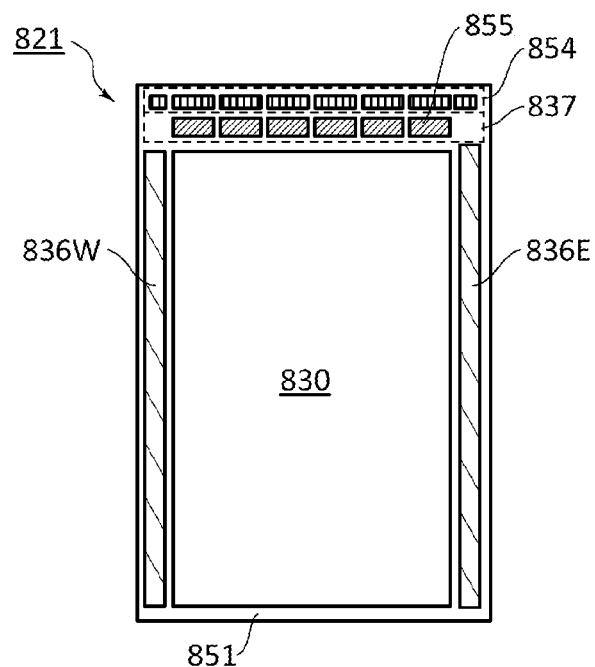
FIGS. 21A and 21B are plan views each illustrating a configuration example of an element substrate of a display panel.
Figure 21B:
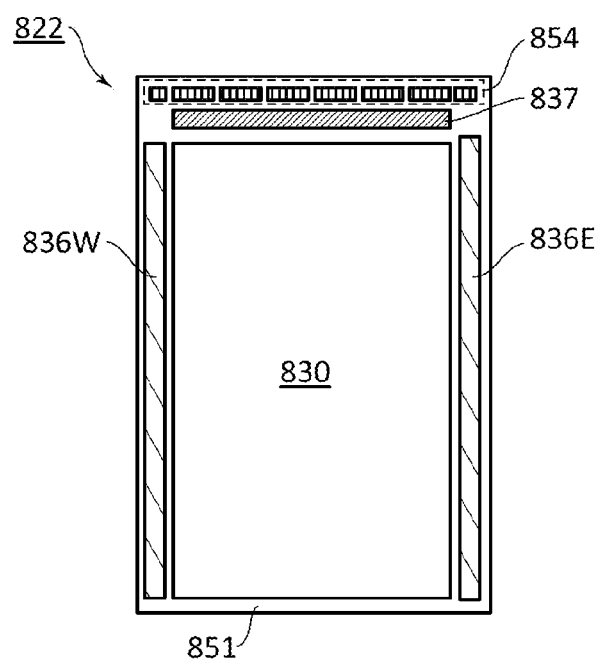

FIGS. 21A and 21B are plan views illustrating structure examples of an element substrate of the display panel 820. In the case where the pixel portion 830 includes transistors of the same conductivity type, part of the peripheral circuit 835 that includes transistors of the same conductivity type may be provided over the substrate 851 together with the pixel portion 830.

In an element substrate 821 illustrated in FIG. 21A, the gate driver 836 is formed over the substrate 851 in the same process as the pixel portion 830, and the source driver 837 includes a plurality of ICs 855. A terminal portion 853 includes extraction terminals of the FPC 881, the pixel portion 830, and the peripheral circuit 835. The FPC 881 is electrically connected to the terminal portion 853. In an element substrate 822 illustrated in FIG. 21B, the source driver 837 is also formed over the substrate 851 in the same process as the pixel portion 830.

The gate driver 836 is divided into two circuits 836E and 836W, and these circuits are provided on the left and right of the pixel portion 830. For example, the wirings GL in the odd-numbered rows are electrically connected to the circuit 836E, and the wirings GL in the even-numbered rows are electrically connected to the circuit 836W. In this case, the GDL and the GDR drive the wirings GL alternately. The gate driver 836 can have a circuit configuration similar to that of the row decoder 302 in FIG. 10. Accordingly, power for driving the pixel portion 830 including OS transistors having a high threshold voltage can be reduced. In addition, the gate driver 836 can be reduced in size; thus, the display panel 820 having a narrow frame can be provided. Thus, an electronic device incorporating the display device 800 can be reduced in power consumption, size, and weight.

<Device Structure>

Figure 22A:
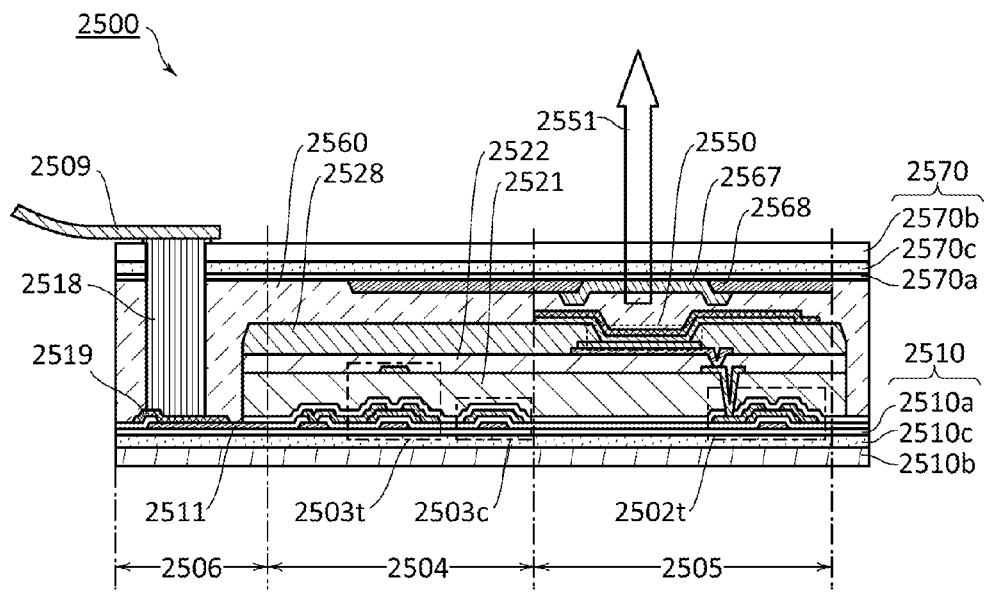
FIGS. 22A and 22B are cross-sectional views each illustrating a configuration example of a display device.
Figure 22B:
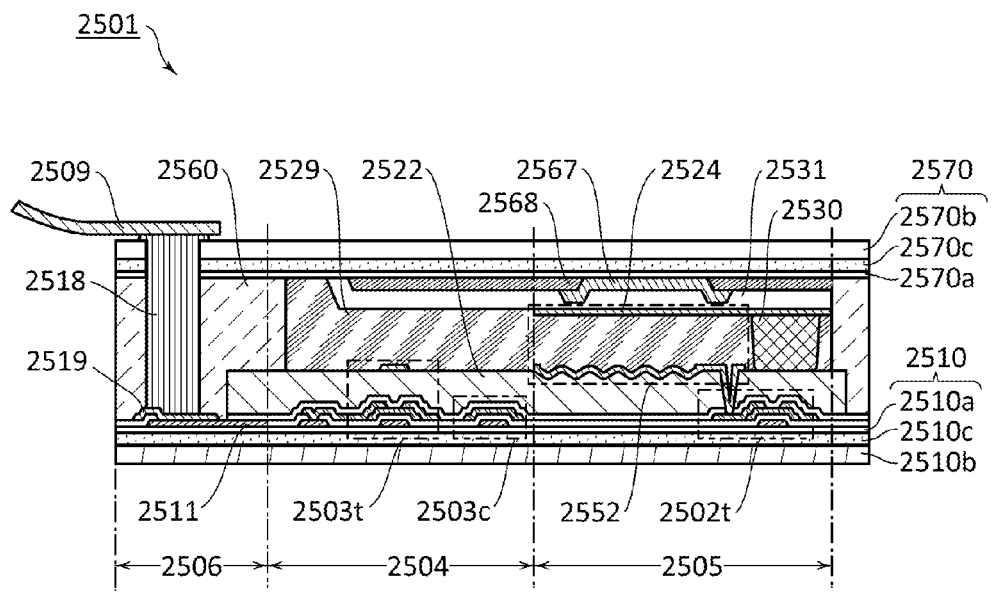

FIG. 22A shows a device structure example of a display panel 2500 of an EL display device, and FIG. 22B shows a device structure example of a display panel 2501 of a liquid crystal display device. Note that FIGS. 22A and 22B each are not a cross-sectional view of a given position in the display panel but a cross-sectional view for illustrating a layered structure of the display panel, a connection structure of elements, and the like.

(EL Display Device)

The display panel 2500 shown in FIG. 22A includes a pixel portion 2505, a gate driver 2504, and a terminal portion 2506. The pixel portion 2505 includes a transistor 2502$t$, an EL element 2550, a coloring layer 2567, and a light-blocking layer 2568. The EL element 2550 includes a lower electrode, an upper electrode, and an EL layer between the lower electrode and the upper electrode. Light 2551 emitted from the EL element 2550 is extracted to the outside through the coloring layer 2567.

The coloring layer 2567 is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

Insulating layers 2521 and 2522 are provided in the display panel 2500. The insulating layers 2521 and 2522 cover the transistor 2502$t$ and the like. The insulating layers 2521 and 2522 cover unevenness caused by the transistor 2502$t$ and the like to provide a flat surface. The insulating layer 2521 may serve also as a layer for preventing diffusion of impurities. This can prevent a reduction in the reliability of the transistor 2502$t$ or the like due to diffusion of impurities. The EL element 2550 is formed above the insulating layer 2522. A partition 2528 is provided so as to cover end portions of the lower electrode in the EL element 2550. Note that a spacer for controlling the distance between the substrate 2510 and the substrate 2570 may be provided over the partition 2528.

The gate driver 2504 includes a transistor 2503$t$ and a capacitor 2503$c$. The gate driver 2504 is covered with the light-blocking layer 2568. The transistors 2502$t$ and 2503$t$ may be OS transistors. Over the substrate 2510, the wirings 2511 through which a signal can be supplied are provided. Over the wirings 2511, a terminal 2519 is provided. An FPC 2509 is electrically connected to the terminal 2519 through a conductor 2518. An anisotropic conductive paste (ACP) or the like can be used for the conductor 2518.

A substrate 2510 is a stack including an insulating layer 2510a, a flexible substrate 2510b, and an adhesive layer 2510c. Here, the substrate 2510 is not a support substrate used to form the pixel portion 2505 and the like. After the pixel portion 2505 and the like are formed, a support substrate is separated from the insulating layer 2510a, and then the flexible substrate 2510b is bonded to the insulating layer 2510a with the adhesive layer 2510c. The insulating layer 2510a is a blocking layer for preventing diffusion of impurities to the EL element 2550.

A substrate 2570 is a stack including an insulating layer 2570a, a flexible substrate 2570b, and an adhesive layer 2570c. Here, the substrate 2570 is not a support substrate used to form the coloring layer 2567 and the like. After the coloring layer 2567 and the like are formed, a support substrate is separated from the insulating layer 2570a, and then the flexible substrate 2570b is bonded to the insulating layer 2570a with the adhesive layer 2570c. The insulating layer 2570a is a blocking layer for preventing diffusion of impurities to the EL element 2550.

A sealing layer 2560 is provided between the substrate 2510 and the substrate 2570. The sealing layer 2560 preferably has a higher refractive index than the air. A sealant may be formed in the peripheral portion of the sealing layer 2560. With the use of the sealant, the EL element 2550 can be provided in a region surrounded by the substrate 2510, the substrate 2570, the sealing layer 2560, and the sealant. An inert gas (such as nitrogen or argon) may be filled between the substrate 2510 and the substrate 2570. In this case, a drying agent may be provided between the substrate 2510 and the substrate 2570 to adsorb moisture and the like. In the case where the sealing layer 2560 is provided on the light 2551 extraction side, the sealing layer 2560 is in contact with the EL element 2550 and the coloring layer 2567.

(Liquid Crystal Display Device)

Here, differences between the display panel 2501 and the display panel 2500 are described. The pixel portion 2505 includes a liquid crystal element 2552 and the transistor 2502t. The liquid crystal element 2552 includes a pixel electrode 2523, a counter electrode 2524, and a liquid crystal layer 2529. Furthermore, an alignment film for aligning liquid crystal is provided as needed. A spacer 2530 is provided on the substrate 2570. The spacer 2530 is provided to control a distance (a cell gap) between the substrate 2510 and the substrate 2570. The spacer 2530 may be provided on the substrate 2510. The spacer 2530 is formed using a photosensitive resin material, for example.

The counter electrode 2524 of the liquid crystal element 2552 is provided on the substrate 2570 side. An insulating layer 2531 is provided between the counter electrode 2524 and each of the coloring layer 2567 and the light-blocking layer 2568. The pixel electrode 2523 is a reflective electrode. Projections and depressions are formed on a surface of the insulating layer 2522 in a region where the pixel electrode 2523 is formed. Accordingly, a surface of the pixel electrode 2523 has projections and depressions, and light is easily irregularly reflected at the pixel electrode 2523. Thus, the visibility of the display panel 2501 is improved. Note that in the case where the pixel electrode 2523 is a transparent electrode, a structure where the insulating layer 2522 does not have projections and depressions is employed.

Embodiment 3

In this embodiment, a processing unit including a logic circuit, a memory device, and the like is described as an example of a semiconductor device. In addition, examples in which a semiconductor device is used in an electronic component, examples in which a semiconductor device is used in an electronic device including the electronic component, and electronic devices including a display device and the like are described, for example.

<<CPU>>

Figure 23:
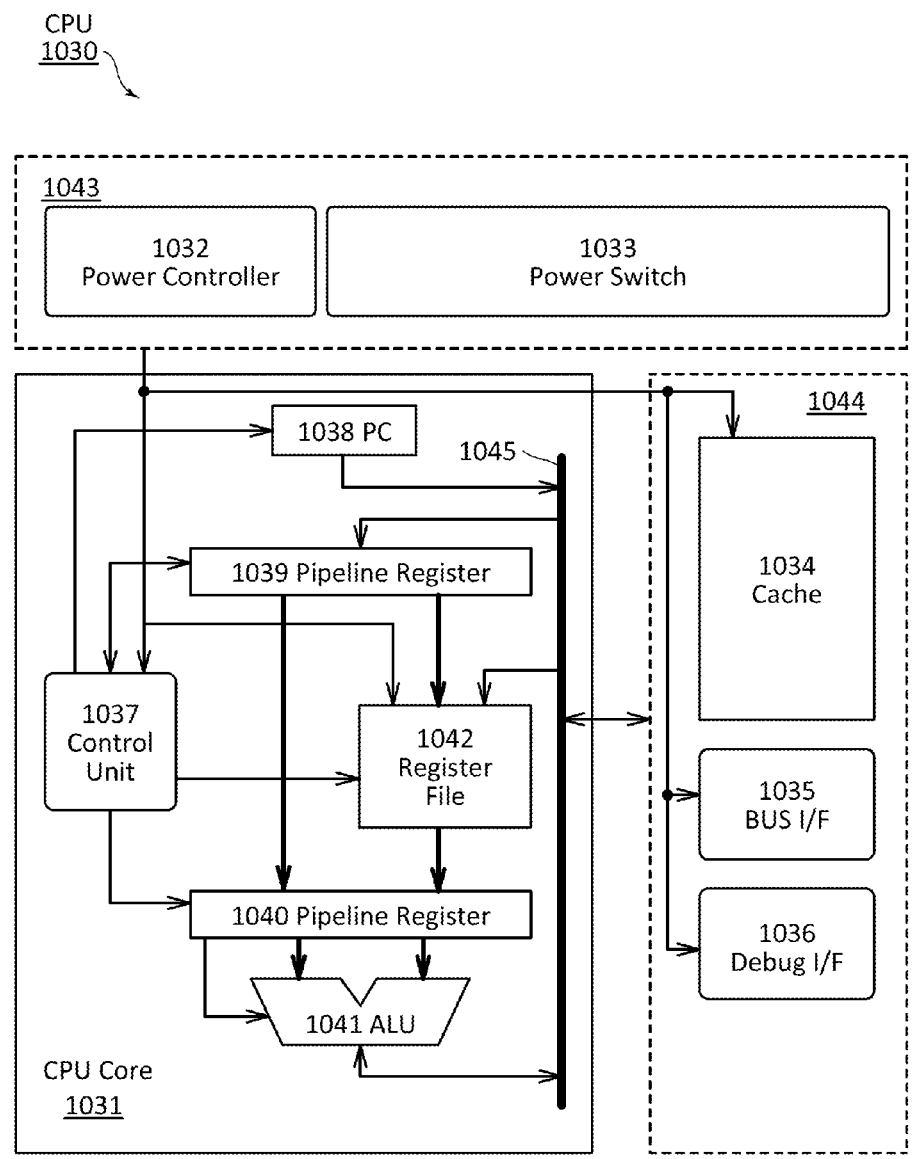
FIG. 23 is a block diagram showing a CPU configuration example.

FIG. 23 illustrates a CPU configuration example. A CPU 1030 illustrated in FIG. 23 includes a CPU core 1031, a power management unit 1043, and a peripheral circuit 1044. The power management unit 1043 includes a power controller 1032 and a power switch 1033. The peripheral circuit 1044 includes a cache 1034 including cache memory, a bus interface (BUS I/F) 1035, and a debug interface (Debug I/F) 1036. The CPU core 1031 includes a data bus 1045, a control unit 1037, a program counter (PC) 1038, a pipeline register 1039, a pipeline register 1040, an arithmetic logic unit (ALU) 1041, and a register file 1042. Data is transmitted between the CPU core 1031 and the peripheral circuit 1044 such as the cache 1034 via the data bus 1045.

The control unit 1037 has functions of decoding and executing instructions contained in a program such as inputted applications by controlling the overall operations of the PC 1038, the pipeline registers 1039 and 1040, the ALU 1041, the register file 1042, the cache 1034, the bus interface 1035, the debug interface 1036, and the power controller 1032. The ALU 1041 has a function of performing a variety of arithmetic operations such as four arithmetic operations and logic operations.

The cache 1034 has a function of temporarily storing frequently used data. The PC 1038 is a register having a function of storing an address of an instruction to be executed next. Although not illustrated in FIG. 23, the cache 1034 includes a cache controller for controlling the operation of the cache memory. The pipeline register 1039 has a function of temporarily storing instruction data. The pipeline register 1040 has a function of temporarily storing data used for arithmetic operations performed in the ALU 1041, data obtained as a result of arithmetic operations in the ALU 1041, or the like. The register file 1042 includes a plurality of registers including a general purpose register and can store data that is read from the main memory, data obtained as a result of arithmetic operations in the ALU 1041, or the like.

The memory device in Embodiment 2 can be used in the cache 1034. Consequently, high-speed operation and low power consumption of the cache 1034 can be achieved and thus a semiconductor device that operates more rapidly or a semiconductor device with low power consumption can be provided.

The bus interface 1035 functions as a path for data between the CPU 1030 and devices outside the CPU 1030. The debug interface 1036 functions as a path of a signal for inputting an instruction to control debugging to the CPU 1030.

The power switch 1033 has a function of controlling supply of the power supply voltage to circuits other than the power controller 1032. These circuits belong to several different power domains. The power switch 1033 controls whether the power is supplied to circuits in the same power domain. The power controller 1032 has a function of controlling the operation of the power switch 1033. With such a configuration, the CPU 1030 can perform power gating. An example of the flow of the power gating operation will be described.

First, the CPU core 1031 sets the timing for stopping the supply of the power in a register of the power controller 1032. Next, an instruction to start power gating is sent from the CPU core 1031 to the power controller 1032. Then, the registers and the cache 1034 in the CPU 1030 start data storing. Subsequently, the power switch 1033 stops the supply of the power supply voltage to the circuits other than the power controller 1032. Then, an interrupt signal is input to the power controller 1032, thereby starting the supply of the power to the circuits in the CPU 1030. Note that a counter may be provided in the power controller 1032 to be used to determine the timing of starting the supply of the power supply voltage regardless of input of an interrupt signal. Next, the registers and the cache 1034 start data restoration. After that, execution of an instruction is resumed in the control unit 1037.

This power gating can be performed in the entire processor or one or more logic circuits included in the processor. The supply of power can be stopped even for a short time. Accordingly, power consumption can be reduced at a fine granularity in space or time.

In the case where the semiconductor memory device of one embodiment of the present invention is used in the cache 1034, the cache 1034 can retain data for a certain period even when the supply of a power supply voltage is stopped. Therefore, when power gating is performed, a period during which data of the cache 1034 is stored can be secured easily. Even when the supply of the power supply voltage is suddenly stopped, data in the cache 1034 can be stored. In the case where data is stored, the time and power necessary for storing and restoring data is required, while in the case of using the semiconductor memory device of one embodiment of the present invention, such time and power are not required.

<RFIC>

A radio frequency integrated circuit (RFIC) is described as an example of a processing unit. The RFIC stores necessary data in a memory circuit in the RFIC, and transmits and receives data to/from the outside by using contactless means, for example, wireless communication. With these features, the RFIC is used for an individual authentication system in which an object or the like is recognized by reading the individual information, for example.

Figure 24:
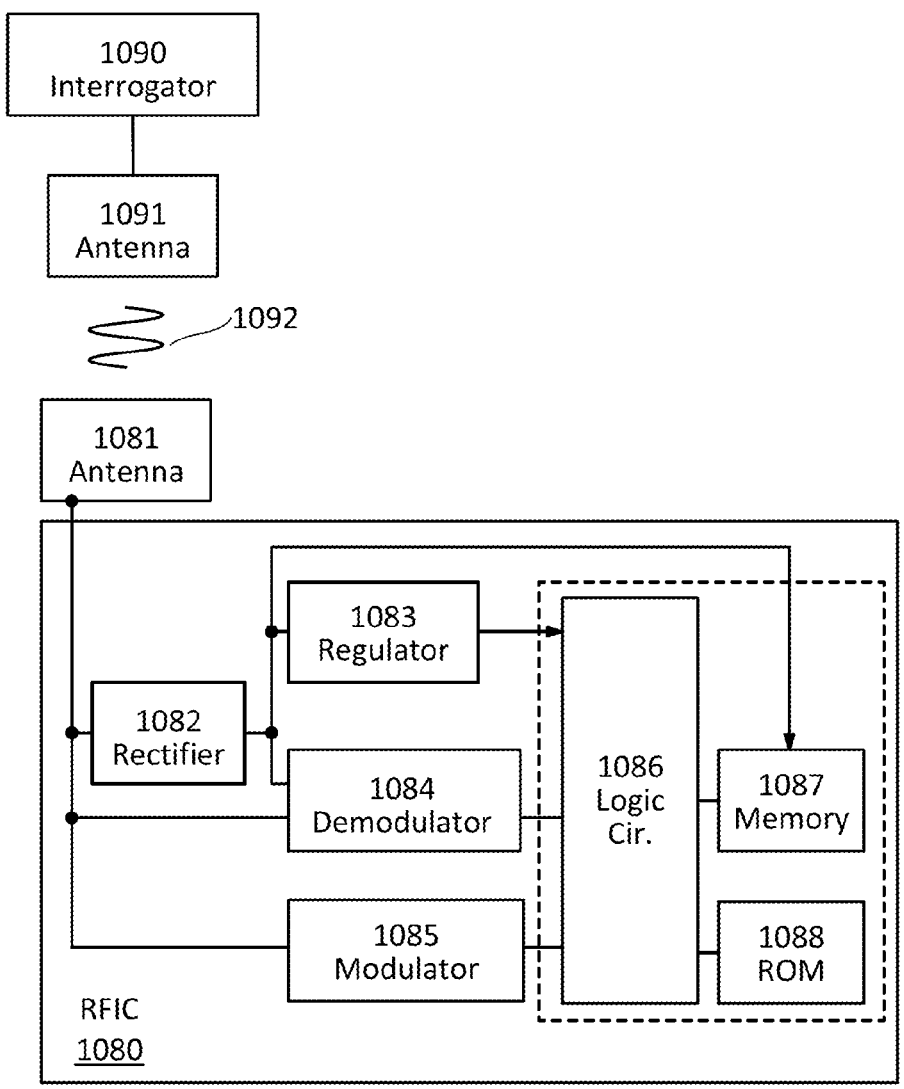
FIG. 24 is a block diagram showing an RFIC configuration example.

FIG. 24 is a block diagram illustrating an example of an RFIC. An RFIC 1080 illustrated in FIG. 24 includes a rectifier circuit 1082, a regulator circuit 1083, a demodulator circuit 1084, a modulator circuit 1085, a logic circuit 1086, a memory device 1087, and a read-only memory (ROM) 1088. Note that decision whether each of these circuits is provided or not can be made as appropriate as needed. Although the RFIC 1080 in the example of FIG. 24 is a passive type, it is needless to say that the RFIC 1080 can be an active type with a built-in battery. An antenna 1081 is electrically connected to the RFIC 1080. A circuit where the antenna 1081 is connected can be referred to as an RFIC.

The memory device in Embodiment 2 has a device structure capable of employing a combined memory (see FIGS. 13 to 15). Therefore, in the RFIC 1080, circuits other than the antenna 1081 can be incorporated in one chip without complicating the manufacturing process. The antenna 1081 whose performance corresponds to the communication zone is mounted on the chip. Note that as data transmission methods, the following methods can be given: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFIC 1080 described in this embodiment.

The antenna 1081 transmits/receives a radio signal 1092 to/from an antenna 1091. The antenna 1091 is connected to a communication device 1090. The rectifier circuit 1082 generates an input potential by rectification, for example, half-wave voltage doubler rectification of an input alternating signal generated by reception of a radio signal at the antenna 1081 and smoothing of the rectified signal with a capacitor provided in a subsequent stage in the rectifier circuit 1082. Note that a limiter circuit may be provided on an input side or an output side of the rectifier circuit 1082. The limiter circuit controls electric power so that electric power which is higher than or equal to a certain value is not input to a circuit in a subsequent stage if the amplitude of the input alternating signal is high and an internal generation voltage is high.

The logic circuit 1086 decodes and processes the demodulated signal. The memory device 1087 holds the input data and includes a row decoder, a column decoder, a memory region, and the like. Furthermore, the ROM 1088 stores an identification number (ID) or the like and outputs it in accordance with processing.

The regulator circuit 1083 generates a stable power supply voltage from an input potential and supplies it to each circuit. Note that the regulator circuit 1083 may include a reset signal generation circuit. The reset signal generation circuit is a circuit which generates a reset signal of the logic circuit 1086 by utilizing rise of the stable power supply voltage. The demodulation circuit 1084 demodulates the input alternating signal by envelope detection and generates the demodulated signal. The modulation circuit 1085 performs modulation in accordance with data to be output from the antenna 1081.

A variety of kinds of information can be obtained wirelessly by incorporating a sensor unit in the RFIC 1080. The RFIC 1080 including a temperature sensor circuit and/or a humidity sensor circuit can be used for controlling temperature and/or humidity of the cultural properties, for example.

Furthermore, the RFIC is used by being attached to a medical tool for the management thereof. Since medical tools need to be subjected to high-temperature sterilizing treatment at 100° C. or higher in an autoclave, the memory device of the RFIC is required to have high reliability in a high-temperature environment. If the memory device 300 of Embodiment 2 is used as the memory device 1087, even after being exposed to a high-temperature environment at 100° C. or higher, the memory device 1087 can hold data. Thus, the RFIC 1080 is very suitable for medical uses.

Although the CPU and the RFIC are described here as examples of a processing unit, the semiconductor memory device of one embodiment of the present invention can be used for a variety of processing units. For example, the semiconductor memory device of one embodiment of the present invention can also be used for a graphics processing unit (GPU), a programmable logic device (PLD), a digital signal processor (DSP), a microcontroller unit (MCU), and a custom LSI.

<<Manufacturing Method Example of Electronic Component>>

Figure 25A:
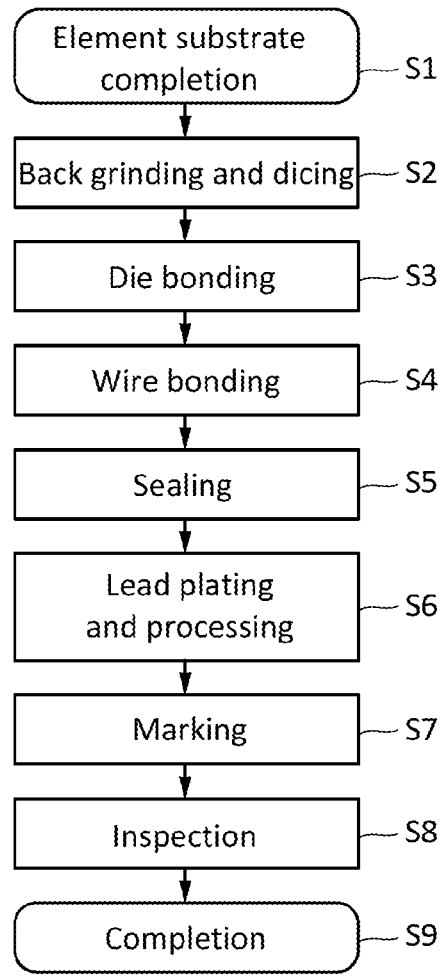
FIG. 25A is a flowchart showing a manufacturing method example of an electronic component.

FIG. 25A is a flow chart showing an example of a method for manufacturing an electronic component. The electronic component is also referred to as a semiconductor package or an IC package. This electronic component has a plurality of standards and names depending on a terminal extraction direction and a terminal shape. Thus, examples of the electronic component are described in this embodiment.

A semiconductor device including a transistor is completed by integrating detachable components on a printed board through the assembly process (post-process). The post-process can be finished through each step in FIG. 25A. Specifically, an element substrate obtained in the preceding process is formed (Step S1). Over the element substrate, for example, any of the semiconductor devices in FIG. 8, FIG. 16A, FIG. 23, FIG. 24, and the like is formed.

After an element substrate is completed, a rear surface of the substrate is ground (Step S2). By thinning the substrate at this stage, the warpage or the like of the substrate in the preceding process is reduced and the component is downsized. The rear surface of the substrate is ground so that the substrate is divided into a plurality of chips in a dicing process. Then, the divided chips are separately picked up to be mounted on and bonded to a lead frame in a die bonding process (Step S3). In this die bonding process, the chip is bonded to the lead frame by an appropriate method depending on a product, for example, bonding with a resin or a tape. Note that in the die bonding process, the chip may be mounted on an interposer to be bonded.

Then, wire bonding is performed to electrically connect lead of the lead frame to an electrode on the chip with a metal fine line (wire) (Step S4). A silver line or a gold line can be used as the metal fine line. Ball bonding or wedge bonding can be used as the wire bonding. A molding process is performed to seal the wire bonded chip with an epoxy resin or the like (Step S5). Through the molding step, the inside of the electronic component is filled with a resin, so that the destruction of the circuit portion and the wire embedded in the component due to external mechanical force can be reduced and degradation of characteristics due to moisture or dust can be reduced. Next, plate processing is performed on the lead of the lead frame. After that, the lead is cut and processed (Step S6). This plate processing prevents rust of the lead and facilitates soldering at the time of mounting the chip on a printed wiring board in a later step. Next, printing (marking) is performed on a surface of the package (Step S7). Through the final inspection process (Step S8), the electronic component is completed (Step S9).

The above electronic component can include the semiconductor device described in the above embodiment. Thus, the electronic component can consume less power and have smaller size.

Figure 25B:
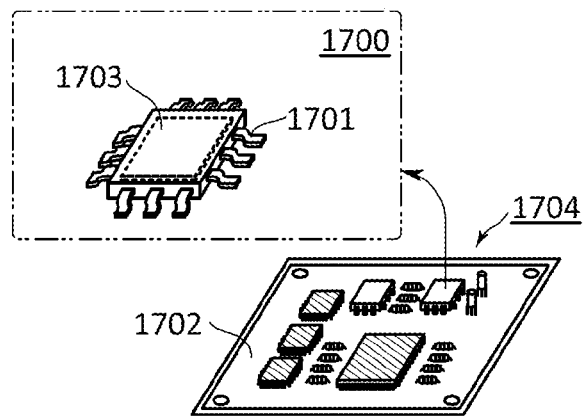
FIG. 25B is a schematic perspective view illustrating a configuration example of an electronic component.

FIG. 25B is a schematic perspective view of the completed electronic component. FIG. 25B shows an example of a quad flat package (QFP). An electronic component 1700 shown in FIG. 25B includes a lead 1701 and a circuit portion 1703. The electronic component 1700 is mounted on a printed board 1702, for example. When a plurality of electronic components 1700 are used in combination and electrically connected to each other over the printed board 1702, the electronic components 1700 can be provided in an electronic device. A completed circuit board 1704 is provided in the electronic device or the like. For example, the electronic component 1700 can be used as a memory device, an imaging device, and a processing unit such as an MCU and an RFIC.

Figure 26:
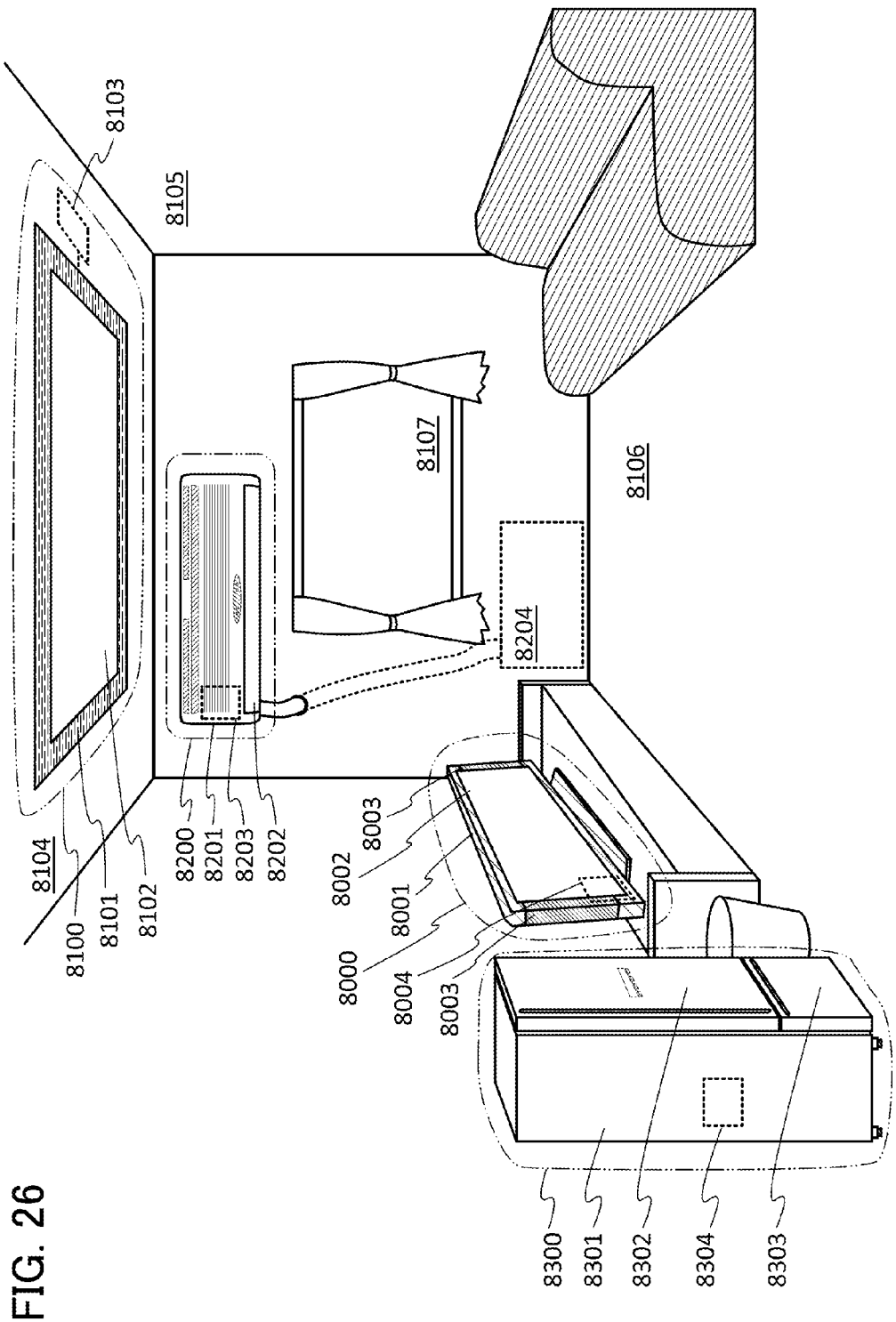
FIG. 26 illustrates examples of electronic devices.

The electronic component 1700 can be used as electronic component (an IC chip) of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Specific examples of the electronic devices are illustrated in FIG. 26.

<Electronic Device>

A display device 8000 corresponds to a display device for TV broadcast reception and includes a housing 8001, a display portion 8002, speaker portions 8003, an electronic component 8004, and the like. The electronic component 8004 of one embodiment of the present invention is provided in the housing 8001.

A semiconductor display device such as a liquid crystal display device, a light-emitting device in which a light-emitting element such as an organic EL element is provided in each pixel, an electrophoretic display device, a digital micromirror device (DMD), a plasma display panel (PDP), or a field emission display (FED) can be used for the display portion 8002. Note that the display device includes, in its category, all of information display devices for personal computers, advertisement displays, and the like besides TV broadcast reception. Specific examples of electronic devices which are provided with a display portion, such as the display device 8000, are illustrated in FIG. 26, FIGS. 27 and 27B, and FIGS. 28A to 28F.

A lighting device 8100 is an installation lighting device including a housing 8101, a light source 8102, an electronic component 8103, and the like. As the light source 8102, an artificial light source which emits light artificially by using power can be used. Specifically, an incandescent lamp, a discharge lamp such as a fluorescent lamp, and light-emitting elements such as an LED and an organic EL element are given as examples of the artificial light source. Although FIG. 26 illustrates an example where the lighting device 8100 is provided on a ceiling 8104, the lighting device 8100 may be provided on, for example, a sidewall 8105, a floor 8106, or a window 8107. The lighting device is not limited to an installation lighting device and may be a tabletop lighting device, a portable lighting device, or the like.

An air conditioner including an indoor unit 8200 and an outdoor unit 8204 is an example of an electronic device including an electronic component 8203 of one embodiment of the present invention. Specifically, the indoor unit 8200 includes a housing 8201, an air outlet 8202, the electronic component 8203, and the like. Although FIG. 26 illustrates the case where the electronic component 8203 is provided in the indoor unit 8200, the electronic component 8203 may be provided in the outdoor unit 8204. Alternatively, the electronic component 8203 may be provided in each of the indoor unit 8200 and the outdoor unit 8204. For example, an infrared light sensor or a temperature sensor unit is incorporated in the electronic component 8203 as a sensor unit. Although FIG. 26 illustrates a separated air conditioner including the indoor unit and the outdoor unit as an example, it may be an air conditioner in which the functions of an indoor unit and an outdoor unit are integrated in one housing.

An electric refrigerator-freezer 8300 includes a housing 8301, a door for a refrigerator 8302, a door for a freezer 8303, an electronic component 8304, and the like. The electronic component 8304 is provided in the housing 8301.

Figure 27A:
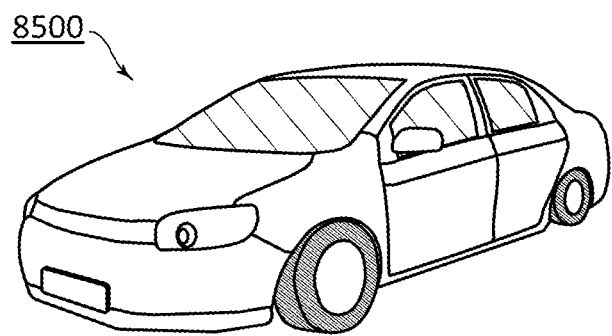
FIGS. 27A and 27B illustrate an example of an electric vehicle.
Figure 27B:
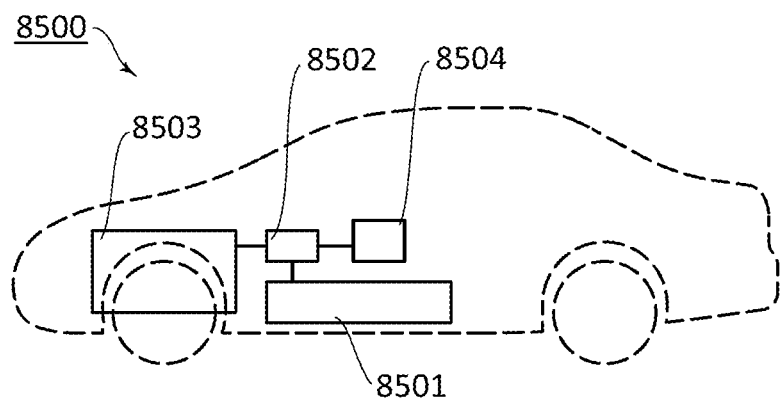

FIG. 26 illustrates examples of household appliances using the electronic component 1700. The electronic component 1700 can be incorporated in a variety of household appliances such as a microwave oven, a dishwasher, a washing machine, or a vacuum cleaner. Electronic devices in which the electronic component 1700 can be incorporated are not limited to household appliances. As described above, the electronic component 1700 can be used in a variety of electronic devices used in, for example, industrial robots, assistive robots, planes, ships, and automobiles. FIGS. 27A and 27B illustrate an example of an electric vehicle as an example of such an electronic device.

<Electric Vehicle>

FIG. 27A is an external view illustrating an example of an electric vehicle 8500. The electric vehicle 8500 is equipped with a lithium-ion secondary battery 8501 as illustrated in FIG. 27B. The output of the electric power of the lithium-ion secondary battery 8501 is adjusted by a control circuit 8502 and the electric power is supplied to a driving device 8503. The control circuit 8502 is controlled by a processing unit 8504. For example, the logic circuit of one embodiment of the present invention can be used for a memory device such as the control circuit 8502 or the processing unit 8504.

The driving device 8503 includes a DC motor or an AC motor either alone or in combination with an internal-combustion engine. The processing unit 8504 outputs a control signal to the control circuit 8502 based on input data such as data on operation (e.g., acceleration, deceleration, or stop) by a driver of the electric vehicle 8500 or data on driving the electric vehicle 8500 (e.g., data on an upgrade or a downgrade, or data on a load on a driving wheel). The control circuit 8502 adjusts the electric energy supplied from the lithium-ion secondary battery 8501 in accordance with the control signal of the processing unit 8504 to control the output of the driving device 8503.

<Electronic Devices Including Display Portion>

Electronic devices each including a display portion are given below as examples of semiconductor devices. The examples of the electronic device include television sets, laptop personal computers (PCs), tablet PCs, image reproducing devices (typically, devices which reproduce images recorded in recording media such as DVDs, Blu-ray Discs, and hard disks and have display portions for displaying reproduced images), mobile phones, smartphones, portable game consoles, portable information terminals (e.g., tablet information terminals), wearable (e.g., glasses-type, goggle-type, watch-type, and bangle-type) information terminals, e-book readers, cameras (e.g., video cameras and digital still cameras), navigation systems, audio reproducing devices (e.g., car audio systems and digital audio players), copiers, facsimiles, printers, multifunction printers, automated teller machines (ATM), and vending machines. Specific examples of such electronic devices are shown in FIGS. 28A to 28F.

Figure 28A:
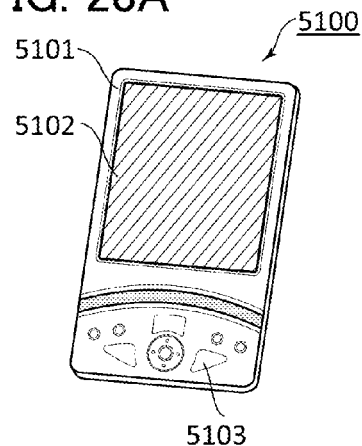
FIGS. 28A to 28F illustrate examples of electronic devices.

An information terminal 5100 illustrated in FIG. 28A includes a housing 5101, a display portion 5102, operation keys 5103, and the like.

Figure 28B:
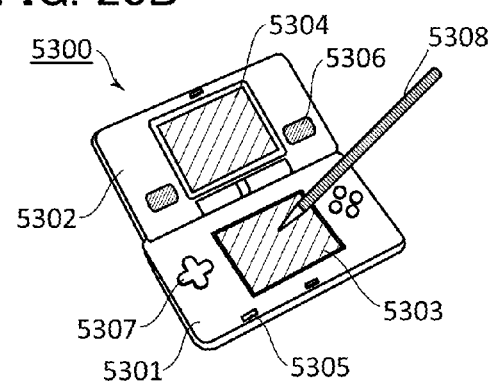

A portable game console 5300 illustrated in FIG. 28B includes a housing 5301, a housing 5302, a display portion 5303, a display portion 5304, a microphone 5305, a speaker 5306, an operation key 5307, a stylus 5308, and the like. Although the portable game console 5300 includes two display portions (5303 and 5304), the number of display portions are not limited to two, and may be one or three or more.

Figure 28C:
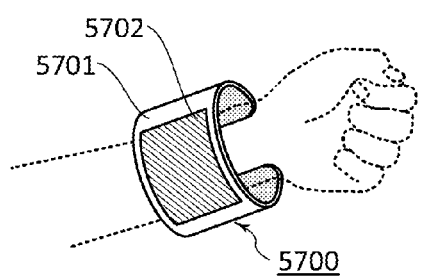

An information terminal 5700 illustrated in FIG. 28C is an example of a wearable information terminal. The information terminal 5700 includes a bangle-type housing 5701, a display portion 5702, and the like. The display portion 5702 is supported by the housing 5701 with a curved surface. A display panel formed with a flexible substrate is provided in the display portion 5702, whereby the information terminal 5700 can be a user-friendly information terminal that is flexible and lightweight.

Figure 28D:
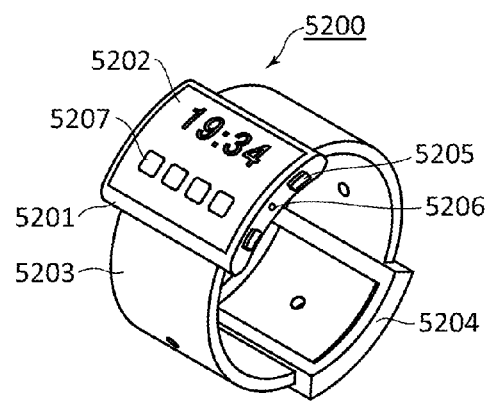

An information terminal 5200 illustrated in FIG. 28D is an example of a wearable information terminal. The information terminal 5200 is a watch-type information terminal and includes a housing 5201, a display portion 5202, a band 5203, a buckle 5204, operation buttons 5205, an input output terminal 5206, and the like. The information terminal 5200 is capable of executing a variety of applications such as mobile phone calls, e-mailing, viewing and editing texts, music reproduction, Internet communication, and computer games.

The display surface of the display portion 5202 is bent, and images can be displayed on the bent display surface. The display portion 5202 includes a touch sensor, and operation can be performed by touching the screen with a finger, a stylus, or the like. For example, by touching an icon 5207 displayed on the display portion 5202, an application can be started. With the operation button 5205, a variety of functions such as time setting, ON/OFF of the power, ON/OFF of wireless communication, setting and cancellation of a silent mode, and setting and cancellation of a power saving mode can be performed. For example, the functions of the operation button 5205 can be set by setting the operating system incorporated in the information terminal 5200.

The information terminal 5200 can employ near field communication conformable to a communication standard. In that case, for example, mutual communication between the information terminal 5200 and a headset capable of wireless communication can be performed, and thus hands-free calling is possible. Moreover, the information terminal 5200 includes the input output terminal 5206, and data can be directly transmitted to and received from another information terminal via a connector. Charging via the input output terminal 5206 is possible. Note that the charging operation may be performed by wireless power feeding without using the input output terminal 5206.

Figure 28E:
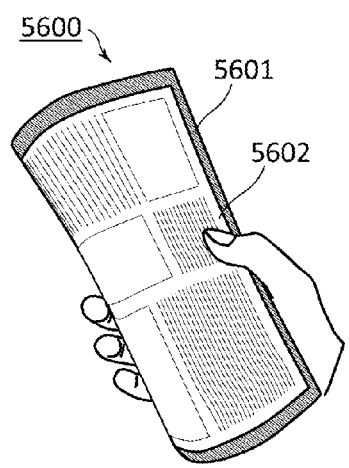

An e-book reader 5600 illustrated in FIG. 28E includes a housing 5601, a display portion 5602, and the like. A display panel formed with a flexible substrate is provided in the display portion 5602. Thus, the e-book reader 5600 can be a user-friendly e-book reader that is flexible and lightweight.

Figure 28F:
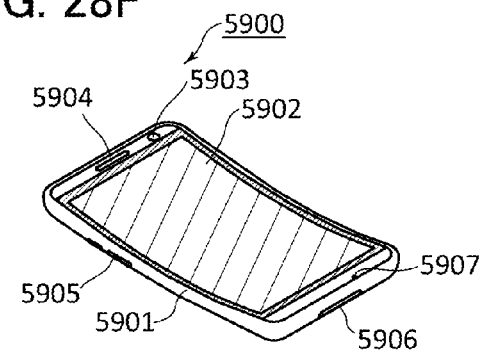

An information terminal 5900 illustrated in FIG. 28F includes a housing 5901, a display portion 5902, a microphone 5907, a speaker portion 5904, a camera 5903, an external connection portion 5906, an operation button 5905, and the like. The display portion 5902 is provided with a display panel formed with a flexible substrate. The information terminal 5900 can be used as, for example, a smartphone, a mobile phone, a tablet information terminal, a tablet PC, or an e-book reader.

Embodiment 4

In this embodiment, a device structure of an OS transistor and the like will be described.

Structure Example 1 of Transistor

FIG. 29A is a top view of a transistor 500. FIG. 29B is a cross-sectional view taken along line x11-x12 in FIG. 29A, and FIG. 29C is a cross-sectional view taken along line y11-y12 in FIG. 29A. Note that the direction of line x11-x12 and the direction of line y11-y12 may be referred to as a channel length direction and a channel width direction, respectively, of the transistor 500. For simplification of the drawing, some components are not illustrated in FIG. 29A. The same applies to a top view such as FIG. 31A.

The transistor 500 is formed over a substrate 510. The transistor 500 includes insulating layers 511 to 517, conductive layers 521 to 524, and metal oxide layers 531 to 533.

Each of these layers may have a single-layer structure or a stacked-layer structure. Here, the metal oxide layers 531 to 533 may be collectively referred to as a metal oxide layer 530.

The conductive layer 521 and the conductive layer 522 serve as a gate electrode (front gate electrode) and a back gate electrode, respectively, of the transistor 500. A region of the conductive layer 521 serving as a gate electrode is formed in a self-aligned manner so as to fill an opening formed in the insulating layer 516. The conductive layers 523 and 524 serve as a source electrode and a drain electrode. For example, in the case where the conductive layer 523 has a stacked-layer structure, it is preferable that a layer in contact with the metal oxide layer 532 be less likely to transmit oxygen than the other layers of the conductive layer 523. This can prevent a decrease in the conductivity of the conductive layer 523 due to oxidation. The above description also applies to the conductive layer 524.

The metal oxide layer 532 is a semiconductor, and a channel formation region is provided in the metal oxide layer 532. The metal oxide layer 531 and the metal oxide layer 532 form a metal oxide stack. In the stack, resistivity of a region 535 in contact with the conductive layer 523 and a region 536 in contact with the conductive layer 524 is lower than that of the other regions. The region 535 contributes to a decrease in the contact resistance between the stack and the conductive layer 523. Similarly, the region 536 contributes to a decrease in the contact resistance between the stack and the conductive layer 524.

The insulating layers 511 to 517 each serve as a passivation layer or an interlayer insulating layer. Specifically, the insulating layer 511 serves as a base insulating layer of the transistor 500, the insulating layer 515 serves as a gate insulating layer, and the insulating layer 513 serves as a charge accumulation layer.

As illustrated in FIG. 29C, a side surface of the metal oxide layer 532 is surrounded by the conductive layer 521. In such a device structure, the metal oxide layer 532 can be electrically surrounded by an electric field of the conductive layer 521 (gate electrode). A structure in which a semiconductor (particularly, a channel formation region) is electrically surrounded by an electric field of a gate electrode is referred to as a surrounded channel (s-channel) structure. A channel of the s-channel transistor is formed in the whole (bulk) of the metal oxide layer 532. Therefore, a high current can flow between a source and a drain of the s-channel transistor, which leads to favorable on-state current characteristics. Moreover, the s-channel structure is suitable for a miniaturized transistor. Thus, the s-channel transistor can have a high on-state current and is suitable for a semiconductor device that requires a miniaturized transistor, such as a processor or a memory device.

Figure 30A:
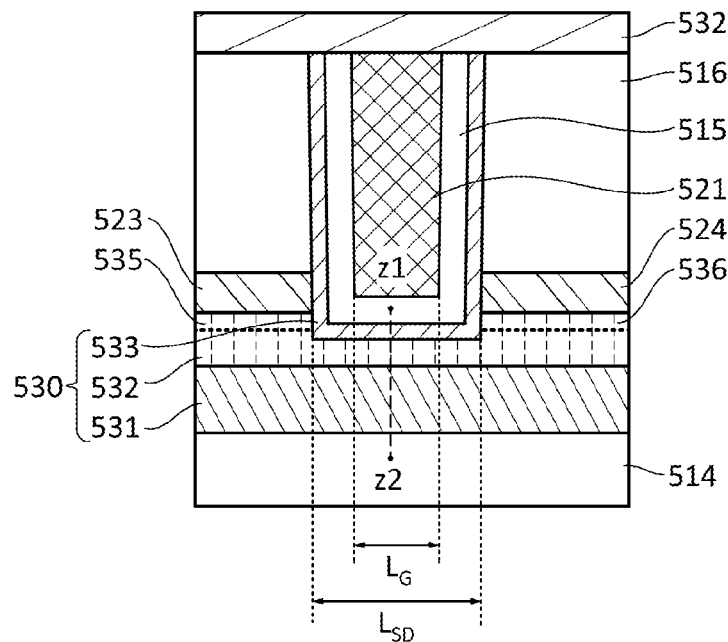
FIG. 30A is a partial enlarged view of FIG. 29B.

FIG. 30A is an enlarged view of the channel formation region of the transistor 500. In FIG. 30A, a width $L_G$ represents the length in the channel length direction of a region in which the bottom surface of the conductive layer 521 overlaps with the top surface of the metal oxide layer 532 with the insulating layer 514 and the metal oxide layer 533 positioned therebetween. The width $L_G$ corresponds to the line width of the gate electrode of the transistor 500. In FIG. 30A, a width $L_{SD}$ represents the length between the conductive layer 523 and the conductive layer 524. The width $L_{SD}$ corresponds to the length between the source electrode and the drain electrode of the transistor 500.

In general, the width $L_{SD}$ is determined by the minimum feature size. As illustrated in FIG. 30A, the width $L_G$ is smaller than the width $L_{SD}$. This means that the line width of the gate electrode of the transistor 500 can be made smaller than the minimum feature size. For example, the width $L_G$ can be greater than or equal to 5 nm and less than or equal to 60 nm, preferably greater than or equal to 5 nm and less than or equal to 30 nm.

<Metal Oxide>

The metal oxide layer 532 is an oxide semiconductor containing indium (In), for example. The metal oxide layer 532 can have high carrier mobility (electron mobility) by containing indium, for example. The metal oxide layer 532 preferably contains an element M. The element M is preferably aluminum (Al), gallium (Ga), yttrium (Y), tin (Sn), or the like. Alternatively, boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), or the like can be used as the element M. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the metal oxide, for example. Furthermore, the metal oxide layer 532 preferably contains zinc (Zn). When containing zinc, the metal oxide is easily crystallized in some cases.

The metal oxide layer 532 is not limited to the oxide semiconductor containing indium. For example, the metal oxide layer 532 may be formed using an oxide semiconductor that does not contain indium and contains at least one of zinc, gallium, and tin. Specifically, the metal oxide layer 532 can be formed using zinc tin oxide, gallium tin oxide, or the like.

For the metal oxide layer 532, for example, an oxide semiconductor with a large energy gap is used. For example, the energy gap of the metal oxide layer 532 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. A CAAC-OS described later is preferably used for the metal oxide layer 532.

For example, the metal oxide layers 531 and 533 preferably contain at least one of the metal elements contained in the metal oxide layer 532, in which case an interface state is less likely to be generated at the interface between the metal oxide layer 531 and the metal oxide layer 532 and the interface between the metal oxide layer 532 and the metal oxide layer 533.

In the case where an In-M-Zn oxide is used for the metal oxide layer 531, the proportions of In and M, the sum of which is assumed to be 100 atomic %, are preferably lower than 50 atomic % and higher than 50 atomic %, respectively, further preferably lower than 25 atomic % and higher than 75 atomic %, respectively. When the metal oxide layer 531 is deposited by a sputtering method, a sputtering target with the above composition is preferably used. For example, In:M:Zn is preferably 1:3:2 or 1:3:4.

In the case of using an In-M-Zn oxide as the metal oxide layer 532, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide layer 532 is formed by sputtering, a sputtering target with the above composition is preferably used. For example, the atomic ratio of In to M and Zn is preferably 1:1:1, 1:1:1.2, 2:1:3, 3:1:2, 4:2:4.1, or 5:1:7. In particular, when a sputtering target with an atomic ratio of In to Ga and Zn of 4:2:4.1 is used, the atomic ratio of In to Ga and Zn in the metal oxide layer 532 may be 4:2:3 or in the neighborhood of 4:2:3.

In the case where an In-M-Zn oxide is used for the metal oxide layer 533, the proportions of In and M, the sum of which is assumed to be 100 atomic %, are preferably lower than 50 atomic % and higher than 50 atomic %, respectively, further preferably lower than 25 atomic % and higher than 75 atomic %, respectively. When the metal oxide layer 531 is deposited by a sputtering method, a sputtering target with the above composition is preferably used. For example, In:M:Zn is preferably 1:3:2 or 1:3:4. The metal oxide layer 533 may be formed using the same kind of metal oxide as the metal oxide layer 531.

The metal oxide layer 531 or the metal oxide layer 533 does not necessarily contain indium in some cases. For example, the metal oxide layer 531 or the metal oxide layer 533 may contain gallium oxide.

(Energy Band Structure)

Figure 30B:
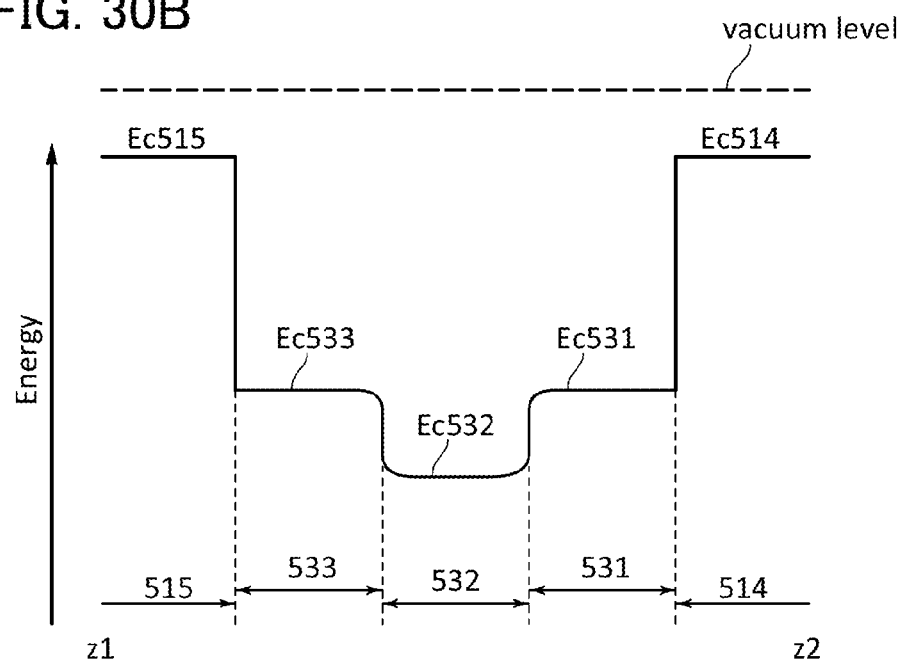
FIG. 30B is an energy band diagram of a transistor.

A function and an effect of the metal oxide layer 530 including the stacked metal oxide layers 531 to 533 will be described using the energy band diagram in FIG. 30B. FIG. 30B illustrates the energy band structure of a portion along line z1-z2 in FIG. 30A. Ec514, Ec531, Ec532, Ec533, and Ec515 represent the energy of the conduction band minimum of the insulating layer 514, that of the metal oxide layer 531, that of the metal oxide layer 532, that of the metal oxide layer 533, and that of the insulating layer 515, respectively.

Here, the energy difference between the vacuum level and the conduction band minimum (also referred to as an electron affinity) corresponds to a value obtained by subtracting an energy gap from the energy difference between the vacuum level and the valence band maximum (also referred to as an ionization potential). Note that the energy gap can be measured using a spectroscopic ellipsometer. The energy difference between the vacuum level and the valence band maximum can be measured using an ultraviolet photoelectron spectroscopy (UPS) device.

Since the insulating layers 514 and 515 are insulators, Ec514 and Ec515 are closer to the vacuum level than Ec531 to Ec533 (the insulating layers 514 and 515 each have a lower electron affinity than the metal oxide layers 531 to 533).

The metal oxide layer 532 is preferably formed using a metal oxide having a higher electron affinity than that used for the metal oxide layer 531 and the metal oxide layer 533. For example, the electron affinity of the metal oxide layer 532 is preferably higher than that of the metal oxide layer 531 by 0.07 eV or more and 1.3 eV or less. The difference between the electron affinity of the metal oxide layer 532 and that of the metal oxide layer 531 is preferably 0.1 eV or more and 0.7 eV or less, further preferably 0.15 eV or more and 0.4 eV or less. The same applies to the difference between the electron affinity of the metal oxide layer 532 and that of the metal oxide layer 533. Note that the electron affinity is an energy gap between the vacuum level and the bottom of the conduction band.

Indium gallium oxide has a low electron affinity and a high oxygen-blocking property. Therefore, the metal oxide layer 533 preferably contains indium gallium oxide. The fraction of gallium atoms [Ga/(In+Ga)] is, for example, 70% or higher, preferably 80% or higher, further preferably 90% or higher.

When a gate voltage is applied to the transistor 500, a channel is formed in the metal oxide layer 532 having a higher electron affinity in the metal oxide layer 530. At this time, electrons move mainly in the metal oxide layer 532, not in the metal oxide layers 531 and 533. Hence, even the presence of a large number of interface states, which inhibit the electron movement, at the interface between the metal oxide layer 531 and the insulating layer 514 or the interface between the metal oxide layer 533 and the insulating layer 515 hardly influences the on-state current of the transistor 500. In the transistor 500, the metal oxide layers 531 and 533 function like insulators.

In some cases, a mixed region of the metal oxide layer 531 and the metal oxide layer 532 exists therebetween. In some cases, a mixed region of the metal oxide layer 532 and the metal oxide layer 533 exists therebetween. The mixed region has a low interface state density. For this reason, the stack including the metal oxide layers 531 to 533 has a band structure in which the energy at each interface and in the vicinity of each interface changes continuously (continuous junction).

As described above, the interface between the metal oxide layer 531 and the metal oxide layer 532 or the interface between the metal oxide layer 532 and the metal oxide layer 533 has a low interface state density. Hence, the electron movement in the metal oxide layer 532 is less likely to be inhibited, which leads to an increase in the on-state current of the transistor 500.

The electron movement in the transistor 500 is inhibited, for example, in the case where physical unevenness of the channel formation region is large. To increase the on-state current of the transistor 500, for example, root mean square (RMS) roughness of the top surface or the bottom surface of the metal oxide layer 532 (a formation surface; here, the top surface of the metal oxide layer 531) in a measurement area of 1 μm×1 μm may be less than 1 nm, preferably less than 0.6 nm, further preferably less than 0.5 nm, still further preferably less than 0.4 nm. The average surface roughness (also referred to as Ra) in a measurement area of 1 μm×1 μm may be less than 1 nm, preferably less than 0.6 nm, further preferably less than 0.5 nm, still further preferably less than 0.4 nm. The maximum difference (also referred to as P—V) in a measurement area of 1 μm×1 μm may be less than 10 nm, preferably less than 9 nm, further preferably less than 8 nm, still further preferably less than 7 nm.

The electron movement is also inhibited in the case where the density of defect states is high in a region in which a channel is formed. For example, in the case where the metal oxide layer 532 includes oxygen vacancies (also denoted by $V_O$), donor states are formed by entry of hydrogen into sites of oxygen vacancies in some cases. In the following description, the state in which hydrogen occupies the site of an oxygen vacancy may be denoted by $V_OH$. $V_OH$ is a factor of decreasing the on-state current of the transistor because $V_OH$ causes electron scattering. Note that the site of an oxygen vacancy occupied by oxygen is more stable than that occupied by hydrogen. Therefore, by reducing oxygen vacancies in the metal oxide layer 532, the on-state current of the transistor can be increased in some cases.

For example, at a certain depth in the metal oxide layer 532 or in a certain region of the metal oxide layer 532, the hydrogen concentration measured by secondary ion mass spectrometry (SIMS) is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, still further preferably higher than or equal to $1\times10^{16}$ atoms/cm$^3$ and lower than or equal to $5\times10^{18}$ atoms/cm$^3$.

As a method for reducing oxygen vacancies in the metal oxide layer 532, for example, excess oxygen contained in the insulating layer 514 is moved to the metal oxide layer 532 through the metal oxide layer 531. In this case, the metal oxide layer 531 is preferably a layer having oxygen permeability (a layer through which oxygen can pass or permeate).

The metal oxide layer 532 can have a thickness greater than or equal to 1 nm and less than or equal to 20 nm. The thickness of the metal oxide layer 532 depends on the channel length and can be reduced together with the channel length, for example, to 1 nm or more and 15 nm or less, or 1 nm or more and 10 nm or less.

The metal oxide layer 531 can have a thickness greater than or equal to 5 nm and less than or equal to 200 nm, greater than or equal to 10 nm and less than or equal to 120 nm, greater than or equal to 20 nm less than or equal to 120 nm, or greater than or equal to 40 nm and less than or equal to 80 nm. The metal oxide layer 531 is preferably thicker than the metal oxide layer 532. An increase in the thickness of the metal oxide layer 531 can increase the distance from the interface between the adjacent insulator and the metal oxide layer 531 to the channel formation region.

The metal oxide layer 533 can have a thickness greater than or equal to 1 nm and less than or equal to 100 nm, greater than or equal to 1 nm and less than or equal to 50 nm, or greater than or equal to 1 nm and less than or equal to 10 nm. The metal oxide layer 533 is preferably thinner than the metal oxide layer 531 so that the on-state current of the transistor 500 can be increased.

For example, a region in which the silicon concentration measured by SIMS is higher than or equal to $1\times10^{16}$ atoms/cm$^3$ and lower than $1\times10^{19}$ atoms/cm$^3$ is provided between the metal oxide layer 532 and the metal oxide layer 531. The silicon concentration is preferably higher than or equal to $1\times10^{16}$ atoms/cm$^3$ and lower than $5\times10^{18}$ atoms/cm$^3$, further preferably higher than or equal to $1\times10^{16}$ atoms/cm$^3$ and lower than $2\times10^{18}$ atoms/cm$^3$. A region in which the silicon concentration measured by SIMS is higher than or equal to $1\times10^{16}$ atoms/cm$^3$ and lower than $1\times10^{19}$ atoms/cm$^3$ is provided between the metal oxide layer 532 and the metal oxide layer 533. The silicon concentration is preferably higher than or equal to $1\times10^{16}$ atoms/cm$^3$ and lower than $5\times10^{18}$ atoms/cm$^3$, further preferably higher than or equal to $1\times10^{16}$ atoms/cm$^3$ and lower than $2\times10^{18}$ atoms/cm$^3$.

It is preferable to reduce the hydrogen concentration in the metal oxide layer 531 and the metal oxide layer 533 in order to reduce the hydrogen concentration in the metal oxide layer 532. The metal oxide layer 531 and the metal oxide layer 533 each include a region in which the hydrogen concentration measured by SIMS is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, still further preferably higher than or equal to $1\times10^{16}$ atoms/cm$^3$ and lower than or equal to $5\times10^{18}$ atoms/cm$^3$. It is also preferable to reduce the nitrogen concentration in the metal oxide layer 531 and the metal oxide layer 533 in order to reduce the nitrogen concentration in the metal oxide layer 532. The metal oxide layer 531 and the metal oxide layer 533 each include a region in which the nitrogen concentration is higher than or equal to $1\times10^{16}$ atoms/cm$^3$ and lower than $5\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $1\times10^{18}$ atoms/cm$^3$, still further preferably higher than or equal to $1\times10^{16}$ atoms/cm$^3$ and lower than or equal to $5\times10^{17}$ atoms/cm$^3$. Note that the nitrogen concentration is measured by SIMS.

The metal oxide layers 531 to 533 may be deposited by a sputtering method, a chemical vapor deposition (CVD) method, a molecular beam epitaxy (MBE) method, a pulsed laser deposition (PLD) method, an atomic layer deposition (ALD) method, or the like.

After the metal oxide layers 531 and 532 are formed, first heat treatment is preferably performed. The first heat treatment may be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in the following manner: heat treatment is performed in an inert gas atmosphere, and then, another heat treatment is performed in an atmosphere containing an oxidizing gas at 10 ppm or more, 1% or more, or 10% or more in order to compensate desorbed oxygen. The first heat treatment can increase the crystallinity of the metal oxide layers 531 and 532 and remove impurities such as hydrogen and water.

One embodiment of the present invention is not limited to the example in FIGS. 29A to 29C, in which the metal oxide layer 530 has a three-layer structure. For example, the metal oxide layer 530 can have a two-layer structure without the metal oxide layer 531 or the metal oxide layer 533. Alternatively, it is also possible to employ an m-layer structure (m is an integer greater than 3) in which a single layer or a stack including any of the metal oxides shown as examples of the materials of the metal oxide layers 531 to 533 is provided in at least one of the positions over, under, and in the metal oxide layer 530.

<Substrate>

As the substrate 510, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate can be used, for example. Examples of the semiconductor substrate include a semiconductor substrate of silicon or germanium and a compound semiconductor substrate of silicon carbide, silicon germanium, gallium arsenide, indium phosphide, zinc oxide, or gallium oxide. The semiconductor substrate may have a bulk structure or a silicon on insulator (SOI) structure. Examples of the conductor substrate include a graphite substrate, a metal substrate, an alloy substrate (e.g., a stainless steel substrate), a conductive resin substrate, a substrate including a metal nitride, and a substrate including a metal oxide.

A flexible substrate may be used as the substrate 510. An example of the flexible substrate is a substrate made of a metal, an alloy, a resin, glass, or a fiber thereof. The flexible substrate preferably has a lower coefficient of linear expansion because deformation due to an environment is suppressed. The flexible substrate may be formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 510 because its coefficient of linear expansion is low. Alternatively, a sheet, a film, or foil containing a fiber may be used as the substrate 510. The substrate 510 may have elasticity.

The following methods can be given as examples of a method for providing a transistor over a flexible substrate: (1) a transistor is formed over a flexible substrate; and (2) a transistor is formed over a non-flexible substrate, and then, an element layer in which the transistor is formed is separated from the non-flexible substrate and transferred to a flexible substrate. In the latter method, the element layer is preferably formed over a separation layer provided over the non-flexible substrate.

The element layer in which the transistor is formed may be provided between the substrate 510 and the insulating layer 511.

<Back Gate Electrode, Gate Electrode, Source Electrode, and Drain Electrode>

Each of the conductive layers 522 to 524 preferably has a single-layer structure or a stacked-layer structure including a conductive film containing a low-resistance material such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), or strontium (Sr), an alloy of the low-resistance material, or a compound containing such a material as its main component.

It is particularly preferable to use a high-melting-point material that has both heat resistance and conductivity, such as tungsten or molybdenum, or a low-resistance conductive material, such as aluminum or copper. Furthermore, a Cu—Mn alloy is preferably used, in which case manganese oxide formed at the interface with an insulator containing oxygen has a function of preventing Cu diffusion. A conductive oxide containing a noble metal, such as iridium oxide, ruthenium oxide, or strontium ruthenate, hardly extracts oxygen from an oxide semiconductor even when it is in contact with the oxide semiconductor. Therefore, the conductive oxide containing a noble metal is suitable as a material used for the conductive layers 523 and 524.

<Low-Resistance Region>

The regions 535 and 536 are formed in such a manner that the conductive layers 523 and 524 extract oxygen from the metal oxide layer 532, for example. Oxygen is more likely to be extracted at a higher temperature. Oxygen vacancies are formed in the regions 535 and 536 through several heating steps in the manufacturing process of the transistor 500. Furthermore, the heating makes hydrogen enter the sites of oxygen vacancies, increasing the carrier concentration in the regions 535 and 536. As a result, the resistance of the regions 535 and 536 is reduced.

<Insulating Layer>

The insulating layers 511 to 517 can each be formed using an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like, for example. The materials and layer structures of the insulating layers 511 to 517 may be determined in accordance with characteristics required for them.

In this specification and the like, an oxynitride refers to a compound that contains more oxygen than nitrogen, and a nitride oxide refers to a compound that contains more nitrogen than oxygen.

The insulating layer 514 preferably includes an insulator capable of supplying oxygen to the metal oxide layer 530. In particular, the insulating layer 514 preferably includes an insulator from which part of oxygen is released by heating. Oxygen released from the insulating layer 514 is supplied to the metal oxide layer 530, so that oxygen vacancies in the metal oxide layer 530 can be reduced. Consequently, a change in the electrical characteristics of the transistor 500 can be suppressed and the reliability can be improved.

For example, the insulating layer 514 may be formed using a metal oxide such as silicon oxide, silicon oxynitride, aluminum oxide, aluminum oxynitride, gallium oxide, gallium oxynitride, yttrium oxide, yttrium oxynitride, hafnium oxide, or hafnium oxynitride.

The insulating layer 514 may contain excess oxygen to supply to the metal oxide layer 530. For this purpose, the insulating layer 514 may be deposited in an oxygen atmosphere, for example. Alternatively, a region containing excess oxygen may be formed by introducing oxygen into the deposited insulating layer 514. These two methods may be combined.

For example, oxygen (including at least oxygen radicals, oxygen atoms, or oxygen ions) is introduced into the deposited insulating layer 514, so that a region containing excess oxygen is formed. Oxygen can be introduced by an ion implantation method, an ion doping method, a plasma immersion ion implantation method, plasma treatment, or the like. An oxygen-containing gas can be used for the oxygen introduction treatment. As the oxygen-containing gas, oxygen, nitrous oxide, nitrogen dioxide, carbon dioxide, or carbon monoxide can be used, for example. The oxygen-containing gas used for the oxygen introduction treatment may further contain a rare gas, hydrogen, or the like. For example, a mixed gas of carbon dioxide, hydrogen, and argon may be used. Furthermore, to increase the planarity of the top surface of the insulating layer 514, planarization treatment using a CMP method or the like may be performed after the insulating layer 514 is deposited.

The insulating layer 513 has a passivation function of preventing a decrease in the amount of oxygen contained in the insulating layer 514. Specifically, the insulating layer 513 prevents oxygen contained in the insulating layer 514 from being bonded to a metal contained in the conductive layer 522. The insulating layer 513 has a function of blocking oxygen, hydrogen, water, an alkali metal, an alkaline earth metal, or the like. The insulating layer 513 can prevent outward diffusion of oxygen from the metal oxide layer 530 and entry of hydrogen, water, or the like into the metal oxide layer 530 from the outside. The insulating layer 513 can be formed using an insulator containing a nitride, a nitride oxide, an oxide, or an oxynitride, for example. Examples of the insulator include silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, and hafnium oxynitride.

The insulating layer 513 may include a charge accumulation layer. In this case, the threshold voltage of the transistor 500 can be controlled by injecting electrons into the insulating layer 513. An insulator that can be used for the charge accumulation layer contains, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, an insulating layer or a stack of insulating layers including one or more materials selected from aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide may be used.

The insulating layer 513 preferably has a passivation function of preventing oxygen contained in the insulating layer 514 from decreasing. Specifically, the passivation function is a function of blocking oxygen, hydrogen, water, an alkali metal, an alkaline earth metal, or the like. The insulating layer 513 can prevent outward diffusion of oxygen from the metal oxide layer 530 and entry of hydrogen, water, or the like into the metal oxide layer 530 from the outside. The insulating layer 513 prevents oxygen contained in the insulating layer 514 from being bonded to a metal contained in the conductive layer 522. Examples of the insulator having a passivation function include silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, and hafnium oxynitride. A layer formed of these insulators is preferably provided as the insulator layer 513.

The insulating layer 515, which serves as a gate insulating film, preferably includes an insulator with a high relative permittivity. For example, the insulating layer 515 is preferably formed using gallium oxide, hafnium oxide, an oxide containing aluminum and hafnium, an oxynitride containing aluminum and hafnium, an oxide containing silicon and hafnium, or an oxynitride containing silicon and hafnium.

The insulating layer 515 preferably has a stacked-layer structure including silicon oxide or silicon oxynitride and an insulator with a high relative permittivity. When silicon oxide or silicon oxynitride, which are thermally stable, is combined with an insulator with a high relative permittivity, the stacked-layer structure can have thermal stability and a high relative permittivity. For example, a layer containing aluminum oxide, gallium oxide, or hafnium oxide may be provided on the metal oxide layer 533 side to suppress entry of silicon contained in silicon oxide or silicon oxynitride into the metal oxide layer 532.

If the insulating layer 515 contains silicon oxide or silicon oxynitride on the metal oxide layer 533 side, for example, trap centers might be formed at the interface between aluminum oxide, gallium oxide, or hafnium oxide and silicon oxide or silicon oxynitride. The trap centers can shift the threshold voltage of the transistor in the positive direction by capturing electrons in some cases.

The insulating layer 516 preferably includes an insulator with a low relative permittivity. For example, the insulating layer 516 preferably includes silicon oxide, silicon oxynitride, silicon nitride oxide, silicon nitride, or a resin. Alternatively, the insulating layer preferably has a stacked-layer structure including silicon oxide or silicon oxynitride and a resin. When silicon oxide or silicon oxynitride, which are thermally stable, is combined with a resin, the stacked-layer structure can have thermal stability and a low relative permittivity. Examples of the resin include polyester, polyolefin, polyamide (e.g., nylon or aramid), polyimide, polycarbonate, and acrylic. Like the insulating layer 514, the insulating layer 516 preferably has a function of supplying oxygen to the metal oxide layer 530.

The insulating layer 517 is a passivation layer having a function of blocking oxygen, hydrogen, water, an alkali metal, an alkaline earth metal, or the like. The insulating layer 517 can prevent outward diffusion of oxygen from the metal oxide layer 530 and entry of hydrogen, water, or the like into the metal oxide layer 530 from the outside. An example of such an insulating layer having a passivation function is a layer including silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, hafnium oxynitride, or the like. An aluminum oxide layer is favorably used as the insulating layer 517 because it is highly effective in preventing both oxygen and impurities such as hydrogen and moisture from permeating the film.

It is preferable to perform second heat treatment at any time after the deposition of the insulating layer 517. Through the second heat treatment, oxygen contained in the insulating layers 514 and 516 is diffused and reaches the metal oxide layer 530, whereby oxygen vacancies in the metal oxide layer 530 can be reduced. In the second heat treatment, the insulating layer 517 prevents upward diffusion of oxygen through the insulating layer 517, and the insulating layer 513 prevents downward diffusion of oxygen through the insulating layer 513; accordingly, oxygen can be efficiently supplied to the metal oxide layer 530.

Note that the second heat treatment may be performed at a temperature that allows oxygen contained in the insulating layers 514 and 516 to be diffused into the metal oxide layer 530. For example, the description of the first heat treatment can be referred to. The second heat treatment is preferably performed at a lower temperature than the first heat treatment. The temperature of the second heat treatment may be lower than that of the first heat treatment by 20° C. or more and 150° C. or less, preferably 40° C. or more and 100° C. or less. Accordingly, superfluous release of oxygen from the insulating layer 514 can be inhibited. In the case where heating at the time of deposition of a layer can double as the second heat treatment, the second heat treatment is not necessarily performed. As described above, oxygen can be supplied to the metal oxide layer 530 from above and below through the deposition of the insulating layer 517 and the second heat treatment. Alternatively, oxygen may be added to the insulating layers 514 and 516 by depositing a film containing indium oxide such as an In-M-Zn oxide as the insulating layer 517.

Structure Example 2 of Transistor

Figure 31A:
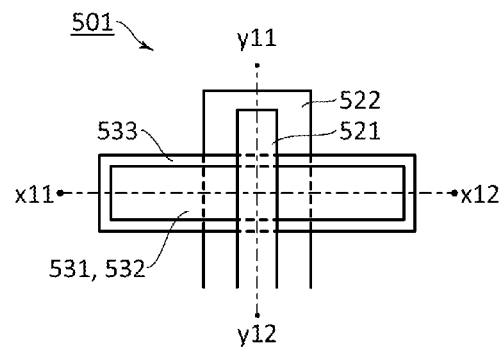
FIG. 31A is a top view illustrating a configuration example of a transistor.
Figure 31B:
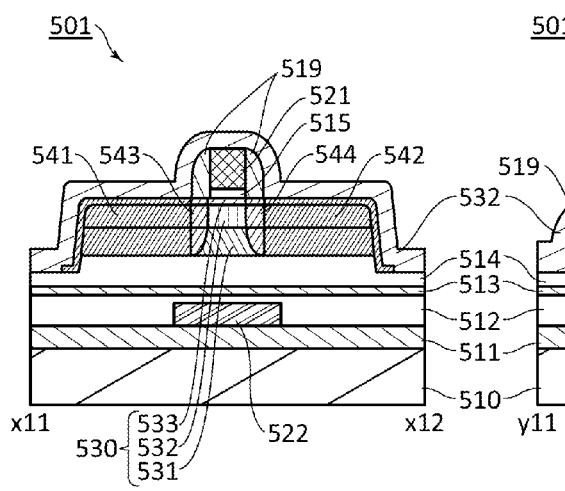
FIG. 31B is a cross-sectional view taken along line x11-x12 in FIG. 31A.
Figure 31C:
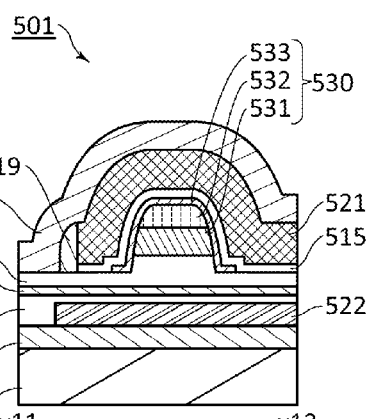
FIG. 31C is a cross-sectional view taken along line y11-y12 in FIG. 31A.

FIG. 31A is a top view of a transistor 501. FIG. 31B is a cross-sectional view taken along line x11-x12 in FIG. 31A, and FIG. 31C is a cross-sectional view taken along line y11-y12 in FIG. 31A. The transistor 501 has an s-channel structure like the transistor 500 and the like. In the transistor 501, an insulating layer 519 is provided in contact with a side surface of the conductive layer 521 that serves as a gate electrode. The insulating layer 519 serves as a sidewall insulating layer of the transistor 501.

Regions 541 to 544 are formed in the metal oxide layer 530. These regions are low resistance regions whose resistivity is lower than another region (typically a region overlapping with the conductive layer 521). The regions 541 to 544 are formed in a self-aligned manner in an impurity addition step in which the conductive layer 521 and the insulating layer 519 are used as masks. The regions 541 to 544 are formed by adding a rare gas element (Ar, Xe, Kr, Ne, or He) to the metal oxide layer 530 with an ion implantation apparatus, an ion doping apparatus, a plasma doping apparatus, a plasma treatment apparatus, or the like. Hydrogen, nitrogen, boron, phosphorus, arsenic, tungsten, aluminum, or the like may be added as an impurity. The regions 541 and 542 have a lower resistivity than the regions 543 and 544.

Structure Example 3 of Transistor

FIGS. 32A to 32D illustrate a structure example of a transistor. FIG. 32A is a top view illustrating a structure example of a transistor 502. FIGS. 32B, 32C, and 32D are cross-sectional views taken along lines x11-x12, y11-y12, and y13-y14, respectively, in FIG. 32A.

The metal oxide layer 533 is formed to cover the metal oxide layers 531 and 532 and the conductive layers 523 and 524. The insulating layer 515 covers the metal oxide layer 533. Here, the metal oxide layer 533 and the insulating layer 515 are etched using the same mask.

The transistor 502 has an s-channel structure like the transistor 500. In the transistor 500, the metal oxide layer 533, the insulating layer 515, and the conductive layer 521 are formed so as to fill the opening in the insulating layer 516; in contrast, the transistor 502 does not include the insulating layer 516. The opening in the insulating layer 516 enables the gate electrode of the transistor 500 to be formed in a self-aligned manner; therefore, the transistor 500 is suitable for miniaturization. The parasitic capacitance of the conductive layer 521 can be reduced in the transistor 500 as compared with that in the transistor 502.

The conductive layers 523 and 524 are formed using a hard mask used for forming the stack of the metal oxide layers 531 and 532. Therefore, the conductive layers 523 and 524 do not have regions in contact with the side surfaces of the metal oxide layers 531 and 532. For example, the metal oxide layers 531 and 532 and the conductive layers 523 and 524 can be formed through the following steps. A two-layer oxide semiconductor film to be the metal oxide layers 531 and 532 is formed. A single-layer or multilayer conductive film is formed over the oxide semiconductor film. This conductive film is etched to form a hard mask. With the use of this hard mask, the two-layer oxide semiconductor film is etched to form the stack of the metal oxide layers 531 and 532. Then, the hard mask is etched to form the conductive layers 523 and 524.

Modification Example

The transistors 500 to 502 may have a structure without the charge accumulation layer (the insulating layer 513). Furthermore, the transistors 500 to 502 may have a structure without the back gate electrode (the conductive layer 522). In this case, the insulating layers 512 and 513 are not necessarily provided.

Embodiment 5

In this embodiment, a structure of an oxide semiconductor will be described. An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor. From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example. In other words, a stable oxide semiconductor cannot be regarded as a completely amorphous oxide semiconductor, and an oxide semiconductor that is not isotropic (e.g., an oxide semiconductor that has a periodic structure in a microscopic region) cannot be regarded as a completely amorphous oxide semiconductor. An a-like OS, which is not isotropic, has an unstable structure that contains a void. Because of its instability, an a-like OS is close to an amorphous oxide semiconductor in terms of physical properties.

<CAAC-OS>

A CAAC-OS is an oxide semiconductor having a plurality of c-axis-aligned crystal parts (also referred to as pellets).

(XRD)

Analysis of a CAAC-OS by X-ray diffraction (XRD) is described. For example, when the structure of a CAAC-OS including an InGaZnO$_4$ crystal that is classified into the space group R$-$3m is analyzed by an out-of-plane method, a peak appears at a diffraction angle (2θ) of around 31°. This peak is derived from the (009) plane of the InGaZnO$_4$ crystal, which indicates that crystals in the CAAC-OS have c-axis alignment, and that the c-axes are aligned in a direction substantially perpendicular to a surface where the CAAC-OS film is formed (also referred to as formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd$-$3m. Therefore, it is preferred that the CAAC-OS do not show the peak at a 2θ of around 36°.

Furthermore, in structural analysis of the CAAC-OS by an in-plane method in which an X-ray is incident on the CAAC-OS in a direction parallel to the formation surface, a peak appears at a 2θ of around 56°. This peak is derived from the (110) plane of the InGaZnO$_4$ crystal. When analysis (φ scan) is performed with 2θ fixed at around 56° and with the sample rotated using a normal vector of the sample surface as an axis (φ axis), a clear peak is not observed. When single crystal InGaZnO$_4$ is subjected to φ scan with 2θ fixed at around 56°, six peaks that are derived from crystal planes equivalent to the (110) plane are observed. Accordingly, the structural analysis using XRD shows that the directions of a-axes and b-axes are irregularly oriented in the CAAC-OS.

(Electronic Diffraction)

For example, when an electron beam with a probe diameter of 300 nm is incident on a CAAC-OS including an InGaZnO$_4$ crystal in a direction parallel to the formation surface of the CAAC-OS, a diffraction pattern (also referred to as selected-area electron diffraction pattern) appears sometimes. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. A ring-like diffraction pattern appears when an electron beam with a probe diameter of 300 nm is incident on the sample in a direction perpendicular to the sample surface. Thus, the electron diffraction using an electron beam with a probe diameter of 300 nm also indicates that the a-axes and b-axes of the crystal parts included in the CAAC-OS do not have regular orientation.

(High-Resolution TEM Image)

In a combined analysis image (also referred to as transmission electron microscope (TEM) image) of a bright-field image and a diffraction pattern of the CAAC-OS, which is obtained using a TEM, a plurality of crystal parts can be observed. However, even in the high-resolution TEM image, a boundary between crystal parts, that is, a grain boundary is not clearly observed in some cases. Thus, in the CAAC-OS, a reduction in electron mobility due to the grain boundary is less likely to occur. To observe a high-resolution TEM image, a spherical aberration corrector function is preferably used. Here, a high-resolution TEM image obtained with a spherical aberration corrector function is referred to as a Cs-corrected high-resolution TEM image.

From a high-resolution cross-sectional TEM image of the CAAC-OS observed from the direction substantially parallel to the sample surface, a crystal part that is a region where metal atoms are arranged in a layered manner can be identified. A crystal part with a size of 1 nm or more and a crystal part with a size of 3 nm or more are observed. Therefore, the crystal part can also be referred to as a nanocrystal (nc). Furthermore, the CAAC-OS can also be referred to as an oxide semiconductor including c-axis-aligned nanocrystals (CANC). A crystal part reflects unevenness of a formation surface or a top surface of the CAAC-OS, and is parallel to the formation surface or the top surface of the CAAC-OS.

Image processing on a Cs-corrected high-resolution plan-view TEM image of the CAAC-OS observed from a direction substantially perpendicular to the sample surface demonstrates that a crystal part has a hexagonal configuration. Note that the shape of the crystal part is not always a regular hexagon but is a distorted hexagon, pentagon, heptagon, or the like in some cases. The image processing is performed as follows.

A Cs-corrected high-resolution plan-view TEM image is subjected to fast Fourier transform (FFT), so that an FFT image is obtained. Mask processing is performed such that a range of from 2.8 nm$^{-1}$ to 5.0 nm$^{-1}$ from the origin in the obtained FFT image remains. The FFT image subjected to mask processing undergoes inverse fast Fourier transform (IFFT) to obtain an image (FFT filtering image). Since the FFT filtering image is obtained by extracting a periodic component from a Cs-corrected high-resolution TEM image, it shows a lattice arrangement.

In the obtained FFT filtering image, a clear grain boundary is not observed. The reason why a distorted hexagonal crystal part exists is that distortion of a lattice arrangement suppresses formation of grain boundaries. This is probably because the CAAC-OS can tolerate distortion owing to a low density of the atomic arrangement in the a-b plane direction, an interatomic bond distance changed by substitution of a metal element, and the like.

As described above, the CAAC-OS has c-axis alignment, its crystal parts (nanocrystals) are connected in the a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, generation of defects, or the like might decrease the crystallinity of an oxide semiconductor. This means that the CAAC-OS has negligible amounts of impurities and defects (e.g., oxygen vacancies).

Note that impurities mean an element other than the main components of the oxide semiconductor, such as hydrogen, carbon, silicon, and a transition metal element. For example, an element (specifically, silicon or the like) having higher strength of bonding to oxygen than a metal element contained in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For another example, oxygen vacancies in the oxide semiconductor might serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$ and higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be regarded as an oxide semiconductor having stable characteristics.

<nc-OS>

(XRD)

When the structure of an nc-OS is analyzed by an out-of-plane method, a peak indicating orientation does not appear. That is, a crystal of an nc-OS does not have orientation. For example, when an electron beam with a probe diameter of 50 nm is incident on a 34-nm-thick region of a thinned nc-OS including an InGaZnO$_4$ crystal in a direction parallel to the formation surface, a ring-shaped diffraction pattern is observed. When an electron beam with a probe diameter of 1 nm is incident on the same sample, a plurality of spots are observed in the ring-shaped region. In other words, ordering in an nc-OS is not observed with an electron beam having a probe diameter of 50 nm but is observed with an electron beam having a probe diameter of 1 nm.

When an electron beam with a probe diameter of 1 nm is incident on a region with a thickness of less than 10 nm, an electron diffraction pattern in which spots are arranged in an approximately hexagonal shape is observed in some cases. This means that an nc-OS has a well-ordered region, i.e., a crystal, in the thickness range of less than 10 nm. Note that an electron diffraction pattern having regularity is not observed in some regions because crystals are aligned in various directions.

(High-Resolution TEM Image)

In a Cs-corrected high-resolution cross-sectional TEM image of the nc-OS, a region where a crystal part is observed and a region where a clear crystal part is not observed are identified. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image, a grain boundary of the nc-OS is not clearly observed in some cases. Note that there is a possibility that the origin of the nanocrystal is the same as that of a crystal part in a CAAC-OS. Therefore, a crystal part of the nc-OS may be referred to as a pellet.

As described above, in the nc-OS, a microscopic region (e.g., a region with a size greater than or equal to 1 nm and less than or equal to 10 nm, and in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Accordingly, the nc-OS cannot be distinguished from an a-like OS or an amorphous oxide semiconductor by some analysis methods. Since there is no regularity of crystal orientation between the crystal parts (nanocrystals), the nc-OS can also be referred to as an oxide semiconductor including randomly aligned nanocrystals (RANC) or an oxide semiconductor including non-aligned nanocrystals (NANC).

The structure of the nc-OS has higher regularity than that of an amorphous oxide semiconductor. Thus, the nc-OS has a lower density of defect states than an a-like OS and an amorphous oxide semiconductor. Since there is no regularity of crystal orientation between different crystal parts in the nc-OS, the nc-OS has a higher density of defect states than the CAAC-OS.

<a-Like OS>

An a-like OS has a structure between those of the nc-OS and an amorphous oxide semiconductor. For example, the structure of the a-like OS has lower regularity than that of the nc-OS but has higher regularity than that of an amorphous oxide semiconductor. The a-like OS has an unstable structure, compared to the nc-OS and the CAAC-OS. The a-like OS has lower density than the nc-OS and the CAAC-OS. This is because the a-like OS has a void (low-density region). A void is observed in a high-resolution cross-sectional TEM image.

The density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, the density of single crystal $InGaZnO_4$ with a rhombohedral crystal structure is 6.357 $g/cm^3$. Accordingly, in the case of an oxide semiconductor having an atomic ratio of In:Ga:Zn=1:1:1, the density of the a-like OS is higher than or equal to 5.0 $g/cm^3$ and lower than 5.9 $g/cm^3$ and the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. For example, a weighted average of the density of single crystals with different compositions can be calculated on the basis of the combination ratio of these single crystals. Note that it is preferable to combine as few kinds of single crystals as possible for density calculation.

As described above, oxide semiconductors have various structures and various properties. For example, an oxide semiconductor film used for a semiconductor device such as an OS transistor may be a single-layer film formed of a CAAC-OS, an nc-OS, an a-like OS, or an amorphous oxide semiconductor or a stacked film using oxide semiconductors with different structures.

Information about this specification and the like is described below. In this specification and the like, when it is explicitly described that X and Y are connected, the case where X and Y are electrically connected, the case where X and Y are functionally connected, and the case where X and Y are directly connected are included therein. Accordingly, another element may be provided between elements having a connection relation illustrated in drawings and texts, without being limited to a predetermined connection relation, for example, the connection relation illustrated in the drawings and the texts. Here, each of X and Y is an object (e.g., a device, an element, a circuit, a wiring, an electrode, a terminal, a conductive film, or a layer).

A voltage usually refers to a potential difference between a given potential and a reference potential (e.g., a source potential or a ground potential (GND)). A voltage can be referred to as a potential and vice versa. Note that the potential indicates a relative value. Accordingly, "ground potential" does not necessarily mean 0 V.

Note that in this specification, the terms "film" and "layer" can be interchanged depending on the case or circumstances. For example, in some cases, the term "conductive film" can be used instead of the term "conductive layer," and the term "insulating layer" can be used instead of the term "insulating film."

Information about this specification and the like is described below. In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

Note that in this specification, terms for describing arrangement, such as "over" and "under", are used in some cases for convenience for describing a positional relation between components with reference to drawings. Further, the positional relation between components is changed as appropriate in accordance with a direction in which each component is described. Thus, there is no limitation on terms used in this specification, and description can be made appropriately depending on the situation.

The positional relation of circuit blocks illustrated in a block diagram is specified for description. Even when a block diagram shows that different functions are achieved by different circuit blocks, one circuit block may be actually configured to achieve different functions. The functions of circuit blocks are specified for description, and even in the case where one circuit block is illustrated, blocks might be provided in an actual circuit block so that processing performed by one circuit block is performed by a plurality of circuit blocks.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification and the like, the trigonal and rhombohedral crystal systems are included in the hexagonal crystal system.

This application is based on Japanese Patent Application serial no. 2015-131810 filed with Japan Patent Office on Jun. 30, 2015, the entire contents of which are hereby incorporated by reference.

What is claimed is:

1. A logic circuit comprising:
   a dynamic logic circuit;
   an evaluation circuit as a part of the dynamic logic circuit;
   a first transistor;
   a first capacitor;
   a second capacitor; and
   a first output node connected to the first transistor,
   wherein the evaluation circuit includes a second output node,
   wherein a first terminal of the first capacitor is electrically connected to the first output node,
   wherein a second terminal of the first capacitor is directly connected to the second output node,
   wherein a first terminal of the second capacitor is directly connected to the second output node,
   wherein the evaluation circuit includes a plurality of second transistors,
   wherein the plurality of second transistors have all the same conductivity type, one of an n-type conductivity and a p-type conductivity, and
   wherein the plurality of second transistors each include a back gate.

2. The logic circuit according to claim 1, further comprising:
   a third transistor comprising a first terminal, a second terminal, and a gate electrode; and
   a fourth transistor comprising a first terminal, a second terminal, and a gate electrode,
   wherein the first transistor comprises a first terminal, a second terminal, and a gate electrode, the first transistor being diode-connected and the first terminal being connected to the first output node via the first capacitor;
   wherein the evaluation circuit is connected between the first terminal of the third transistor and the first terminal of the fourth transistor, and
   wherein the evaluation circuit is connected to the first terminal of the fourth transistor at the first output node.

3. The logic circuit according to claim 1, wherein a back gate of any one of the first transistor and the plurality of second transistors is configured to be supplied with a signal that is the same as a signal supplied to a gate of the any one of the first transistor and the plurality of second transistors.

4. The logic circuit according to claim 1, wherein a back gate of any one of the first transistor and the plurality of second transistors is configured to be supplied with a signal that is different from a signal supplied to a gate of the any one of the first transistor and the plurality of second transistors.

5. The logic circuit according to claim 1, wherein the back gates of the plurality of second transistors are supplied with signals different from signals supplied to gates of the plurality of second transistors.

6. The logic circuit according to claim 1, wherein channel formation regions of the plurality of second transistors each include an oxide semiconductor.

7. A logic circuit comprising:
   a dynamic logic circuit;
   an evaluation circuit as a part of the dynamic logic circuit;
   a first output node;
   a first transistor;
   a first capacitor; and
   a second capacitor,
   wherein the evaluation circuit includes a second output node,
   wherein the evaluation circuit includes a plurality of second transistors,
   wherein a first terminal of the first capacitor is electrically connected to the first output node,
   wherein a second terminal of the first capacitor is directly connected to the second output node,
   wherein a first terminal of the second capacitor is directly connected to the second output node,
   wherein the first transistor and the plurality of second transistors have all the same conductivity type, one of an n-type conductivity and a p-type conductivity,
   wherein the first transistor is diode-connected,
   wherein a first terminal of the first transistor is electrically connected to the first output node via the first capacitor,
   wherein the logic circuit is configured to input a first voltage to a second terminal of the first transistor,
   wherein the first transistor includes a back gate, and
   wherein the logic circuit is configured to input a first signal to the back gate of the first transistor.

8. The logic circuit according to claim 7, further comprising:
   a third transistor comprising a first terminal, a second terminal, and a gate electrode; and
   a fourth transistor comprising a first terminal, a second terminal, and a gate electrode,
   wherein the plurality of second transistors form an evaluation circuit connected between the first terminal of the third transistor and the first terminal of the fourth transistor, and
   wherein the evaluation circuit is connected to the first terminal of the fourth transistor at the first output node.

9. The logic circuit according to claim 7,
   wherein each of the plurality of second transistors includes a back gate, and
   wherein the back gate of each of the plurality of second transistors is supplied with a signal that is the same as a signal supplied to a gate of a corresponding one of the second transistors.

10. The logic circuit according to claim 7,
    wherein each of the plurality of second transistors includes a back gate, and
    wherein the back gate of each of the plurality of second transistors is supplied with a signal different from a signal supplied to a gate of a corresponding one of the second transistors.

11. The logic circuit according to claim 7, wherein channel formation regions of the first transistor and the plurality of second transistors each include an oxide semiconductor.

12. The logic circuit according to claim 7, wherein the first transistor and the plurality of second transistors are below a layer including the first capacitor.

13. The logic circuit according to claim 7, wherein the first transistor and the plurality of second transistors are above a layer including the first capacitor.

14. The logic circuit according to claim 7,
wherein the dynamic logic circuit includes a second capacitor, and
wherein a first terminal of the second capacitor is electrically connected to the first output node.

15. A semiconductor device comprising:
a plurality of wirings; and
a plurality of AND circuits,
wherein the plurality of AND circuits include the logic circuit according to claim 1,
wherein each one of the output nodes of the plurality of AND circuits is electrically connected to a corresponding one of the wirings.

16. A semiconductor device comprising:
a plurality of wirings; and
a plurality of AND circuits,
wherein the plurality of AND circuits include the logic circuit according to claim 7,
wherein each one of the output nodes of the plurality of AND circuits is electrically connected to a corresponding one of the wirings.

17. A semiconductor device comprising:
a circuit array in which a plurality of circuits are arranged; and
a peripheral circuit for driving the circuit array,
wherein the peripheral circuit includes the logic circuit according to claim 1.

18. A semiconductor device comprising:
a circuit array in which a plurality of circuits are arranged; and
a peripheral circuit for driving the circuit array,
wherein the peripheral circuit includes the logic circuit according to claim 7.

19. An electronic component comprising:
an element substrate; and
a lead electrically connected to the element substrate,
wherein the logic circuit according to claim 1 is formed over the element substrate.

20. An electronic component comprising:
an element substrate; and
a lead electrically connected to the element substrate,
wherein the logic circuit according to claim 7 is formed over the element substrate.

21. An electronic device comprising:
the logic circuit according to claim 1; and
at least one of a display device, a touch panel, a microphone, a speaker, an operation key, and a housing.

22. An electronic device comprising:
the logic circuit according to claim 7; and
at least one of a display device, a touch panel, a microphone, a speaker, an operation key, and a housing.

* * * * *